(12) United States Patent
Sekiguchi

(10) Patent No.: US 7,638,372 B2
(45) Date of Patent: Dec. 29, 2009

(54) SEMICONDUCTOR DEVICE AND METHOD FOR MANUFACTURING THE SAME

(75) Inventor: Keiichi Sekiguchi, Kanagawa (JP)

(73) Assignee: Semiconductor Energy Laboratory Co., Ltd., Atsugi-shi, Kanagawa-Ken (JP)

( * ) Notice: Subject to any disclaimer, the term of this patent is extended or adjusted under 35 U.S.C. 154(b) by 468 days.

(21) Appl. No.: 11/452,288

(22) Filed: Jun. 14, 2006

(65) Prior Publication Data

US 2006/0292778 A1 Dec. 28, 2006

(30) Foreign Application Priority Data

Jun. 22, 2005 (JP) ............... 2005-182156

(51) Int. Cl.
*H01L 21/00* (2006.01)

(52) U.S. Cl. ..................... 438/149; 438/153

(58) Field of Classification Search .............. 438/143, 438/150, 270, 197
See application file for complete search history.

(56) References Cited

U.S. PATENT DOCUMENTS

| 5,623,165 | A | | 4/1997 | Yamauchi |
| 6,001,712 | A | | 12/1999 | Yamauchi |
| 6,127,210 | A | * | 10/2000 | Mimura et al. ............ 438/153 |
| 6,518,102 | B1 | * | 2/2003 | Tanaka et al. ............ 438/143 |
| 6,646,287 | B1 | | 11/2003 | Ono et al. |
| 6,664,145 | B1 | | 12/2003 | Yamazaki et al. |
| 6,759,678 | B2 | | 7/2004 | Yamazaki et al. |
| 6,909,114 | B1 | | 6/2005 | Yamazaki |
| 2001/0034089 | A1 | | 10/2001 | Yamazaki et al. |
| 2001/0052950 | A1 | | 12/2001 | Yamazaki et al. |
| 2004/0021183 | A1 | * | 2/2004 | Yamazaki et al. ............ 257/412 |
| 2005/0148121 | A1 | | 7/2005 | Yamazaki et al. |

FOREIGN PATENT DOCUMENTS

| JP | 04-286367 | 10/1992 |
| JP | 08-078329 | 3/1996 |
| JP | 2001-274413 | 10/2001 |
| WO | WO 2005-057658 A1 | 6/2005 |

* cited by examiner

*Primary Examiner*—Brook Kebede
*Assistant Examiner*—Errol Fernandes
(74) *Attorney, Agent, or Firm*—Nixon Peabody, LLP; Jeffrey L. Costellia

(57) ABSTRACT

A first resist mask and a second resist mask used for forming a gate electrode for a p-channel TFT and a gate electrode for an n-channel TFT are left, and a third resist mask is formed afterwards over a first area where one of the p-channel TFT and the n-channel TFT is to be formed; thus, a source region and a drain region are formed in a semiconductor film of the other one of the p-channel TFT and the n-channel TFT by adding first impurity ions using the second resist mask and the third resist mask. After that, the first resist mask, the second resist mask, and the third resist mask are removed, and a source region and a drain region are formed in a semiconductor film of the one of the p-channel TFT and the n-channel TFT by adding second impurity ions using a fourth resist mask.

16 Claims, 35 Drawing Sheets

FIG. 4A
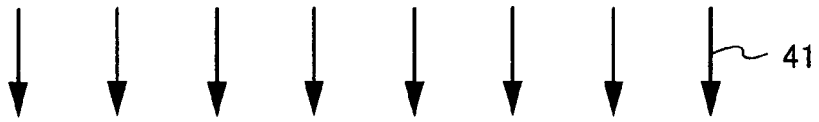
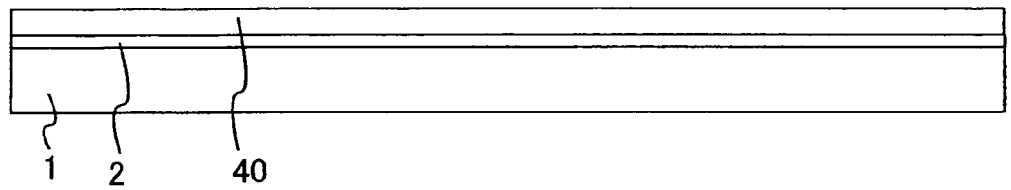
FIG. 4B
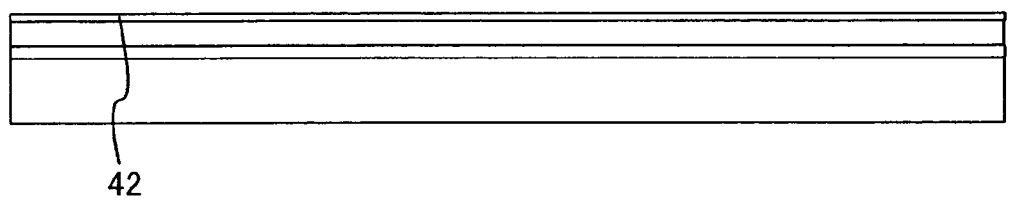
FIG. 4C
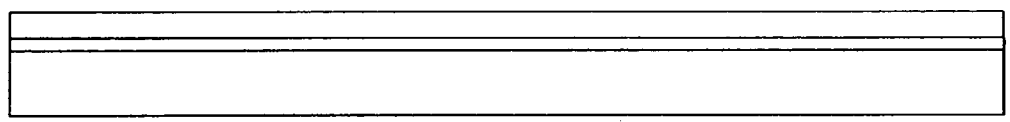
FIG. 4D
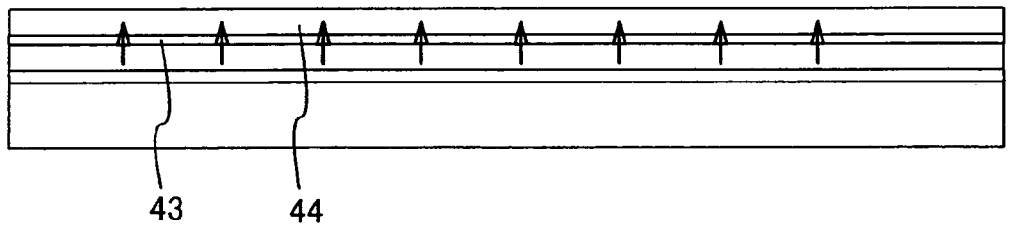
FIG. 4E
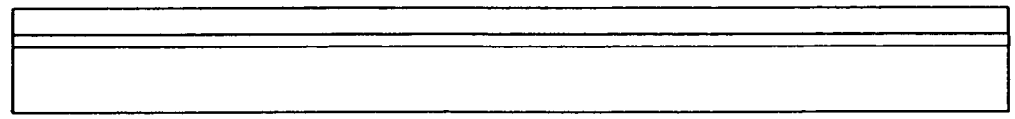

50 51 52 53

54

55

49

56 57

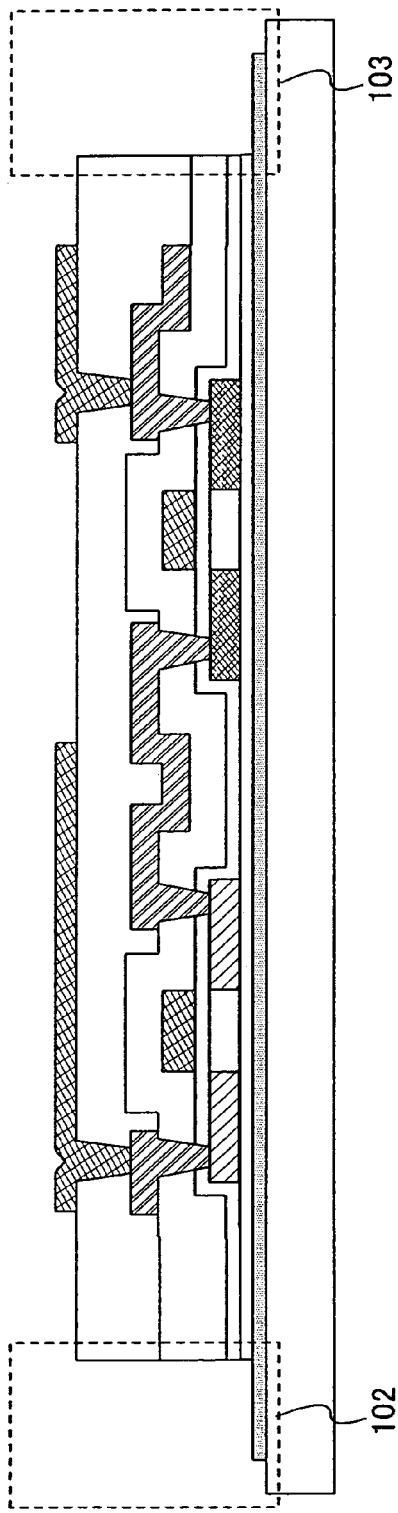
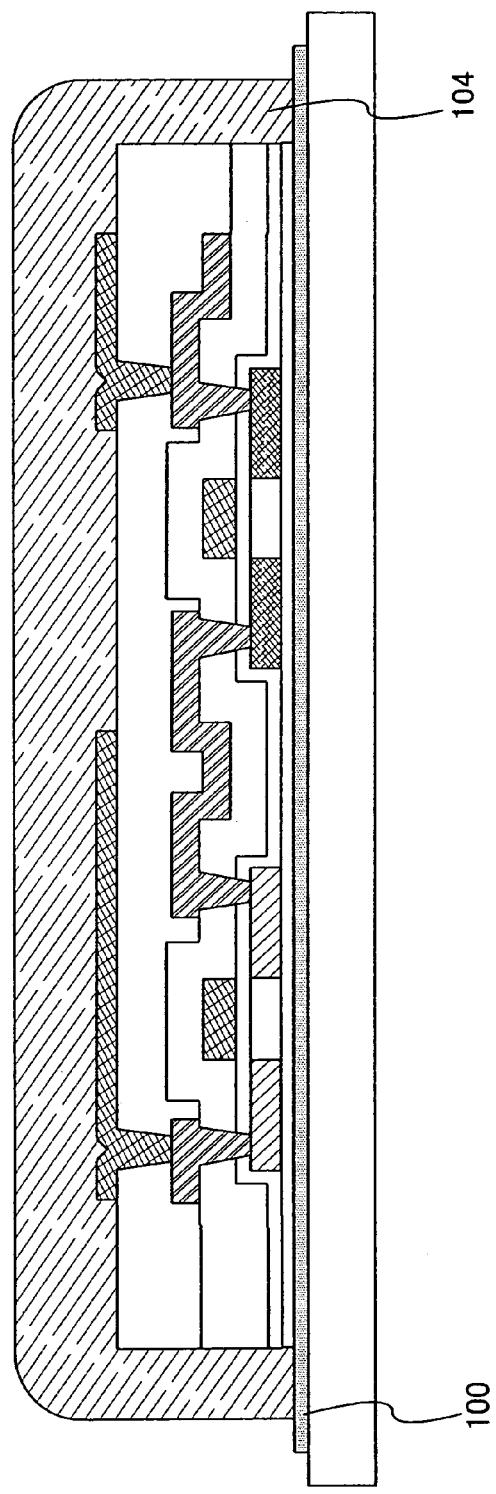
FIG. 9A
FIG. 9B

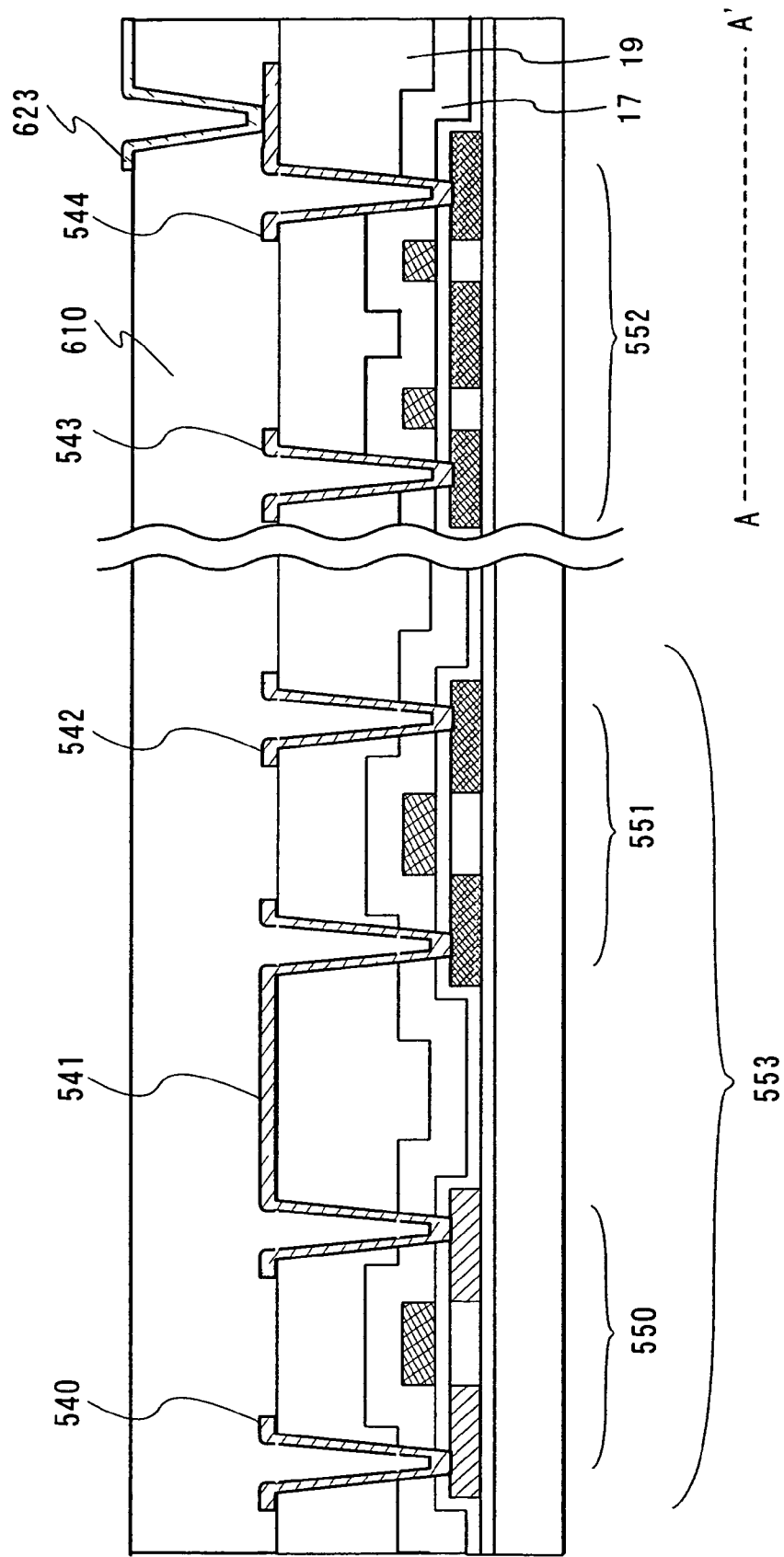

SEMICONDUCTOR DEVICE AND METHOD FOR MANUFACTURING THE SAME

BACKGROUND OF THE INVENTION

1. Field of the Invention

The present invention relates to a technique by which a thin film transistor (hereinafter referred to as a TFT), particularly, a p-channel TFT and an n-channel TFT are formed over a glass substrate or a film substrate.

2. Description of the Related Art

Thin film transistors (hereinafter referred to as TFTs) are used for a pixel area and a peripheral circuit in a liquid crystal display or an EL display. Further, a circuit using a p-channel TFT and an n-channel TFT, for example, a CMOS circuit is used for the circuit.

A semiconductor device having such a configuration is manufactured through, for example, manufacturing processes shown in FIGS. 27A to 27D (Reference 1: Japanese Patent Laid-Open No. 4-286367).

(1) an amorphous silicon (a-Si) film is deposited on an insulating substrate 201, and crystallized afterwards to form a crystalline silicon (p-Si) film. The crystalline silicon (p-Si) film is etched to form a semiconductor layer of a p-channel TFT and a semiconductor layer 203 of an n-channel TFT (FIG. 27A).

(2) a gate insulating film 204 is formed (FIG. 27A).

(3) a gate electrode 205 for a p-channel TFT and a gate electrode 205 for an n-channel TFT are formed (FIG. 27B).

(4) a photoresist 211 is formed in a p-channel TFT area or an n-channel TFT area (FIG. 27B).

(5) an n-type impurity ion or p-type impurity ion 212 is added to form a source region 206 and a drain region 206 of an n-channel TFT or a p-channel TFT. At this time, due to a shield effect of the gate electrode, impurity ions are not added into a channel region of the TFT (FIG. 27B).

(6) a photoresist 211 is formed in an n-channel TFT or p-channel TFT area (FIG. 27C).

(7) a p-type impurity ion or n-type impurity ion 213 is added to form a source region 207 and a drain region 207 of a p-channel TFT or an n-channel TFT. At this time, due to a shield effect of the gate electrode, an impurity ion is not added into a channel region of the TFT (FIG. 27C).

(8) an interlayer insulating film 208 is formed and a contact hole is formed after that. Source and drain electrodes 210 are formed in each of a p-channel TFT region and an n-channel TFT region (FIG. 27D).

Generally, ions containing boron, ions containing phosphorus, or ions containing arsenic are used as the impurity ions. For the impurity ions, $B_2H_6$ (diborane) gas, $PH_3$ (phosphine) gas, and $AsH_3$ (arsine) gas which are diluted with hydrogen gas are used respectively, and the impurity ions are added by an ion shower doping method. An "ion shower doping method" is one in which irradiation with ions having kinetic energy is performed to add impurity ions. Unlike the case of using a conventional ion implanter, ions extracted from an ion source are used as is, without the use of ion mass separation. In this method, besides desired n-type or p-type impurity ions, hydrogen ions are also added into a semiconductor film.

In the case where a TFT is miniaturized or a metal material or the like used for a gate electrode is reduced in order to reduce cost, it is necessary to make the gate electrode into a thin film. However, if the gate electrode is a thin film, there is a problem in that hydrogen ions in a diluent gas penetrate into a channel region when a source region and a drain region are formed by adding impurity ions. Therefore, degradation of TFT characteristics is a concern.

SUMMARY OF THE INVENTION

In view of the above, it is an object of the present invention to manufacture a TFT with less degradation of the characteristics when a p-channel TFT and an n-channel TFT are manufactured over one substrate.

In the invention, a first resist mask and a second resist mask used for forming a gate electrode for a p-channel TFT and a gate electrode for an n-channel TFT are left, and a third resist mask is formed afterwards over a first area where one of the p-channel TFT and the n-channel TFT is to be formed; thus, a source region and a drain region are formed in a first semiconductor film of the other one of the p-channel TFT and the n-channel TFT by adding first impurity ions using the second resist mask and the third resist mask.

Further, after that, the first resist mask, the second resist mask, and the third resist mask are removed, and after a fourth resist mask is formed over a second area where the other one of p-channel TFT and the n-channel TFT is to be formed, a source region and a drain region are formed in a second semiconductor film of the one of the p-channel TFT and the n-channel TFT by adding second impurity ions using the fourth resist mask.

Alternatively, after the first resist mask, the second resist mask, and the third resist mask are removed, a fourth resist mask and a fifth resist mask are formed over the gate electrode for the p-channel TFT and the gate electrode for the n-channel TFT. After forming a sixth resist mask over the second area where the other one of the p-channel TFT and the n-channel TFT is to be formed, second impurity ions are added using the sixth resist mask; thus a source region and a drain region may be formed in a second semiconductor film of the one of the p-channel TFT and the n-channel TFT.

Ions containing boron are used for p-type impurity ions, and ions containing phosphorus or ions containing arsenic are used for n-type impurity ions and they are added into the semiconductor film by an ion shower doping method. The ions containing boron are generated from $B_2H_6$ (diborane) gas diluted with $H_2$ (hydrogen) gas, and ions containing phosphorus or ions containing arsenic are generated from $PH_3$ (phosphine) gas diluted with $H_2$ (hydrogen) gas or $AsH_3$ (arsine) gas diluted with $H_2$ (hydrogen) gas. At this time, hydrogen ions are generated in addition to impurity ions. However, in the above configuration, hydrogen can be prevented from penetrating into the channel region of the TFT when adding the first impurity ions.

Alternatively, a fourth resist mask and a fifth resist mask may be formed over the gate electrode, and a sixth resist mask may be formed over the other one of the areas where the TFTs are formed, thereby preventing hydrogen from penetrating into the channel region of the TFT when adding the second impurity ions.

At this time, accelerating voltage or acceleration energy of the second impurity ions may be lower than accelerating voltage or acceleration energy of the first impurity ions. When accelerating voltage or acceleration energy of the impurity ions is reduced, the accelerating voltage or the acceleration energy of hydrogen ions is reduced. Accordingly, even in the case where the fourth resist mask or the fifth resist mask is not formed over the gate electrode, hydrogen can be prevented from penetrating into the channel region.

The present invention includes the steps of forming a semiconductor film; forming a first semiconductor film and a second semiconductor film by processing the semiconductor film; forming a gate insulating film over the first semiconductor film and the second semiconductor film; forming a conductive film over the gate insulating film; forming a first resist mask and a second resist mask over the conductive film; forming a first gate electrode over the first semiconductor film with the gate insulating film therebetween by processing the conductive film using the first resist mask, while forming a second gate electrode over the second semiconductor film with the gate insulating film therebetween by processing the conductive film using the second resist mask; forming a third resist mask so as to cover the first semiconductor film, the first gate electrode, and the first resist mask in a state where the first resist mask and the second resist mask remain; adding p-type impurity ions into the second semiconductor film by an ion shower doping method using the second resist mask and the third resist mask, thereby forming a source region and a drain region; removing the first resist mask, the second resist mask, and the third resist mask; forming a fourth resist mask so as to cover the second semiconductor film and the second gate electrode; and adding n-type impurity ions into the first semiconductor film by an ion shower doping method using the fourth resist mask, thereby forming a source region and a drain region, wherein the p-type impurity ions are formed of $B_2H_6$ (diborane) gas diluted with $H_2$ (hydrogen) gas, and the n-type impurity ions are formed of $PH_3$ (phosphine) gas diluted with $H_2$ (hydrogen) gas or $AsH_3$ (arsine) gas diluted with $H_2$ (hydrogen) gas.

Alternatively, the invention includes the steps of forming a semiconductor film over a substrate; forming a first semiconductor film and a second semiconductor film by processing the semiconductor film; forming a gate insulating film over the first semiconductor film and the second semiconductor film; forming a conductive film over the gate insulating film; forming a first resist mask and a second resist mask over the conductive film; forming a first gate electrode over the first semiconductor film with the gate insulating film therebetween by processing the conductive film using the first resist mask, while forming a second gate electrode over the second semiconductor film with the gate insulating film therebetween by processing the conductive film using the second resist mask; forming a third resist mask so as to cover the first semiconductor film, the first gate electrode, and the first resist mask in a state where the first resist mask and the second resist mask remain; adding n-type impurity ions into the second semiconductor film by an ion shower doping method using the second resist mask and the third resist mask, thereby forming a source region and a drain region; removing the first resist mask, the second resist mask, and the third resist mask; forming a fourth resist mask so as to cover the second semiconductor film and the second gate electrode; and adding p-type impurity ions into the first semiconductor film by an ion shower doping method using the fourth resist mask, thereby forming a source region and a drain region, wherein the p-type impurity ions are formed of $B_2H_6$ (diborane) gas diluted with $H_2$ (hydrogen) gas, and the n-type impurity ions are formed of $PH_3$ (phosphine) gas diluted with $H_2$ (hydrogen) gas or $AsH_3$ (arsine) gas diluted with $H_2$ (hydrogen) gas.

Further, in the above process, thickness of the gate insulating film may be 10 nm to 200 nm, thickness of the gate electrode may be 100 nm to 500 nm, and thickness of the first resist mask, the second resist mask, the third resist mask, and the fourth resist mask may be 1.0 μm to 1.5 μm.

Further, the gate insulating film may be a silicon oxide film and the gate electrode may be formed from a TaN film and a W film over the TaN film. Further, the thickness of the gate electrode may be thinner than 400 nm.

The invention includes the steps of forming a semiconductor film over a substrate; forming a first semiconductor film and a second semiconductor film by processing the semiconductor film; forming a gate insulating film over the first semiconductor film and the second semiconductor film; forming a conductive film over the gate insulating film; forming a first resist mask and a second resist mask over the conductive film; forming a first gate electrode over the first semiconductor film with the gate insulating film therebetween by processing the conductive film using the first resist mask, while forming a second gate electrode over the second semiconductor film with the gate insulating film therebetween by processing the conductive film using the second resist mask; forming a third resist mask so as to cover the first semiconductor film, the first gate electrode, and the first resist mask in a state where the first resist mask and the second resist mask remain; adding p-type impurity ions into the second semiconductor film by an ion shower doping method using the second resist mask and the third resist mask, thereby forming a source region and a drain region; removing the first resist mask, the second resist mask, and the third resist mask; forming a fourth resist mask over the first gate electrode while forming a fifth resist mask over the second gate electrode; forming a sixth resist mask so as to cover the second semiconductor film, the second gate electrode, and the fifth resist mask; and adding n-type impurity ions into the second semiconductor film by an ion shower doping method using the fourth resist mask and the sixth resist mask, wherein the p-type impurity ions are formed of $B_2H_6$ (diborane) gas diluted with $H_2$ (hydrogen) gas, and the n-type impurity ions are formed of $PH_3$ (phosphine) gas diluted with $H_2$ (hydrogen) gas or $AsH_3$ (arsine) gas diluted with $H_2$ (hydrogen) gas.

The invention includes the steps of forming a semiconductor film over a substrate; forming a first semiconductor film and a second semiconductor film by processing the semiconductor film; forming a gate insulating film over the first semiconductor film and the second semiconductor film; forming a conductive film over the gate insulating film; forming a first resist mask and a second resist mask over the conductive film; forming a first gate electrode over the first semiconductor film with the gate insulating film therebetween by processing the conductive film using the first resist mask, while forming a second gate electrode over the second semiconductor film with the gate insulating film therebetween by processing the conductive film using the second resist mask; forming a third resist mask so as to cover the first semiconductor film, the first gate electrode, and the first resist mask in a state where the first resist mask and the second resist mask remain; adding n-type impurity ions into the second semiconductor film by an ion shower doping method using the second resist mask and the third resist mask, thereby forming a source region and a drain region; removing the first resist mask, the second resist mask, and the third resist mask; forming a fourth resist mask over the first gate electrode while forming a fifth resist mask over the second gate electrode; forming a sixth resist mask so as to cover the second semiconductor film, the second gate electrode, and the fifth resist mask; and adding p-type impurity ions into the second semiconductor film by an ion shower doping method using the fourth resist mask and the sixth resist mask, thereby forming a source region and a drain region, wherein the p-type impurity ions are formed of $B_2H_6$ (diborane) gas diluted with $H_2$ (hydrogen) gas, and the n-type impurity ions are formed of $PH_3$ (phosphine) gas diluted with $H_2$ (hydrogen) gas or $AsH_3$ (arsine) gas diluted with $H_2$ (hydrogen) gas.

Further, the thickness of the gate insulating film may be 10 nm to 200 nm, the thickness of the gate electrode may be 100 nm to 500 nm, and thickness of the first resist mask, the second resist mask, the third resist mask, the fourth resist mask, the fifth resist mask, and the sixth may be 1.0 µm to 1.5 µm.

Further, the gate insulating film may be a silicon oxide film and the gate electrode may be formed from a TaN film and a W film over the TaN film. The thickness of the gate electrode may be thinner than 400 nm.

Considering accelerating voltage or accelerating energy of hydrogen ions generated simultaneously with the impurity ions, in the case where the n-type impurity ions are added after adding the p-type impurity ions, the accelerating voltage or accelerating energy of the n-type impurity ions may be lower than the accelerating voltage or accelerating energy of the p-type impurity ions. Thus, the accelerating voltage or accelerating energy of hydrogen ions generated simultaneously with the n-type impurity ions can be made lower than that of hydrogen ions generated simultaneously with the p-type impurity ions.

The accelerating voltage of the p-type impurity ions may be 50 kV to 100 kV, and the accelerating voltage of the n-type impurity ions may be 30 kV to 80 kV.

Further, the dose of the p-type impurity ions may be less than the dose of the n-type impurity ions. Thus, hydrogen ions generated simultaneously with the n-type impurity ions can be made less than hydrogen ions generated simultaneously with the p-type impurity ions.

The concentration of p-type impurities in the second semiconductor film may be $1.0 \times 10^{19}$ cm$^{-3}$ to $1.0 \times 10^{21}$ cm$^{-3}$, and concentration of the n-type impurities of the first semiconductor film may be $1.0 \times 10^{19}$ cm$^{-3}$ to $1.0 \times 10^{21}$ cm$^{-3}$.

In the case where the p-type impurity ions are added after adding the n-type impurity ions, the accelerating voltage or accelerating energy of the p-type impurity ions may be lower than the accelerating voltage or accelerating energy of the n-type impurity ions.

Further, accelerating voltage of the n-type impurity ions may be 50 kV to 100 kV, and accelerating voltage of the p-type impurity ions may be 30 kV to 80 kV.

Further, the dose of the n-type impurity ions may be less than the dose of the p-type impurity ions. Thus, hydrogen ions generated simultaneously with the p-type impurity ions can be made less than hydrogen ions generated simultaneously with the n-type impurity ions Further, the concentration of n-type impurities in the first semiconductor film may be $1.0 \times 10^{19}$ cm$^{-3}$ to $1.0 \times 10^{21}$ cm$^{-3}$ or less, and concentration of the p-type impurities of the second semiconductor film may be $1.0 \times 10^{19}$ cm$^{-3}$ to $1.0 \times 10^{21}$ cm$^{-3}$.

In accordance with the present invention, the problem of hydrogen ions that are generated in addition to impurity ions penetrating into a channel region is alleviated. Furthermore, the gate electrode can be made to be a thin film; thus, cost can be reduced.

BRIEF DESCRIPTION OF THE DRAWINGS

In the accompanying drawings:

FIGS. 4A to 4E are figures illustrating manufacturing steps of a semiconductor device according to the present invention;

FIGS. 9A and 9B are figures illustrating manufacturing steps of an ID chip;

FIG. 14 is a figure showing a manufacturing step of a liquid crystal display device;

DETAILED DESCRIPTION OF THE INVENTION

Preferred Embodiment Modes and Embodiment of the present invention will be described with reference to the drawings. Note that the present invention can be embodied with many different modes, and it is easily understood by those skilled in the art that the mode and detail can be variously modified without departing from the sprit and scope of the present invention. Therefore, the present invention is not construed as being limited to the description of Embodiment Modes and Embodiment.

EMBODIMENT MODE 1

Here, a method will be described, in which a first resist mask and a second resist mask which are used in forming a gate electrode for a p-channel TFT and a gate electrode for an n-channel TFT are left; after a third resist mask is formed over a first area where one of the p-channel TFT and the n-channel TFT is to be formed, first impurity ions are added using a second resist mask and third resist mask to form a source region and a drain region in a semiconductor film of the other one of the p-channel TFT and the n-channel TFT; after that, the first resist mask, the second resist mask, and the third resist mask are removed; and after a fourth resist mask is formed over a second area where the other one of the p-channel TFT and the n-channel TFT is to be formed, second impurity ions are added using a gate electrode and a fourth resist mask to form a source region and a drain region in a semiconductor film of the one of the p-channel TFT and the n-channel TFT.

Figure 1A:
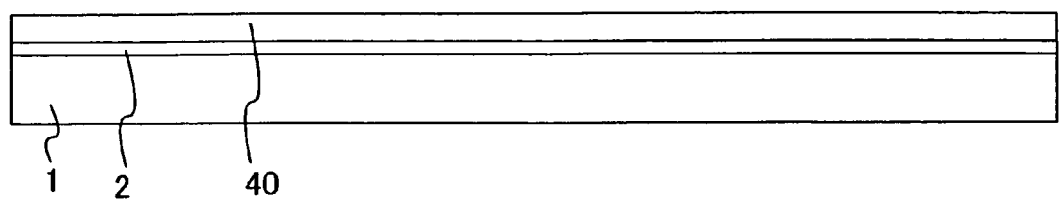
FIGS. 1A to 1D are figures illustrating manufacturing steps of a semiconductor device according to the present invention.

First, as shown in FIG. 1A, a semiconductor film 40 is formed to a thickness of 10 nm to 200 nm over a substrate 1.

As the substrate 1, a glass substrate, a quartz substrate, a substrate formed of an insulating material such as alumina, a plastic substrate which is heat-resistant to the processing temperature of a subsequent step, a silicon wafer, a metal substrate, or the like can be used.

In the case of using a plastic substrate for the substrate 1, PC (polycarbonate), PES (polyethylene sulfone), PET (polyethylene terephthalate), PEN (polyethylene naphthalate), or the like which have relatively high glass transition temperature is preferably used.

An insulating film 2 may be formed over the substrate surface. Silicon oxide ($SiO_x$), silicon nitride ($SiN_x$), silicon oxynitride ($SiO_xN_y$) (x>y), silicon nitride oxide ($SiN_xO_y$) (x>y), or the like may be used for the insulating film 2. The insulating film 2 can prevent diffusion of impurities or the like from the substrate side. The insulating film 2 may have a thickness of 10 nm to 200 nm. Alternatively, a substrate in which an insulating film of a silicon oxide, silicon nitride, or the like is formed on a surface of a substrate of metal such as stainless-steel or a semiconductor substrate may be used.

The insulating film 2 may be formed by treating the surface of the substrate 1 with high-density plasma. The high-density plasma is generated by using, for example, a microwave of 2.45 GHz, and is assumed to have an electron density of $1 \times 10^{11}/cm^3$ to $1 \times 10^{13}/cm^3$, an electron temperature of 2 eV or less, and an ion energy of 5 eV or less. Active species of such high-density plasma has low kinetic energy, and damage due to plasma is less than the case of a conventional plasma treatment; thus, a film with few defects can be formed. The distance from an antenna generating a microwave to the substrate 1 is preferably set to be 20 mm to 80 mm, more preferably, 20 mm to 60 mm.

In addition, the surface of the substrate 1 can be nitrided by performing the above-described high-density plasma treatment in a nitriding atmosphere, for example, in an atmosphere including nitrogen and a rare gas, an atmosphere including nitrogen, hydrogen, and a rare gas, or an atmosphere including ammonia and a rare gas. In the case of using a glass substrate, a quartz substrate, a silicon wafer, or the like as the substrate 1 and performing nitriding treatment with the above-described high-density plasma, a nitride film formed on the surface of the substrate 1 contains silicon nitride as its main component; thus, the nitride film can be used as the insulating film 2. A silicon oxide film or a silicon oxynitride film may be formed over the nitride film by plasma CVD, which may be used as the insulating film 2 including a plurality of layers.

In addition, a nitride film can be formed on the surface of the insulating film 2 formed of silicon oxide, silicon oxynitride, or the like by similarly performing nitriding treatment with high-density plasma on the surface of the insulating film 2. This nitride film can suppress diffusion of impurities from the substrate 1. In addition, the nitride film can be formed to be very thin. Therefore, influence of stress upon the semiconductor layer to be formed thereover can be reduced.

The semiconductor film 40 is formed using silicon, silicon-germanium, silicon-germanium-carbon, or the like. As a method for forming the semiconductor film 40, known CVD, sputtering, coating, vapor deposition, or the like can be used. The semiconductor film 40 may be any one of an amorphous semiconductor film, a crystalline semiconductor film, or a single crystalline semiconductor film.

In the case of using a crystalline semiconductor film, the following can be used as the formation method: a method of directly forming a crystalline semiconductor film, or a method of forming an amorphous semiconductor film over the substrate 1 and then crystallizing it.

As a method of crystallizing an amorphous semiconductor film, the following can be used as the method: a method of crystallizing an amorphous semiconductor film by irradiation with a laser beam 41 (FIG. 4A); a method of crystallizing an amorphous semiconductor film by heating using an element which promotes the crystallization of the semiconductor film; or a method of crystallizing an amorphous semiconductor film by heating using an element which promotes the crystallization of the semiconductor film and then irradiating the semiconductor film with a laser beam (FIGS. 4B and 4C). Naturally, a method of thermally crystallizing an amorphous semiconductor film without using the element can be used as well. However, such the method can be applied only in the case where the substrate is a quartz substrate, a silicon wafer, or the like which can withstand the high temperature.

In the case of laser irradiation, a continuous wave laser beam (CW laser beam) or a pulsed laser beam can be used. Here, a beam emitted from one or plural kinds of a gas laser such as an Ar laser, a Kr laser, or an excimer laser; a laser using, as a medium, single crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ doped with one or more of Nd, Yb, Cr, Ti, Ho, Er, Tm, and Ta as a dopant; a glass laser; a ruby laser; an alexandrite laser; a Ti: sapphire laser; a copper vapor laser; and a gold vapor laser, can be used as the laser beam. By irradiation with a laser beam having a fundamental wave of such lasers or one of the second to fourth harmonics, a crystal with a large grain size can be obtained. For example, the second harmonic (532 nm) or the third harmonic (355 nm) of an Nd:YVO$_4$ laser (fundamental wave of 1,064 nm) can be used. In this case, the power density of about 0.01 MW/cm$^2$ to 100 MW/cm$^2$ (preferably, 0.1 MW/cm$^2$ to 10 MW/cm$^2$) is required for the laser. The scanning rate is approximately set at about 10 cm/sec to 2,000 cm/sec to irradiate the semiconductor film.

Note that each laser using, as a medium, single crystalline YAG, YVO$_4$, forsterite (Mg$_2$SiO$_4$), YAlO$_3$, or GdVO$_4$ or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; an Ar ion laser; and a Ti: sapphire laser, is capable of continuous oscillation. Further, pulse oscillation thereof can be performed at a repetition rate of 10 MHz or more by carrying out Q switch operation or mode synchronization. When a laser beam is emitted at a repetition rate of 10 MHz or more, a semiconductor film is irradiated with a next pulse while the semiconductor film is melted by the laser beam and then solidified. Therefore, unlike the case of using a pulsed laser with a low repetition rate, a solid-liquid interface can be continuously moved in the semiconductor film so that crystal grains, which continuously grow in a scanning direction, can be obtained.

When ceramic (polycrystal) is used as a medium, the medium can be formed to have a free shape for a short time at low cost. When using a single crystal, a columnar medium with several mm in diameter and several tens of mm in length is usually used. In the case of using the ceramic, a medium bigger than the case of using the single crystal can be formed.

A concentration of a dopant such as Nd or Yb in a medium, which directly contributes to light emission, cannot be changed largely in either case of the single crystal or the polycrystal; therefore, there is some limitation on improvement in output of a laser by increasing the concentration of the dopant. However, in the case of a ceramic, the size of a medium can be significantly increased as compared with the case of the single crystal; thus, drastic improvement in output of a laser can be expected.

Further, in the case of a ceramic, a medium with a parallelepiped shape or a rectangular parallelepiped shape can be formed easily. In a case of using a medium having such a shape, when oscillated light is made travel in a zigzag manner inside the medium, a path of the oscillated light can be made long. Therefore, amplification is increased and a laser beam can be oscillated at high output. Furthermore, a cross section of a laser beam emitted from a medium having such a shape has a quadrangular shape, which is advantageous when the laser beam is shaped into a quadrangular shape in cross section as compared with a laser beam with a circular shape. By shaping a laser beam emitted in the above described manner using an optical system, a linear beam having a length of 1 mm or less on a shorter side and a length of several mm to several m on a longer side can be easily obtained. In addition, when a medium is uniformly irradiated with excited light, energy distribution of a linear beam is uniform in a longer side direction.

When a semiconductor film is irradiated with this linear beam, the whole surface of the semiconductor film can be annealed more uniformly. In a case where uniform annealing is required from one end to the other end of the linear beam, for example, an arrangement in which slits are provided in either end of the linear beam is required thereby shielding light at a portion where energy is attenuated.

When a semiconductor film is annealed using the thus obtained linear beam having uniform intensity and an electronic device is manufactured by using this semiconductor film, characteristics of the electronic device are good and uniform.

As the method of crystallizing the semiconductor film by heating with an element which promotes the crystallization of the semiconductor film, a technique disclosed in Japanese Patent Laid-Open No. 8-78329, the entire contents of which are hereby incorporated by reference, can be used. As to the technique in the patent application publication, an amorphous semiconductor film is doped with a metal element 42 which promotes the crystallization of the semiconductor film, and then heat treatment is carried out so that the amorphous semiconductor film is crystallized with the doped region as a nucleus (FIG. 4B).

An amorphous semiconductor film can also be crystallized by performing irradiation with strong light instead of the heat treatment. In that case, any one of or a combination of infrared light, visible light, and ultraviolet light can be used. Typically, light emitted from a halogen lamp, a metal halide lamp, a xenon arc lamp, a carbon arc lamp, a high pressure sodium lamp, or a high pressure mercury lamp is used. The lamp light source is lighted for 1 to 60 seconds, or preferably 30 to 60 seconds, and such lighting is repeated 1 to 10 times, or preferably 2 to 6 times. The light-emission intensity of the lamp light source is arbitrary, but the semiconductor film is instantaneously heated up to 600° C. to about 1000° C. Note that if necessary, heat treatment may be performed in order to discharge the hydrogen contained in the amorphous semiconductor film 40 having an amorphous structure before the irradiation with the strong light. Alternatively, crystallization may be performed by both the heat treatment and irradiation with strong light.

After the heat treatment, in order to increase the crystallization rate of the crystalline semiconductor film (rate of area occupied by crystalline components against the whole volume of the film) and to correct defects which remain in the crystalline grains, the crystalline semiconductor film may be irradiated with the laser beam 41 in the atmospheric air or an oxygen atmosphere. The laser beam may be selected from the aforementioned ones (FIG. 4C).

Further, the metal element contained in the crystalline semiconductor film is required to be removed. The method will be described below.

First, the surface of the crystalline semiconductor film is treated with a solution containing ozone (typically, ozone water), thereby forming a barrier layer 43 formed from an oxide film (called chemical oxide) on the surface of the crystalline semiconductor film to a thickness of 1 nm to 10 nm (FIG. 4D). The barrier layer 43 functions as an etching stopper when only a gettering layer is selectively removed in a subsequent step.

Then, a gettering layer containing a rare gas element is formed as a gettering site over the barrier layer 43. Here, a semiconductor film containing a rare gas element is formed as the gettering layer 44 by CVD or sputtering (FIG. 4D). When forming the gettering layer, the sputtering conditions are controlled as appropriate so that a rare gas element is added thereto. The rare gas element may be one or more of helium (He), neon (Ne), argon (Ar), krypton (Kr), or xenon (Xe).

Note that in the case of forming the gettering layer by using a feed gas containing phosphorus which is an impurity element having one conductivity type or using a target including phosphorus, gettering can be performed by utilizing the coulomb force of phosphorus in addition to the gettering using the rare gas element. In gettering, a metal element (e.g., nickel) tends to move to a region having a high concentration of oxygen; therefore, the concentration of oxygen contained in the gettering layer 43 is desirably set at $5 \times 10^{18}$/cm$^3$ or higher, for example.

Next, the crystalline semiconductor film, the barrier layer and the gettering layer is subjected to thermal treatment (e.g., heat treatment or irradiation with strong light), thereby the metal element (e.g., nickel) is gettered as shown by the arrows in FIG. 4D so that the metal element in the crystalline semiconductor film is lowered in concentration or removed.

Then, a known etching method is performed using the barrier layer 43 as an etching stopper, thereby only the gettering layer 44 is selectively removed. After that, the barrier layer 43 formed from an oxide film is removed, for example, using an etchant containing hydrofluoric acid (FIG. 4E).

Here, impurity ions may be added in consideration of threshold characteristics of a TFT to be manufactured.

Figure 1B:
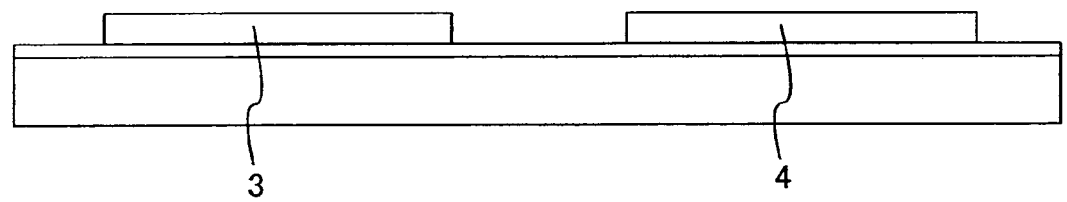

Next, a semiconductor film is formed into island-shaped semiconductor films 3 and 4 by a known photolithography process (FIG 1B). Here, a p-channel TFT is formed using the semiconductor film 3, and an n-channel TFT is formed using the semiconductor film 4.

Figure 1C:
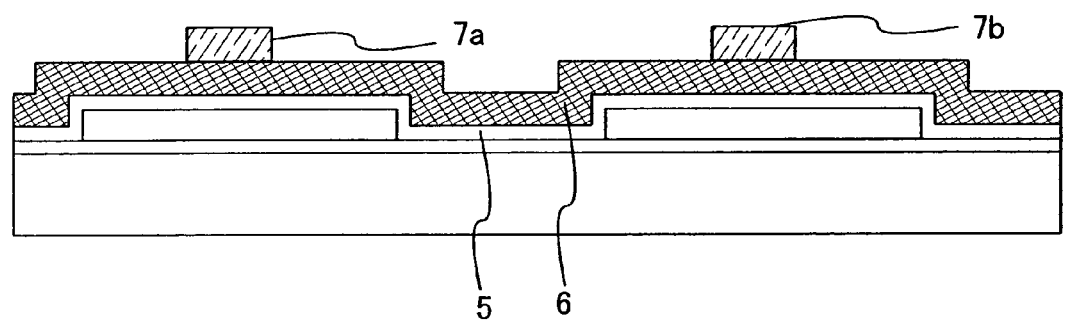

Then, after cleaning the surfaces of the semiconductor films with an etchant containing hydrofluoric acid, a gate insulating film 5 is formed to a thickness of 10 nm to 200 nm over the semiconductor films (FIG. 1C). The surface cleaning and the formation of the gate insulating film 5 may be continuously carried out without exposure to the atmosphere. The gate insulating film 5 is formed from an insulating film containing silicon as a main component, for example, a silicon oxide film, a silicon nitride film, a silicon oxynitride film, a silicon nitride oxide film, or the like. Further, the gate insulating film may a single layer or a layered film.

Next, after cleaning the surface of the gate insulating film 5, a conductive film 6 forming a gate electrode is formed to a thickness of 100 nm to 500 nm over the whole surface including the surface of the gate insulating film 5 (FIG. 1C). The conductive film 6 may be formed of an element selected from tantalum (Ta), tungsten (W), titanium (Ti), molybdenum (Mo), or aluminum (Al); or an alloy material or a compound material containing one of the above elements as a main component. Alternatively, a semiconductor film typified by a polycrystalline silicon film doped with an impurity element such as phosphorus (P) or the like may be used. Further, the conductive film 6 may have a single layer structure or a layered structure including two or more layers.

Figure 1D:
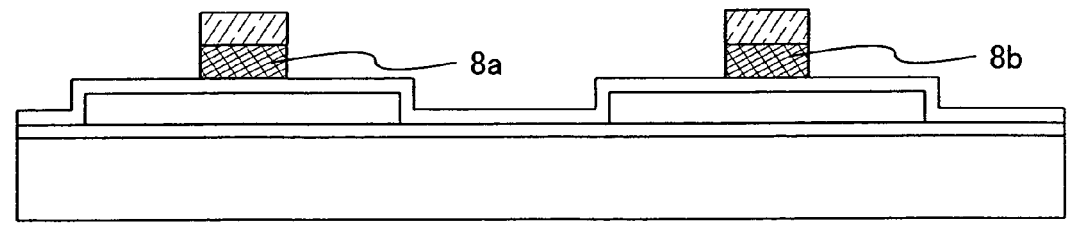

The surface of the conductive film 6 is coated with a photoresist film, and this photoresist film is exposed and developed, thereby forming a first resist mask 7a and a second resist mask 7b to a thickness of 1.0 µm to 1.5 µm. The conductive film 6 is etched using the resist masks 7a and 7b, thereby forming gate electrodes 8a and 8b over the gate insulating film 5 (FIG 1D). Here, the first resist mask 7a and the second resist mask 7b are not removed, and are used in the next doping process. Note that the resist masks of this embodiment mode can be formed of a positive type resist containing novolac resin and a naphthoquinone diazide compound.

Further, a wire such as a gate wire can be formed from the same material as the gate electrodes 8a and 8b. Here, the gate electrode or the wire is preferably led so as to have a round corner when seen from a direction perpendicular to the substrate 1. By making the corners round, dust or the like can be prevented from remaining at the corners of the wire; thus, the number of defects generated due to dust can be reduced and yield can be improved.

Figure 2A:
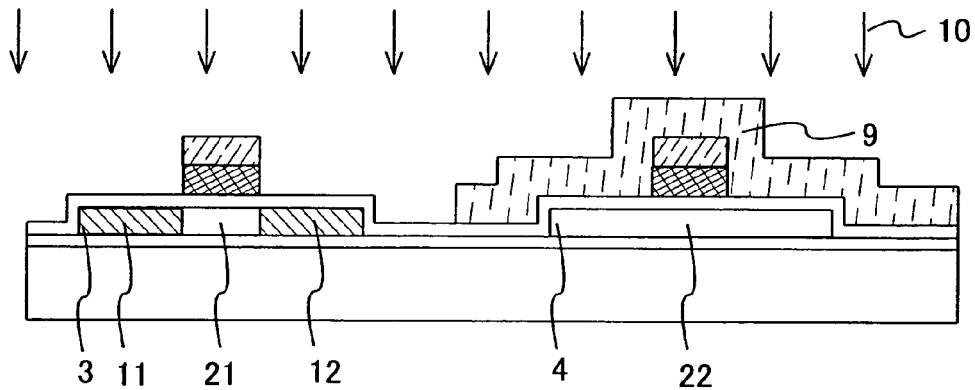
FIGS. 2A to 2D are figures illustrating manufacturing steps of a semiconductor device according to the present invention.

Next, coating with a photoresist film is carried out, and the photoresist film is exposed and developed, thereby forming a third resist mask 9 to a thickness of 1.0 µm to 1.5 µm covering the semiconductor film 4, the gate electrode 8b, and the second resist mask 7b (FIG. 2A).

The semiconductor film 3 is doped with p-type impurity ions 10 (ions containing B) using the first resist mask 7a, the second resist mask 7b, the third resist mask 9, and the gate electrodes 8a and 8b as masks, thereby forming the source region 11 and the drain region 12. The p-type impurity ions accelerate at 50 kV to 100 kV, and concentration of the p-type impurity is $1.0 \times 10^{19}$ cm$^{-3}$ to $1.0 \times 10^{21}$ cm$^{-3}$. The p-type impurity ions are added to the semiconductor film by an ion shower doping method using diborane ($B_2H_6$) gas diluted with hydrogen gas. At this time, not only ions containing B but also hydrogen ions are generated. The gate electrode serves as a mask when the ions containing B are added; however, hydrogen ions easily penetrate through the gate electrode and penetrate the channel region of the semiconductor layer thereunder.

However, in the present invention, since the gate insulating film 5, the third resist mask 9, the second resist mask 7b, and the gate electrode 8b are formed over the area under the gate electrode of the semiconductor film 4, that is, a channel region 22, it is extremely unlikely that hydrogen ions will penetrate it.

Meanwhile, although the third resist mask 9 is not formed over a channel region 21 of the semiconductor film 3, the gate insulating film 5, the gate electrode 8a, and the first resist mask 7a are formed thereover, so it is unlikely that hydrogen ions will penetrate it. This effect is significant when the thickness of the gate electrode is thinner than 400 nm.

Figure 2B:
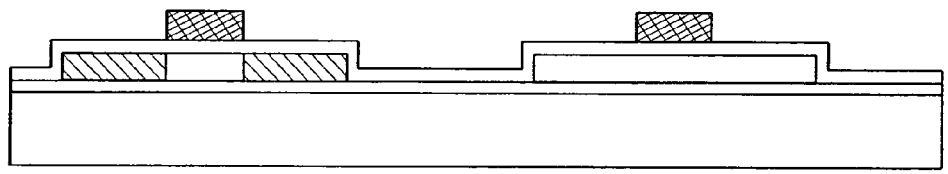

Next, the third resist mask 9, the first resist mask 7a, and the second resist mask 7b are removed by a method such as ashing (FIG. 2B).

Figure 2C:
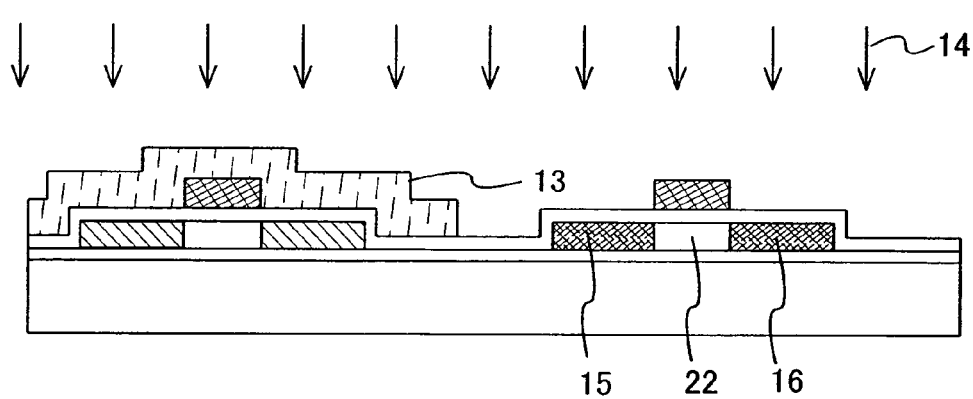

Then, coating with a photoresist film is carried out, and the photoresist film is exposed and developed, so that a fourth resist mask 13 is formed to a thickness of 1.0 µm to 1.5 µm covering the semiconductor film 3, and the gate electrode 8a (FIG. 2C).

The n-type impurity ions 14 (ions containing phosphorus, ions containing arsenic, or the like) are introduced into the semiconductor film 4 using the fourth resist mask 13, the gate electrodes 8a and 8b as masks, thereby forming a source region 15 and a drain region 16 (FIG. 2C). The n-type impurity ions accelerates at 30 kV to 80 kV, and concentration of the n-type impurity is $1.0 \times 10^{19}$ cm$^{-3}$ to $1.0 \times 10^{21}$ cm$^{-3}$. For example, the semiconductor film 4 is doped with the n-type impurity ions by a shower doping method using phosphine ($PH_3$) gas diluted with hydrogen gas.

At this time, the accelerating voltage or acceleration energy of the n-type impurity ions is preferably lower than the accelerating voltage or acceleration energy of the p-type impurity ions. When the accelerating voltage or acceleration energy of the p-type impurity ions is decreased, the accelerating voltage or acceleration energy of the hydrogen ions generated concurrently with the impurity ions is also decreased. Therefore, even if a resist mask is not formed over gate electrodes 8a and 8b, the number of hydrogen ions penetrating the channel regions 21 and 22 can be reduced.

The dose of the n-type impurity ions is preferably less than the dose of the p-type impurity ions. Thus, the dose of hydrogen ions generated concurrently with the n-type impurity ions can be made less than that of hydrogen ions generated concurrently with the p-type impurity ions; therefore, even when hydrogen ions penetrate the channel regions, deterioration can be prevented.

Here, heat treatment, irradiation with laser light or intense light, RTA or the like may be performed to activate the source regions and the drain regions.

Thus the semiconductor film 3 becomes a p-channel TFT, and the semiconductor film 4 becomes an n-channel TFT.

Here, p-type impurity ions are added first and n-type impurity ions are added afterwards; however, the order may be reversed. In that case, the accelerating voltage or acceleration energy of the p-type impurity ions is preferably lower than the accelerating voltage or acceleration energy of the n-type impurity ions. As the accelerating voltage, the voltage described above can be used. Therefore, even if a resist mask is not formed over the gate electrodes 8*a* and 8*b*, the number of hydrogen ions penetrating the channel regions can be reduced.

Further, the dose of p-type impurity ions is preferably less than the dose of the n-type impurity ions. Thus, the dose of hydrogen ions generated simultaneously with p-type impurity ions can be made less than that of hydrogen ions generated simultaneously with the n-type impurity ions. Further, even when hydrogen ions penetrate the channel regions, deterioration can be prevented.

Next, an interlayer insulating film 17 is formed over the whole surface including the surfaces of the gate insulating film 5 and the gate electrodes 8*a* and 8*b*, and hydrogenation is carried out. As the interlayer insulating film 17, a silicon nitride film, a silicon oxide film, a silicon oxynitride film, or a silicon nitride oxide film can be used.

Then, a resist mask is formed over the interlayer insulating film 17, and the interlayer insulating film 17 is etched using the resist mask; thus, contact holes located above each of the source regions 11 and 12 and each of the drain regions 15 and 16 are formed.

Figure 2D:
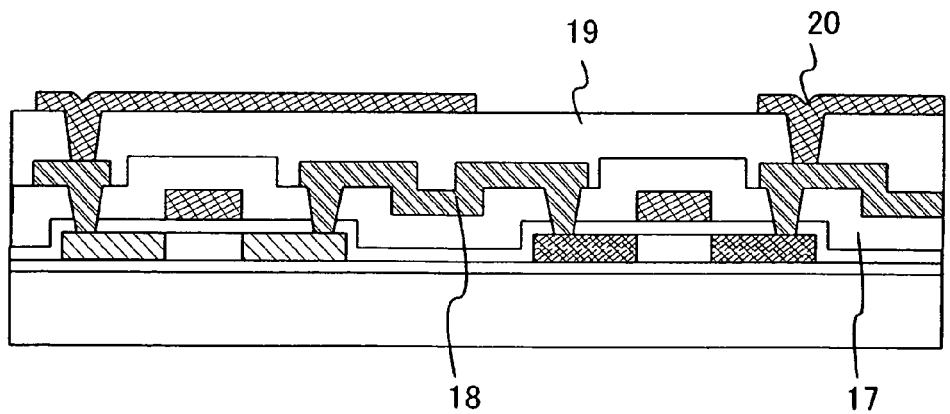

After the resist mask is removed and a conductive film is formed, etching is carried out using another resist mask, thereby forming an electrode or a wire 18 (a source wire and a drain wire of the TFTs, or a current supply wire of the TFTs) (FIG. 2D). Note that, in this embodiment mode, the electrode and the wire are integrated; however, the electrode and the wire may be separately formed and connected electrically. As the conductive film, a layered film of TiN, Al, and TiN, or an Al alloy film can be used.

Here, the electrode or the wire is preferably led so as to have a round corner when seen from a direction perpendicular to the substrate 1. By making the corners round, dust or the like can be prevented from remaining at the corners of the wire; thus, the number of defects generated due to dust can be reduced and the yield can be improved.

A mask manufactured by exposure and development using a photosensitive resist as a photomask is used for patterning. Transmittance of light for exposure in an arbitrary portion of the photomask is suppressed, thereby controlling the thickness of the developed mask. By controlling the thickness of the mask, fine and accurate patterning can be performed.

A planarizing film to be a second interlayer insulating film 19 is formed. The planarizing film is formed using a light-transmitting inorganic material (silicon oxide, silicon nitride, silicon nitride containing oxygen, or the like), a photosensitive or non-photosensitive organic material (polyimide, acrylic, polyamide, polyimide amide, a resist, benzocyclobutene, or the like), or a stack thereof. Alternatively, the planarizing film may be formed using a light-transmitting film such as an insulating film formed from a $SiO_x$ film containing an alkyl group obtained by a coating method. For example, an insulating film formed of silica glass, alkyl siloxane polymers, alkylsilsesquioxane polymers, hydrogen silsesquioxane polymers, hydrogen alkylsilsesquioxane polymers, or the like can be used. As examples of siloxane-based polymers, there are coating insulating film materials such as PSB-K1 and PSB-K31 (product of Toray industries, Inc.) and a coating insulating film material such as ZRS-5PH (product of Catalysts & Chemicals Industries Co., Ltd.).

Contact holes are formed in the second interlayer insulating film 19 using another resist mask.

Next, a conductive film 20 is formed. The conductive film can be formed from a transparent conductive film using indium tin oxide containing a Si element, IZO (Indium Zinc Oxide) in which zinc oxide (ZnO) is mixed with indium oxide, or the like other than indium tin oxide (ITO).

After that, the conductive film is patterned using another resist mask to form a electrode (FIG. 2D). Note that the conductive film is not required to be transparent if it is not used for a display device.

EMBODIMENT MODE 2

Here, a method will be described in which a first resist mask and a second resist mask used in forming a gate electrode for a p-channel TFT and a gate electrode for an n-channel TFT are left; a third resist is formed over a first area where one of the p-channel TFT and the n-channel TFT is to be formed; first impurity ions are added afterwards using the second resist mask and the third resist mask, thereby forming a source region and a drain region in a semiconductor film of the other one of the p-channel TFT and the n-channel TFT; after that, the first resist mask, the second resist mask, and third resist mask are removed, and a fourth resist mask and a fifth resist mask are formed over the gate electrode for the p-channel TFT and the gate electrode for the n-channel TFT; a sixth resist mask is formed over a second area where the other one of the p-channel TFT and the n-channel TFT is to be formed, and second impurity ions are added after that using the fourth resist mask, the fifth resist mask, and the sixth resist mask; thus, a source region and a drain region is formed in a semiconductor film of the one of the p-channel TFT and the n-channel TFT.

A material or a formation method of an insulating film, a semiconductor film, an electrode, a wire, a resist or the like can be the same as ones explained in Embodiment Mode 1.

An insulating film 2 is formed; semiconductor films 3 and 4 are formed; a gate insulating film 5 is formed; gate electrodes 8*a* and 8*b* are formed using a first resist mask 7*a* and a second resist mask 7*b*; a third resist mask 9 is formed covering the semiconductor film 4, the gate electrode 8*b*, and the second resist mask 7*b*; the semiconductor film 3 is doped with p-type impurity ions 10 (ions containing B) using the first resist mask 7*a*, the second resist mask 7*b*, the third resist mask 9, and the gate electrodes 8*a* and 8*b* as masks, thereby forming the source region 11 and the drain region 12; and the third resist mask 9, the first resist mask 7*a*, and the second resist mask 7*b* are removed by ashing or the like. These steps are the same as those in Embodiment Mode 1 (FIGS. 1A to 1D, FIGS. 2A and 2B, FIGS. 4A to 4E).

Figure 3A:
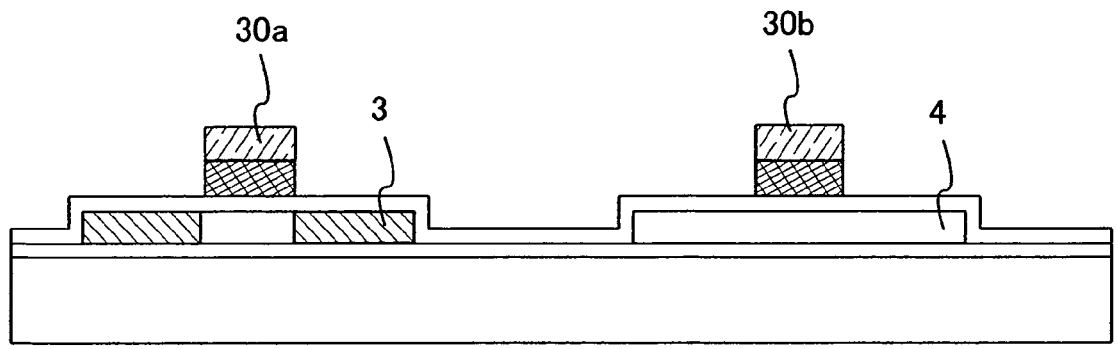
FIGS. 3A to 3C are figures illustrating manufacturing steps of a semiconductor device according to the present invention.

Next, the surfaces of the gate electrodes 8*a* and 8*b* are coated with a photoresist film and the photoresist film is exposed and developed, thereby forming a fourth resist mask 30*a* and a fifth resist mask 30*b* to a thickness of 1.0 μm to 1.5 μm over the gate electrodes 8*a* and 8*b* (FIG. 3A).

Figure 3B:
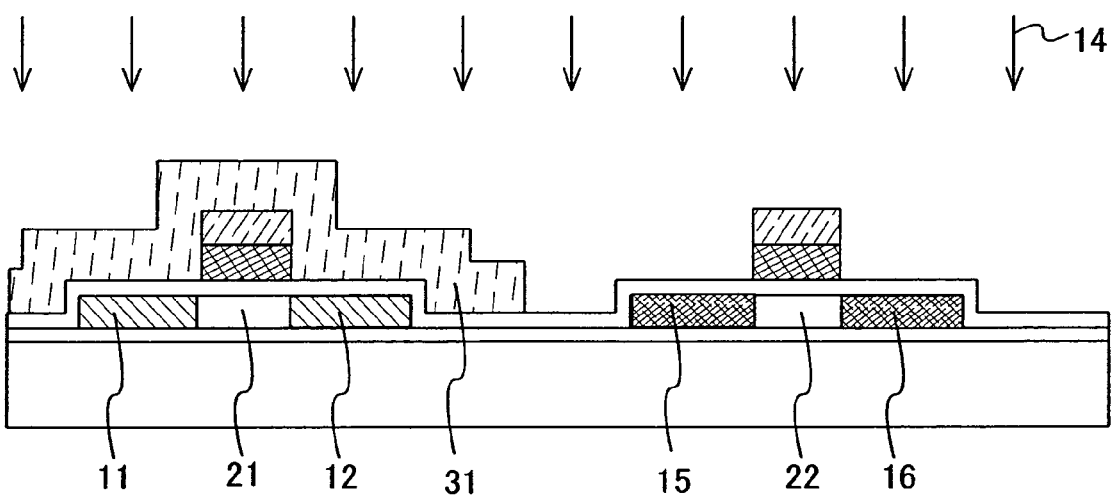

Subsequently, coating with a photoresist film is carried out and the photoresist film is exposed and developed, thereby forming the sixth resist mask 31 to a thickness of 1.0 μm to 1.5 μm covering the semiconductor film 3 and the gate electrode 8*a* (FIG. 3B).

The n-type impurity ions 14 (ions containing phosphorus, ions containing arsenic, or the like) are introduced into the semiconductor film 4 using the sixth resist mask 31, the fifth resist mask 30*b*, the gate electrodes 8*a* and 8*b* as masks, thereby forming a source region 15 and a drain region 16 (FIG. 3B). The n-type impurity ions accelerate at 30 kV to 80 kV. Further, concentration of the n-type impurity is $1.0 \times 10^{19}$ cm$^{-3}$ to $1.0 \times 10^{21}$ cm$^{-3}$. For example, the semiconductor film 4 is doped with the n-type impurity ions by a shower doping method using phosphine (PH$_3$) gas diluted with hydrogen gas or arsine (AsH$_3$) gas diluted with hydrogen gas.

Here, since the gate insulating film, the sixth resist mask 31, the fourth resist mask 30a, and the gate electrode 8b are formed over the region under the gate electrode of the semiconductor film 3, that is, a channel region 21, it is extremely unlikely that hydrogen ions will penetrate the channel region 21.

Meanwhile, although the sixth resist mask 31a is not formed over a channel region 22 of the semiconductor film 4, since the gate insulating film, the gate electrode 8a, and the fifth resist mask 30b are formed over it, it is unlikely that hydrogen ions will penetrate the channel region 22.

Further, if the accelerating voltage or acceleration energy of the n-type impurity ions is made lower than the accelerating voltage or acceleration energy of the p-type impurity ions, the accelerating voltage or acceleration energy of the hydrogen ions can be decreased; thus, the number of hydrogen ions penetrating the channel region 22 can be reduced even when the sixth resist mask 31 is not formed over the gate electrode 8b.

The dose of the n-type impurity ions is preferably less than the dose of the p-type impurity ions. Thus, even when hydrogen ions penetrate the channel regions, deterioration can be prevented.

Here, p-type impurity ions are added first and n-type impurity ions are added afterwards; however, the order may be reversed.

Figure 3C:
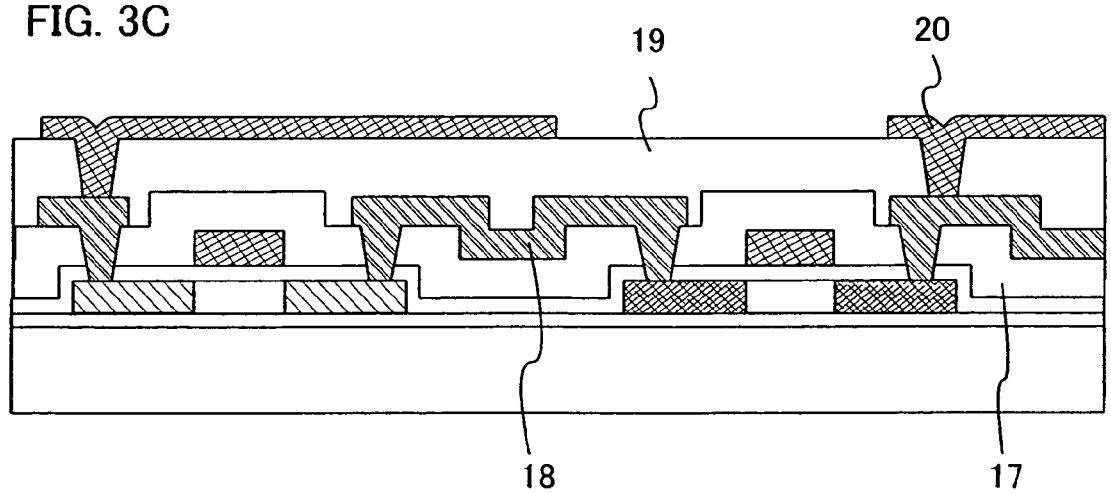

The subsequent steps of forming an interlayer insulating film 17, forming a contact hole in the interlayer insulating film 17, forming an electrode or wire 18 (a source wire and a drain wire of the TFT, a current supply wire of the TFT, or the like), forming a planarizing film to be a second interlayer insulating film 19, forming a contact hole in the second interlayer insulating film 19, and forming a conductive film 20, are the same as those in Embodiment Mode 1 (FIG. 3C).

EMBODIMENT MODE 3

Here, a method for manufacturing a semiconductor device which is capable of data transmission/reception without contact, for example, an IC tag, or an RFID using the present invention will be described. Note that, parts that are the same as those in the above embodiment modes are denoted by the same reference numerals.

Figure 8A:
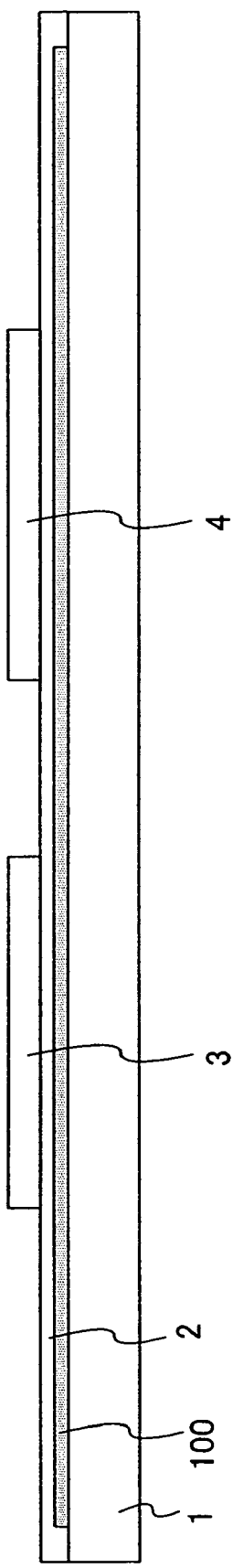
FIGS. 8A and 8B are figures illustrating manufacturing steps of an ID chip.

First, a release layer 100 is formed over one surface of the substrate 1 (FIG. 8A). The substrate 1 is formed using a glass substrate, a quartz substrate, a metal substrate or a stainless substrate over one surface of which an insulating layer is formed, a plastic substrate which is resistant to the processing temperature of the present step, or the like. There is no limitation on the size or the shape of a substrate such as the substrate 1. When a substrate has a rectangular shape with a length of one meter or longer on a side, the productivity can be drastically improved. Such an advantage is far superior to the case where a wireless chip is taken from a circular silicon substrate. In addition, a thin film integrated circuit formed over the substrate 1 is separated from the substrate 1 later. In other words, the wireless chip provided by the invention does not have the substrate 1. Accordingly, the substrate 1 from which a thin film integrated circuit is separated can be reused a number of times. In this manner, if the substrate 1 is reused, cost reduction can be achieved. The substrate 1 to be reused is desirably a quartz substrate.

Note that in this embodiment, the release layer 100 is selectively provided by forming a thin film over one surface of the substrate 1, and patterning it by photolithography.

The release layer 100 is formed in a single layer or a stack by a known method (e.g., sputtering or plasma CVD) using an element selected from tungsten (W), molybdenum (Mo), titanium (Ti), tantalum (Ta), niobium (Nb), nickel (Ni), cobalt (Co), zirconium (Zr), zinc (Zr), ruthenium (Ru), rhodium (Rh), lead (Pd), osmium (Os), iridium (Ir), or silicon (Si), or an alloy material or compound material containing such elements as a main component. A layer containing silicon may have any of an amorphous structure, a microcrystalline structure and a polycrystalline structure.

If the release layer 100 has a single-layer structure, it is preferably formed using a tungsten layer, a molybdenum layer, or a layer containing a mixture of tungsten and molybdenum. Alternatively, the release layer 100 is formed using a layer containing tungsten oxide, layer containing a tungsten oxynitride, a layer containing molybdenum oxide, a layer containing molybdenum oxynitride, or a layer containing oxide or oxynitride of a mixture of tungsten and molybdenum. Note that the mixture of tungsten and molybdenum corresponds, for example, to an alloy of tungsten and molybdenum.

If the release layer 100 has a layered structure, preferably, a first layer thereof is formed of a tungsten layer, a molybdenum layer, or a layer containing a mixture of tungsten and molybdenum, and a second layer thereof is formed of oxide, nitride, oxynitride or nitride oxide of tungsten, molybdenum, or a mixture of tungsten and molybdenum.

In the case where the release layer 100 is formed with a layered structure of a layer containing tungsten and a layer containing tungsten oxide, the layer containing tungsten may be formed first and a silicon oxide layer may be formed thereon so that a tungsten oxide layer is formed at the interface between the tungsten layer and the silicon oxide layer. This also applies to the case of forming a layer containing nitride, oxynitride or nitride oxide of tungsten. For example, after forming a tungsten layer, a silicon nitride layer, a silicon oxynitride layer, or a silicon nitride oxide layer is formed thereover. Note that the silicon oxide layer, the silicon oxynitride layer, the silicon nitride oxide layer or the like which is formed over the tungsten layer serves as a base insulating layer later.

The tungsten oxide is denoted by WO$_x$, where x is 2 or 3. There are cases where x is 2 (the oxide is WO$_2$), x is 2.5 (the oxide is W$_2$O$_5$), x is 2.75 (the oxide is W$_4$O$_{11}$), x is 3 (the oxide is WO$_3$), and the like. In forming the oxide of tungsten, the x value is not specifically limited to a certain value, and it may be determined based on the etching rate or the like. Note that a layer containing tungsten oxide which is formed by sputtering in an oxygen atmosphere has the best etching rate (WO$_x$, 0<x<3). Thus, in order to reduce manufacturing time, the release layer is preferably formed using a layer containing tungsten oxide by sputtering in an oxygen atmosphere.

Note that the release layer 100 is formed so as to contact the substrate 1 in the aforementioned step; however, the invention is not limited thereto. For example, after forming an insulating layer to be a base so as to contact the substrate 1, the release layer 100 may be formed so as to contact the insulating layer.

Then, a base insulating layer 2 is formed to be a base so as to cover the release layer 100. The insulating layer 2 is formed in a single layer or a stack by a known method (e.g., sputtering or plasma CVD) using a layer containing silicon oxide or a layer containing silicon nitride. Silicon oxide is a substance containing silicon (Si) and oxygen (O), which corresponds to silicon oxide, silicon oxynitride, silicon nitride oxide, or the like. The silicon nitride material is a substance containing silicon and nitrogen (N), which corresponds to silicon nitride, silicon oxynitride, silicon nitride oxide, or the like.

Then, after an amorphous silicon film is formed over the insulating layer 2, a p-channel TFT and an n-channel TFT are manufactured. The TFTs can be manufactured by using a method shown in the above embodiment modes; therefore, the description is omitted here.

Figure 8B:
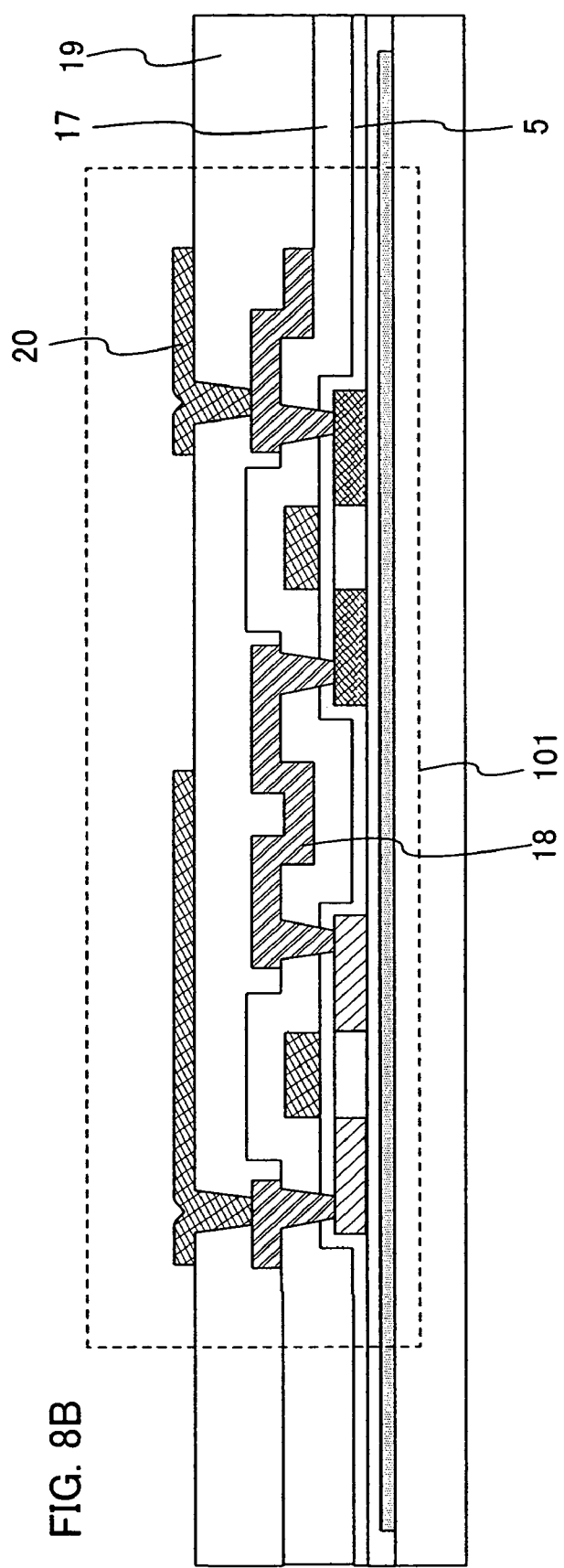

FIG. 8B shows one in which steps up to the formation of a TFT are finished. As compared to FIG. 2D, difference is that a release layer is provided under the insulating film over the substrate.

A conductive film 20 formed in the above embodiment mode functions as an antenna. Unlike the above embodiment mode, the conductive film 20 is formed in a single layer or a stack using an element selected from aluminum (Al), titanium (Ti), silver (Ag), or copper (Cu) or an alloy material or a compound material containing such an element as a main component. For example, the conductive film 20 may be formed by stacking a barrier layer, and an aluminum layer in this order, or a barrier layer, an aluminum layer, and a barrier layer in this order. The barrier layer corresponds to titanium, titanium nitride, molybdenum, molybdenum nitride, or the like.

Next, although not shown here, a protective layer may be formed by a known method so as to cover the thin film integrated circuit 101. The protective layer corresponds to a layer containing carbon such as DLC (Diamond Like Carbon), a layer containing silicon nitride, a layer containing silicon nitride oxide, or the like.

Then, the insulating layers 2, 5, 17, and 19 are etched by photolithography so as to expose the release layer 100, thereby forming openings 102 and 103 (FIG. 9A).

Then, an insulating layer 104 is formed by a known method (e.g., an SOG method or droplet discharge method) so as to cover the thin film integrated circuit 101 (FIG. 9B). The insulating layer 104 is formed using an organic material, preferably an epoxy resin. The insulating layer 104 is formed to prevent the thin film integrated circuit 101 from shattering. Since the thin film integrated circuit 101 is small, thin, and lightweight, it easily shatters after the removal of the release layer as it is not directly contact the substrate. However, by forming the insulating layer 104 around the thin film integrated circuit 101, the weight of the thin film integrated circuit 101 can be increased, and thus the shattering thereof from the substrate 1 can be prevented. The thin film integrated circuit 101 itself is thin and lightweight; however, by forming the insulating layer 104, the thin film integrated circuit 101 can be prevented from being rolled and have a certain degree of strength. Note that in the structure shown, the insulating layer 104 is formed over the top surface and side surfaces of the thin film integrated circuit 101; however, the invention is not limited to this structure, and the insulating layer 104 may be formed only over the top surface of the thin film integrated circuit 101. In addition, in the above description, after the step of forming the openings 102 and 103, the step of forming the insulating layer 104 is carried out; however, the invention is not limited to this order. For example, after the step of forming the insulating layer 104 over the insulating layer 19, the step of forming the openings may be performed by etching the plurality of insulating layers. In the case of this order of the steps, the insulating layer 104 is formed over only the top surface of the thin film integrated circuit 101.

Figure 10A:
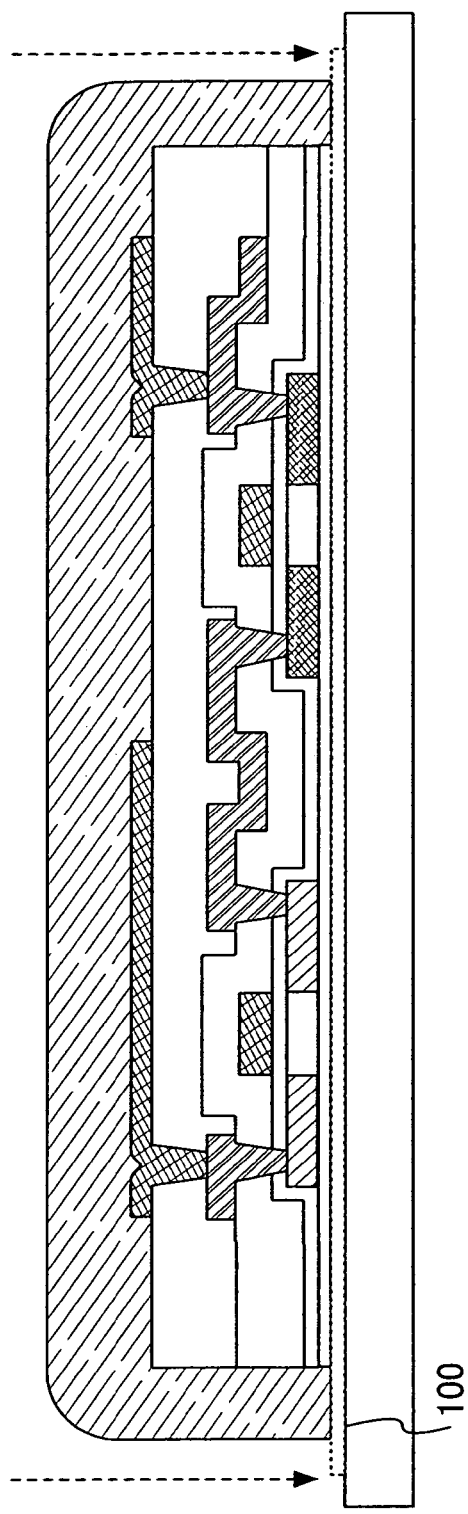
FIGS. 10A and 10B are figures illustrating manufacturing steps of an ID chip.

Then, an etchant is added into the openings 102 and 103, thereby removing the release layer 100 (FIG. 10A). As the etchant, a gas or a solution containing halogen fluoride or an interhalogen compound is used. For example, chlorine trifluoride ($ClF_3$) is used as a gas containing halogen fluoride. Thus, the thin film integrated circuit 101 is separated from the substrate 1. Alternatively, the thin film integrated circuit 101 may be separated from the substrate 1 using physical strength without the use of an etchant.

Figure 10B:
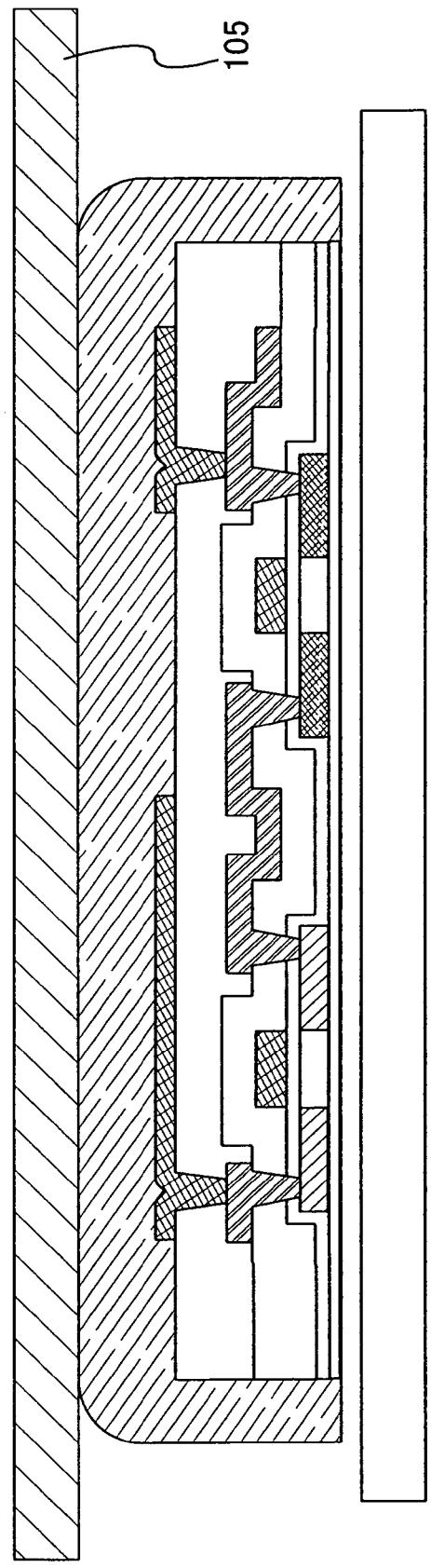

Next, one surface of the thin film integrated circuit 101 is stuck to a first base 105 so that the thin film integrated circuit 101 is completely separated from the substrate 1 (FIG. 10B).

Figure 11:
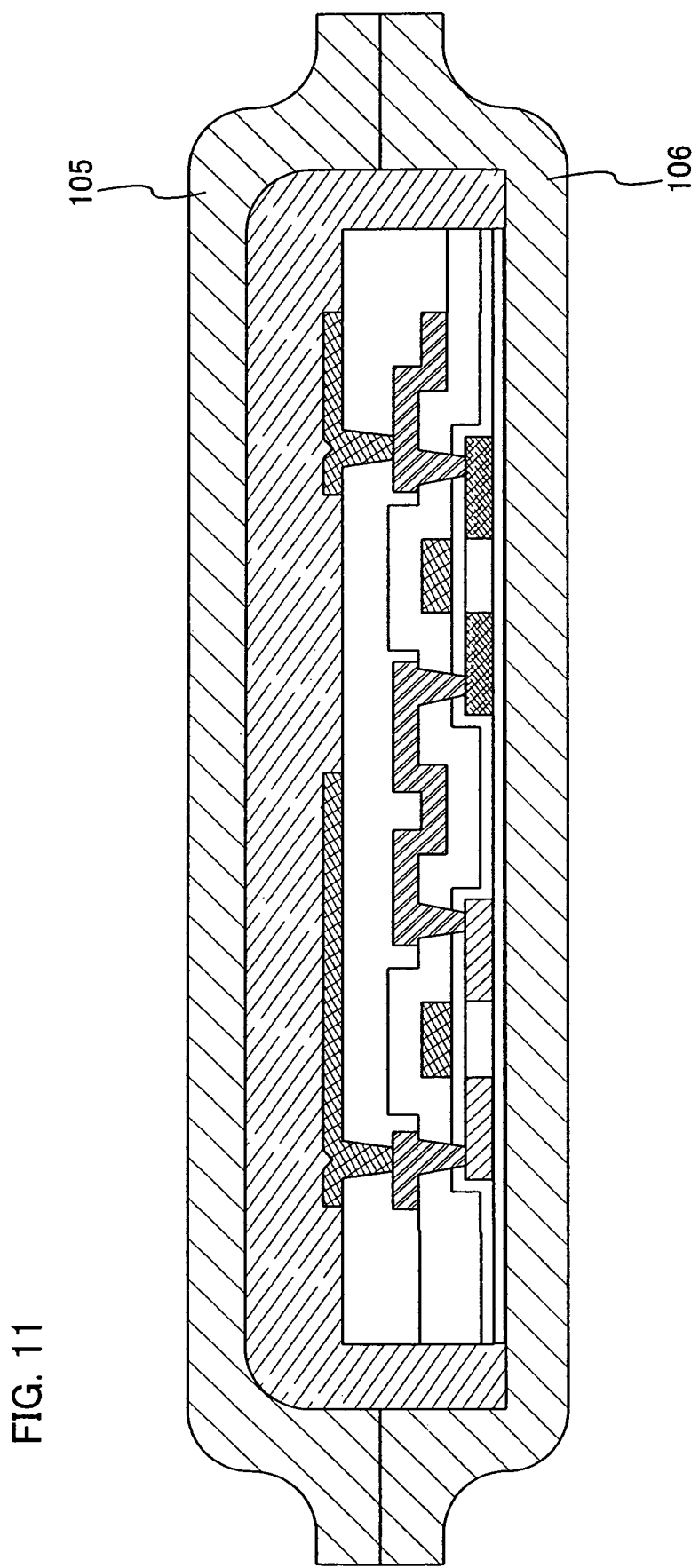
FIG. 11 is a figure illustrating a manufacturing step of an ID chip.

Subsequently, the opposite surface of the thin film integrated circuit 101 is stuck to a second base 106 so that the thin film integrated circuit 101 is sealed with the first base 105 and the second base 106 (FIG. 11). Thus, an IC tag is completed in which the thin film integrated circuit 101 is sealed by the first base 105 and the second base 106.

The first base 105 and the second base 106 each corresponds to a layered film (formed of polypropylene, polyester, vinyl, polyvinyl fluoride, polyvinyl chloride, or the like); paper formed of a fibrous material; a layered film of a base film (e.g., polyester, polyamide, an inorganic vapor-deposited film, or paper) and an adhesive synthetic resin film (e.g., acrylic synthetic resin or epoxy synthetic resin); or the like. The layered film is stacked and attached on an object by thermal bonding. When stacking and attaching a layered film over an object, an adhesive layer provided on the outmost surface of the layered film or a layer (which is not an adhesive layer) provided on the outmost layer is melted by heat treatment, and pressure is applied thereto for attachment.

Each surface of the first base 105 and the second base 106 may be provided with an adhesive layer or no adhesive layer. The adhesive layer corresponds to a layer containing an adhesive agent such as a thermosetting rein, an ultraviolet-curable resin, an epoxy resin adhesive or a resin additive.

Next, application examples of a semiconductor device which can transmit and receive data without contact will be described with reference to drawings. The semiconductor device which can transmit and receive data without contact is generally referred to as an RFID (Radio Frequency Identification) tag, an ID tag, an IC tag, an IC chip, an RF (Radio Frequency) tag, a wireless tag, an electronic tag, or a wireless chip in accordance with an usage mode.

Figure 12A:
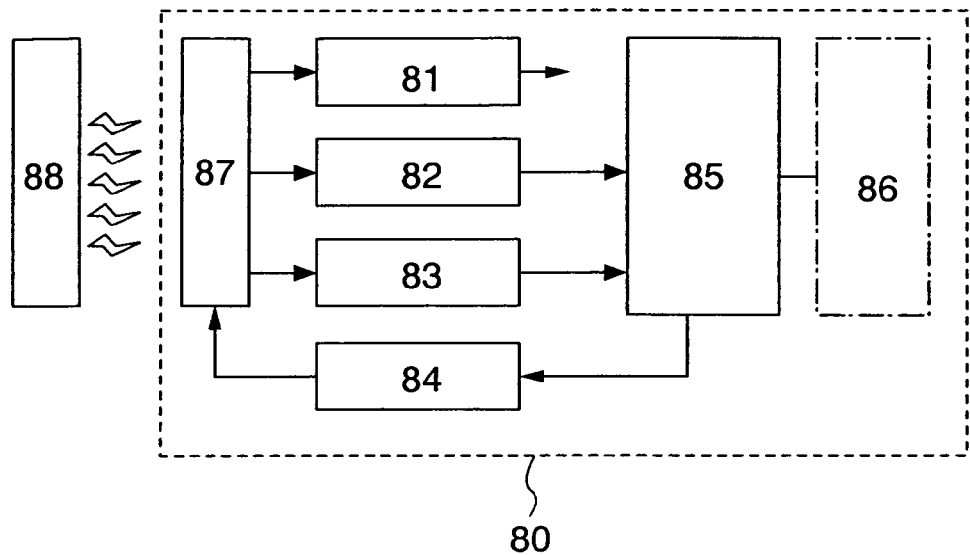
FIGS. 12A to 12C are figures showing application examples of ID chips.

An RFID 80 has a function of transmitting and receiving data without contact, and includes a power supply circuit 81, a clock generation circuit 82, a data demodulation circuit 83, a data modulation circuit 84, a control circuit 85 for controlling other circuits, a memory circuit 86, and an antenna 87 (FIG. 12A). Further, the RFID may include a plurality of memory circuits rather than one memory circuit. An SRAM, a flash memory, a ROM, or a FeRAM, or a circuit, which uses an organic compound layer described in the above described embodiment modes in a memory element portion, and the like can be used.

Signals sent from a reader/writer 88 as radio waves are modulated into alternating-current electric signals in the antenna 87 by electromagnetic induction. Power supply voltage is generated in the power supply circuit 81 by using the alternating-current electric signals, and supplied to each circuit using a power supply line. The clock generation circuit 82 generates various kinds of clock signals based on the alternating-current electric signals, which are inputted from the antenna 87, and supplies the various kinds of clock signals to the control signal 85. The modulation circuit 83 demodulates the alternating-current electric signals and supplies the demodulated alternating-current electric signals to the control circuit 85. In the control circuit 85, various kinds of arithmetic processings are performed in accordance with the inputted signals. Programs, data and the like that are used in the control circuit 85 are stored in the memory circuit 86. In addition, the memory circuit 86 can also be used as a work area in the arithmetic processings. Then, data is transmitted to the modulation circuit 84 from the control circuit 85, and load modulation can be provided to the antenna 87 from the modulation circuit 84 in accordance with the data. Consequently, the reader/writer 88 receives load modulation applied to the antenna 87 via radio waves so that the reader/writer can read the data.

In addition, the RFID may be of a type in that power supply voltage is supplied to each circuit via radio waves without using a power source (a buttery), or another type in that power supply voltage is supplied to each circuit by utilizing both radio waves and a power source (a buttery).

A foldable RFID can be manufactured using such a structure described in the above embodiment modes, and thus, such an RFID tag can be attached to an object having a curbed surface.

Figure 12B:
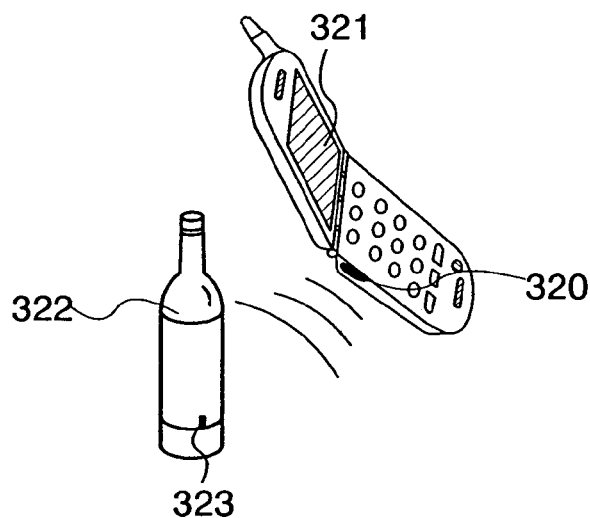
Figure 12C:
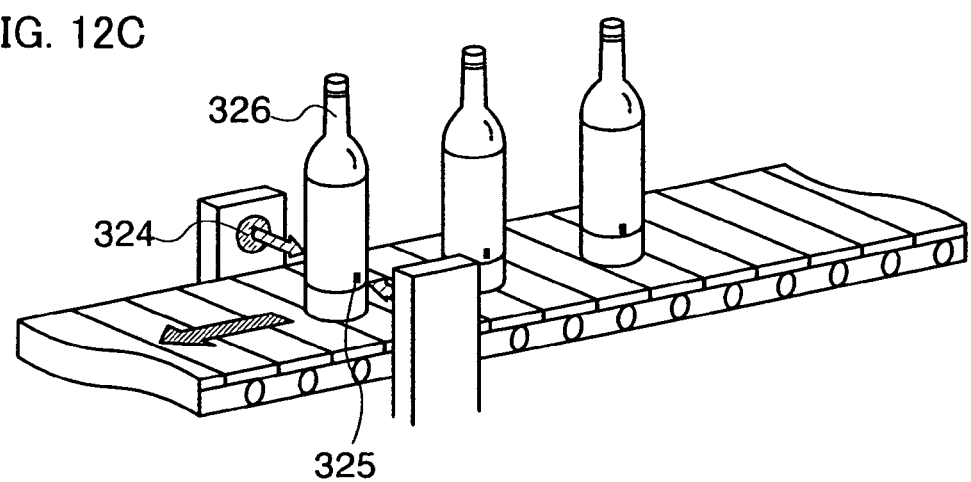
Figure 13A:
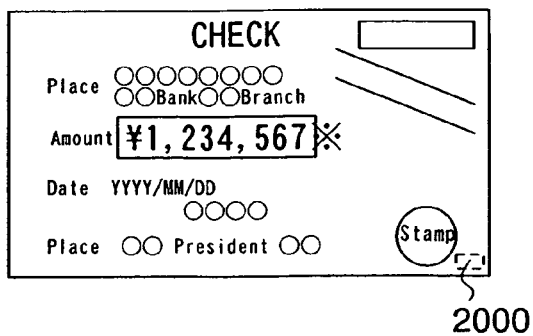
FIGS. 13A to 13H are figures showing application examples of ID chips.
Figure 13B:
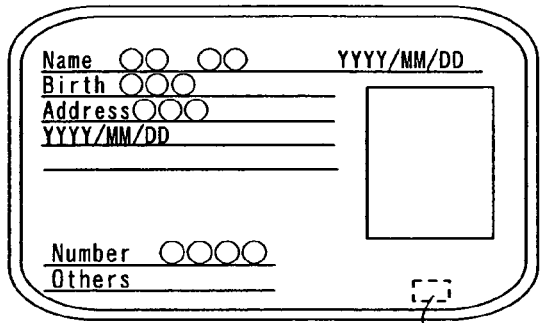
Figure 13C:
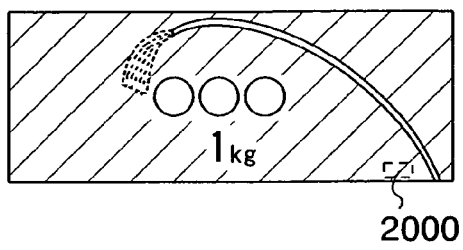
Figure 13D:
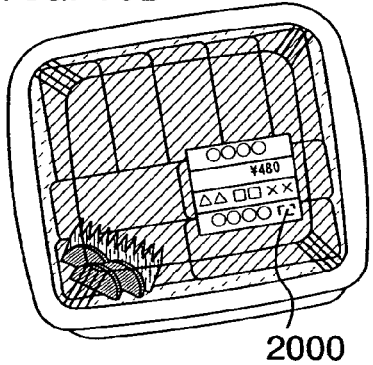
Figure 13E:
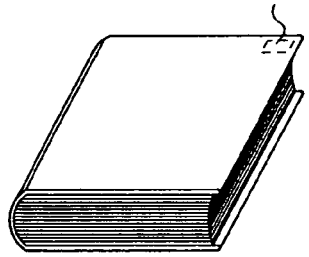
Figure 13F:
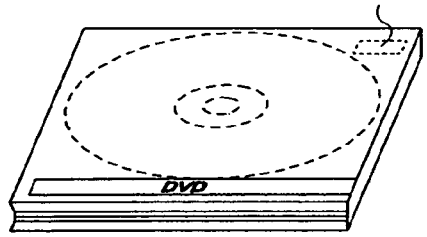
Figure 13G:
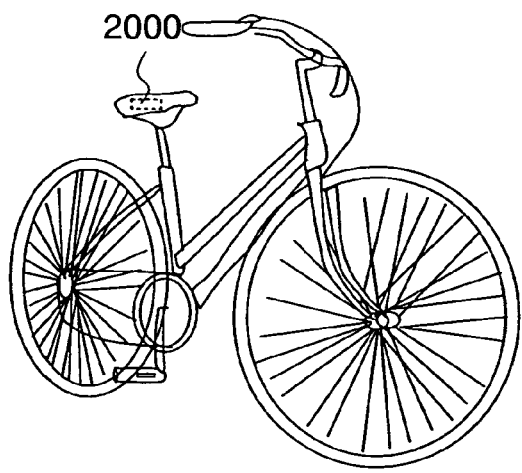
Figure 13H:
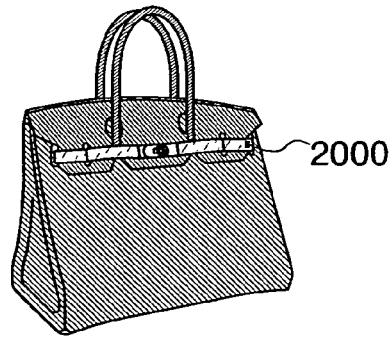

Next, an example of usage mode of a flexible RFID will be described. A reader/writer 320 is provided on a side surface of a portable terminal which includes a display area 321. An RFID 323 is provided on a side surface of a product 322 (FIG. 12B). When the reader/writer 320 is held to the RFID 323 included in the product 322, information about the product such as a raw material, a place of origin, test results in each production process, history of distribution process, and a description of a commodity, is displayed on the display area 321. In addition, when a commodity 326 is conveyed by a belt conveyor, the inspection of the commodity 326 can be carried out using a reader/writer 324 and an RFID 325 provided on the commodity 326 (FIG. 12C). In this way, by utilizing an RFID for a system, information can be easily obtained, thereby realizing high performance and high added value. As described in the above embodiment modes, even when an RFID is attached to an article having a curved surface, a thin film transistor or the like included in the RFID can be prevented from being damaged, so that a highly reliable RFID can be provided.

Other than those described above, the application range of a flexible RFID tag is so wide that it may be applied to any product in order that the history object is revealed without contact and utilized in production, management and the like. For example, such an RFID tag may be incorporated in bills, coins, securities, certificates, bearer bonds, containers for packages, books, recording media, personal belongings, vehicles, foods, clothes, healthcare items, livingware, medicals, and electronic devices. Examples of these products are described with reference to FIGS. 13A to 13H.

The bills and coins include currency in the market and include a note that is current as money in a specific area (cash voucher), memorial coins, and the like. The securities include a check, a certificate, a promissory note, and the like (see FIG. 13A). The certificates include a driver's license, a resident card, and the like (see FIG. 13B). The bearer bonds include a stamp, a rice coupon, various gift coupons, and the like (see FIG. 13C). The containers for packages include paper for packing a box lunch or the like, a plastic bottle, and the like (see FIG. 13D). The books include a document and the like (see FIG. 13E). The recording media include DVD software, a video tape, and the like (see FIG. 13F). The vehicles include a wheeled vehicle such as a bicycle, a vessel, and the like (see FIG. 13G). The personal belongings include a bag, glasses, and the like (see FIG. 13H). The foods include food items, beverages, and the like. The clothes include clothing, footwear, and the like. The healthcare items include a medical device, a health appliance, and the like. The livingware includes furniture, a lighting apparatus, and the like. The medicals include a medicine, an agricultural chemical, and the like. The electronic devices include a liquid crystal display device, an EL display device, a television set (television receiver, thin television receiver), a cellular phone, and the like.

When an RFID tag 2000 is incorporated in bills, coins, securities, certificates, bearer bonds, and the like, forgery of them can be prevented. When an RFID tag is incorporated in containers for packages, books, recording media, personal belongings, foods, livingware, electronic devices and the like can be performed more efficiently. When an RFID tag is incorporated in vehicles, healthcare items, medicals, and the like, forgery and theft of them can be prevented and medicines can be prevented from being consumed in the wrong manner. An RFID tag may be attached to the surface of a product or incorporated into a product. For example, an RFID tag may be incorporated into paper of a book, or an organic resin of a package. By using a flexible RFID tag having such a structure described in the above embodiment modes, damage or the like to an element included in the RFID tag can be prevented even when the RFID tag is mounted on paper or the like.

Thus, when an RFID tag is incorporated in containers for packages, recording media, personal belongings, foods, clothes, livingware, electronic apparatuses, and the like, efficiency of inspection system, rental system, and the like can be increased. An RFID tag also prevents vehicles from being forged or stolen. In addition, when an RFID tag is implanted into creatures such as animals, each creature can be identified easily. For example, when an RFID tag is implanted into creatures such as domestic animals, not only the year of birth, sex, breed and the like but also the health condition such as the current body temperature can be easily managed.

Note that, this embodiment mode can be freely combined with any of the above embodiment modes. In other words, the present invention includes any combination of the configuration shown in the above embodiment modes and the configuration shown in this embodiment mode.

EMBODIMENT MODE 4

This embodiment will describe an example of manufacturing a liquid crystal display device (LCD) using the invention.

The manufacturing method of a display device described here is a method of simultaneously manufacturing a pixel area including a pixel TFT and a TFT of a driver circuit area which is provided around the pixel area. Note that a CMOS circuit as a base unit is shown as a driver circuit to simplify the description.

First, steps for forming a TFT shown in FIG. 14 are carried out in accordance with the above embodiment mode. Note that parts that are the same as those in the above embodiment mode are denoted by the same reference numerals. Note that in this embodiment mode, the pixel TFT 552 is a multi-gate TFT.

After forming the interlayer insulating film 17 shown in FIG. 2D, a planarization film which is to be a second interlayer insulating film 19 is formed. As the planarization film, the one mentioned in the above embodiment mode can be used.

Next, contact holes are formed in the second interlayer insulating film 19 and the interlayer insulating film 17 using resist masks.

A resist mask is formed over the second interlayer insulating film 19, and the second interlayer insulating film 19 and the interlayer insulating film 17 are etched using the resist mask, so that a contact hole disposed on a source region and a contact hole disposed on a drain region are formed.

After removing the resist mask and forming a conductive film, etching is carried out using yet another resist mask, thereby wires 540 to 544 (a source wire or a drain wire or the like of the TFT). As the conductive film, a layered film of TiN, Al, and TiN or an Al alloy film or the like can be used.

Here, the electrode or the wire is preferably led so as to have a round corner when seen from a direction perpendicular to the substrate 1. By making the corners round, dust or the like can be prevented from remaining at the corners of the wire; thus, the number of defects generated due to dust can be reduced and yield can be improved.

A mask manufactured by exposure and development using a photosensitive resist as a photomask is used for patterning. Transmittance of light for exposure is suppressed in an arbitrary portion of the photomask, thereby the thickness of the mask after development can be controlled. By controlling the thickness of the mask, fine and accurate patterning can be performed.

Next, a third interlayer insulating film 610 is formed over the second interlayer insulating film 19 and the wires 540 to 544. Note that the third interlayer insulating film 610 can be formed using the same material to the second interlayer insulating film 19.

Next, a resist mask is formed using a photomask, and the third interlayer insulating film 610 is partially removed by dry etching so as to form an opening (contact hole). In forming this contact hole, carbon tetrafluoride ($CF_4$), oxygen ($O_2$) and helium (He) are used as the etching gas. Note that the bottom of the contact hole reaches the electrode or wire 544.

Then, after removing the resist mask, a second conductive film is formed over the entire surface. Then, the second conductive film is patterned using a photomask, thereby forming a pixel electrode 623, which is electrically connected to the wire 544 (FIG. 14). When a reflective liquid crystal display panel is manufactured, the pixel electrode 623 may be formed by sputtering using a light-reflective metal material such as Ag (silver), Au (gold), Cu (copper), W (tungsten) or Al (aluminum).

In the case of manufacturing a transmissive liquid crystal display panel, the pixel electrode 623 is formed using a light-transmitting conductive film such as indium tin oxide (ITO), ITO containing silicon oxide, zinc oxide (ZnO) or tin oxide ($SnO_2$).

Figure 16:
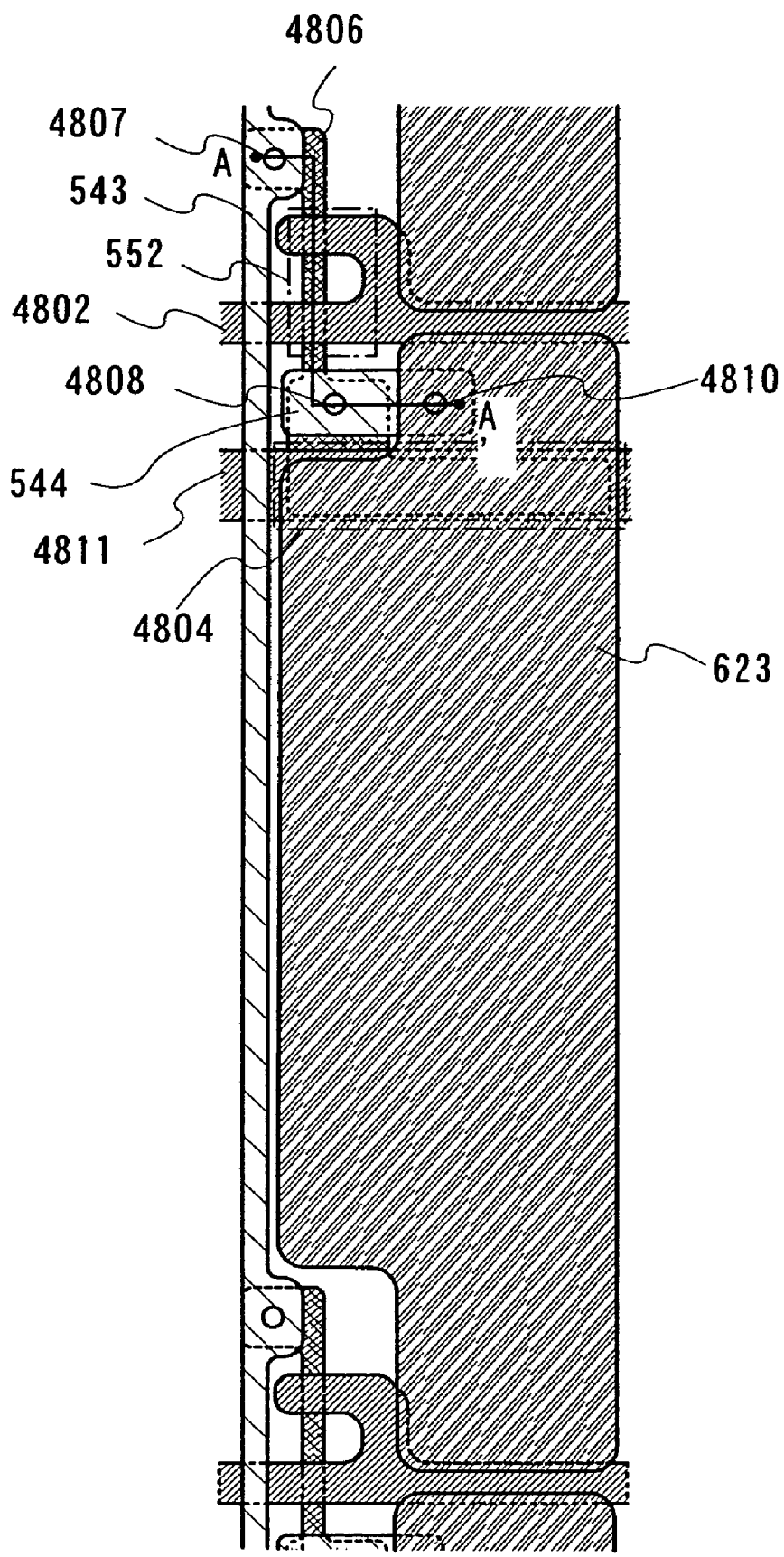
FIG. 16 is a top view of a pixel area of a liquid crystal display device.

FIG. 16 is a magnified top view of a part of the pixel area including a pixel TFT. A cross-sectional view taken along a solid line A-A' of FIG. 16 corresponds to a cross section of the pixel area in FIG. 14, and portions corresponding to those in FIG. 14 are denoted by the same reference numerals.

A pixel is provided at an intersection of a source signal line 543 and a gate signal line 4802, and is provided with a transistor 552, a capacitor element 4804, and a liquid crystal element. Note that only one of a pair of electrodes for driving liquid crystal of a liquid crystal element (pixel electrode 623) is shown in the figure.

The transistor 552 includes a semiconductor layer 4806, a first insulating layer, and a part of the gate signal line 4802 which overlaps with the semiconductor layer 4806 with the first insulating layer therebetween. The semiconductor layer 4806 is to be an active layer of the transistor 552. The first insulating layer serves as a gate insulating layer of the transistor. One of either the source or the drain of the transistor 552 is connected to a source signal line 543 through a contact hole 4807, and the other is connected to the connection wire 544 through a contact hole 4808. The connection wire 544 is connected to the pixel electrode 623 through a contact hole 4810. The connection wire 544 can be formed simultaneously with the source signal line 543 by patterning a conductive layer, which is also used for forming the source signal line 543.

The capacitor element 4804 is a capacitor element having a structure using the semiconductor layer 4806 and a capacitor wire 4811 which overlaps with the semiconductor layer 4806 with the first insulating layer therebetween as a pair of electrodes, and the first insulating layer as a dielectric layer (referred to as a first capacitor element). Note that alternatively, the capacitor element 4804 may have a structure using the capacitor wire 4811 and the pixel electrode 623 which overlaps with the capacitor wire 4811 with a second insulating layer therebetween as a pair of electrodes, and the second insulating layer as a dielectric layer (referred to as a second capacitor element). Since the second capacitor element is connected in parallel with the first capacitor element, capacitance of the capacitor element 4804 can be increased by providing the second capacitor element. Further, the capacitor wire 4811 can be formed simultaneously with the gate signal line 4802 by patterning a conductive layer, which is also used for forming the gate signal line 4802.

A pattern used for patterning the semiconductor layer 4806, the gate signal line 4802, the capacitor wire 4811, the source signal line 543, the connection wire 544, and the pixel electrode 623 has a shape chamfered by a side length of 10 μm or shorter in the corner. A resist mask is formed using the pattern of a photomask having that shape, and the semiconductor layer 4806 is patterned using the resist mask; thereby forming a shape in which a corner of a pattern of the semiconductor layer 4806 is chamfered. Note that the corners of the pattern of the semiconductor layer 4806 may be further rounded. In other words, by setting an exposure condition and an etching condition appropriately, a pattern shape of the semiconductor layer 4806 may be smoothed more than the photomask pattern.

When a corner of a bent portion or a portion where line width changes is smoothed and rounded in a wire and an electrode, there are effects described below. When dry etching using plasma is performed, generation of fine particles due to abnormal discharge can be suppressed by chamfering a projecting portion. Even though the fine particles are generated, the fine particles can be prevented from accumulating at the corner at the time of cleaning, and the fine particles can be washed away by chamfering a convex portion. Thus, a problem of fine particles or dust in the manufacturing process can be solved and the yield can be improved.

Through the aforementioned steps, a TFT substrate of a liquid crystal display device is completed, where the top-gate pixel TFT 552, the CMOS circuit 553 having the top-gate TFTs 550 and 551, and the pixel electrode 623 are formed over the substrate. Although a top-gate TFT is formed in this embodiment, a bottom-gate TFT may be used as appropriate.

Then, an alignment film 624*a* is formed covering the pixel electrode 623. The alignment film 624*a* may be formed by a droplet discharge method, screen printing or an offset printing. After that, the surface of the alignment film 624*a* is rubbed.

Figure 17A:
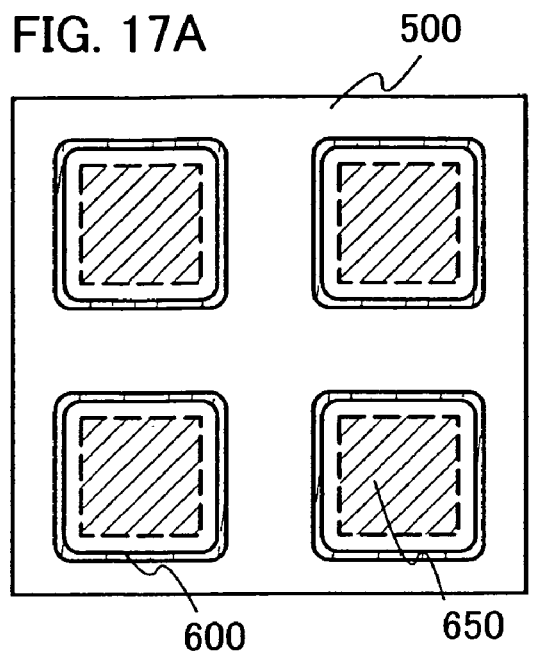
FIGS. 17A to 17D are figures illustrating manufacturing steps of a liquid crystal display device.

A color filter including a color layer 626*a*, a light-shielding layer (black matrix) 626*b* and an overcoat layer 627 is provided over a counter substrate 625, and a light-transmitting or reflective counter electrode 628 and an alignment film 624*b* are formed thereover. Then, a sealant 600 having a closed pattern is formed by a droplet discharge method so as to surround a region overlapping the pixel area 650 including a pixel TFT (FIG. 17A). Since liquid crystal is dropped here, an example of applying the sealant 600 so as to form a closed pattern is shown. Alternatively, a dip method (pumping method) may be used, in which liquid crystal is introduced into the space between the substrates by utilizing capillary action after attaching the substrate 500 to the counter substrate 625.

Figure 17B:
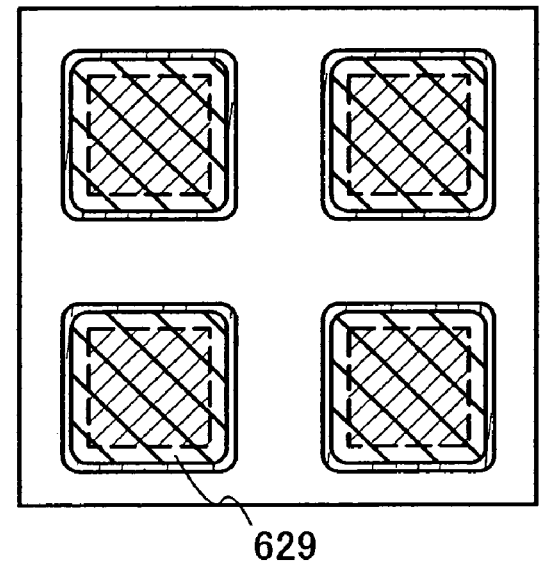
Figure 17C:
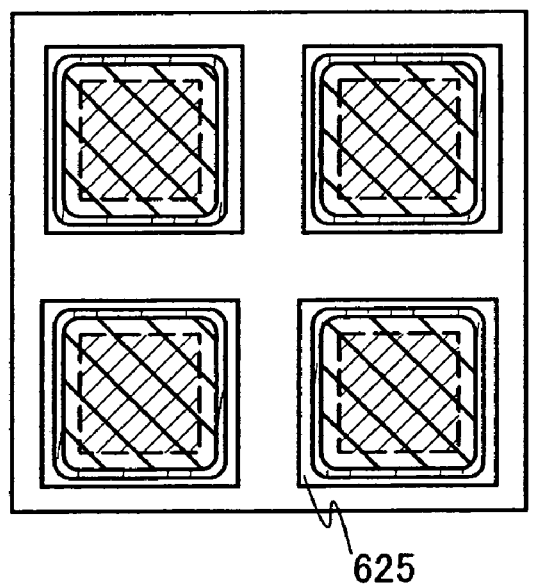

Then, a liquid crystal composition 629 is dropped under reduced pressure so that bubbles are not mixed therein (FIG. 17B), thereby attaching the substrates 500 and 625 to each other (FIG. 17C). The liquid crystal composition 629 is dropped once or a plurality of times into the seal pattern having a closed loop. As an alignment mode of the liquid crystal composition 629, a TN mode is used in which the alignment of liquid crystal molecules is twist at 90° from where light enters to where light is emitted. The substrates are attached to each other in such a manner that the rubbing directions thereof are perpendicular to each other.

The distance between the pair of the substrates may be kept even by dispersing spherical spacers or forming a columnar spacer formed of a resin, or by mixing fillers in the sealant 600. The aforementioned columnar spacer is formed of an organic resin material containing at least one of acrylic, polyimide, polyimide amide, or epoxy as a main component, or an inorganic material having one of silicon oxide, silicon nitride and silicon oxide containing nitrogen, or a layered film thereof.

Figure 15:
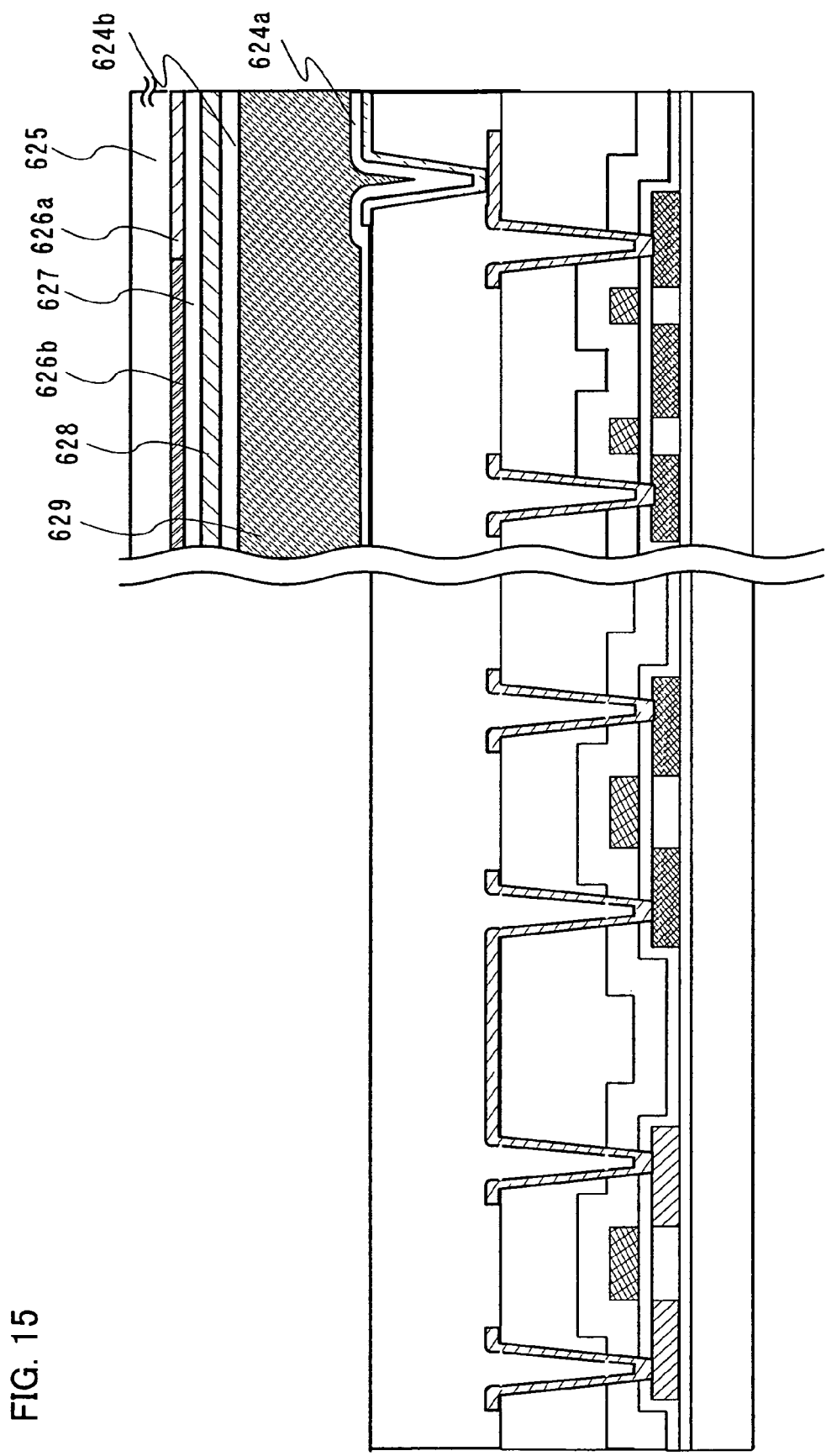
FIG. 15 is a figure showing a manufacturing step of a liquid crystal display device.
Figure 17D:
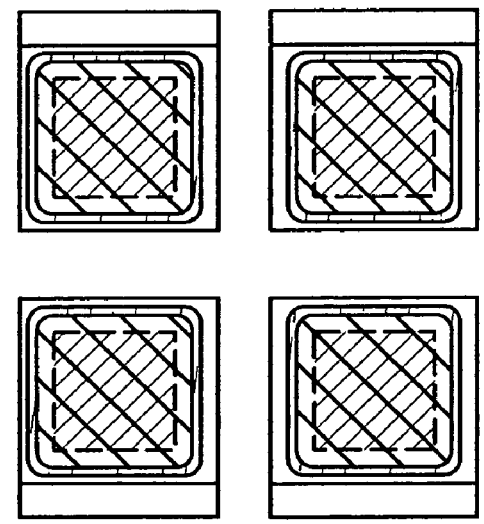

Then, the substrate is sectioned. In the case of obtaining a multiplicity of panels from one substrate, the substrate is sectioned into each panel. On the other hand, in the case of obtaining one panel from one substrate, a sectioning step may be omitted by attaching a counter substrate which is cut in advance to the substrate (FIG. 15 and FIG. 17D).

Then, an FPC (Flexible Printed Circuit) is attached to an anisotropic conductive layer using a known technique. Through the aforementioned steps, a liquid crystal display device is completed. In addition, an optical film is attached if necessary. In the case of manufacturing a transmissive liquid crystal display device, a polarizing plate is attached to each of the TFT substrate and the counter substrate.

Figure 18A:
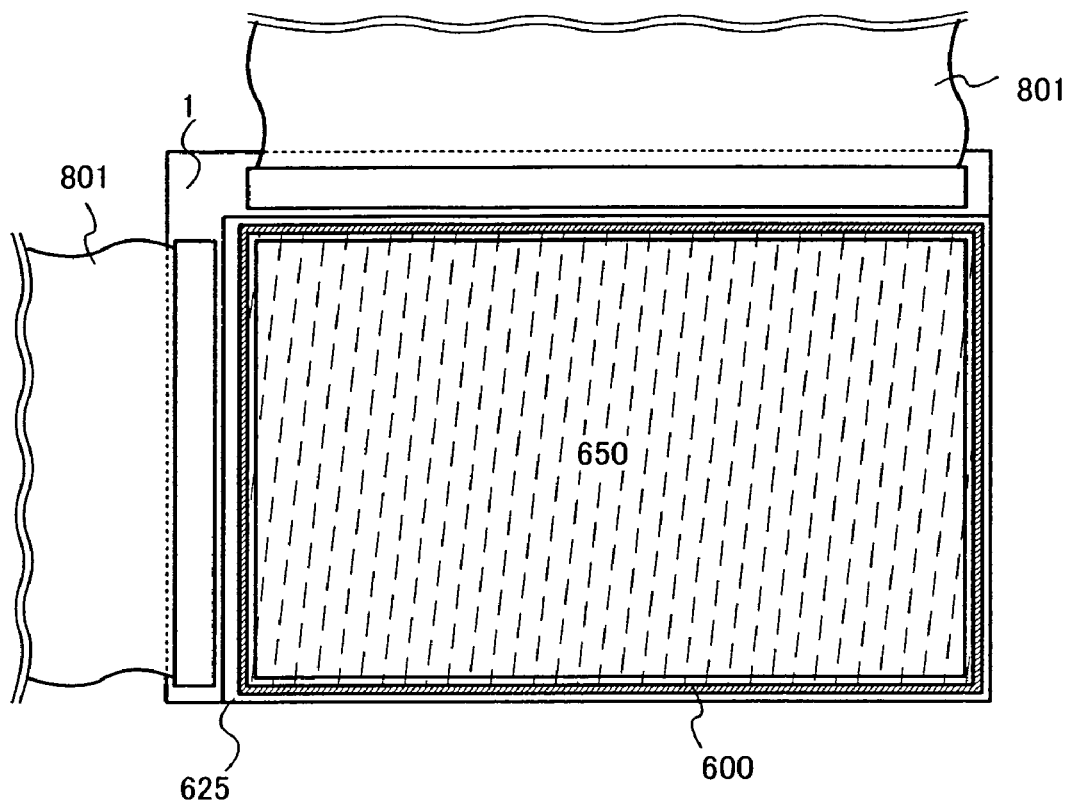
FIGS. 18A and 18B are figures illustrating manufacturing steps of a liquid crystal display device.
Figure 18B:
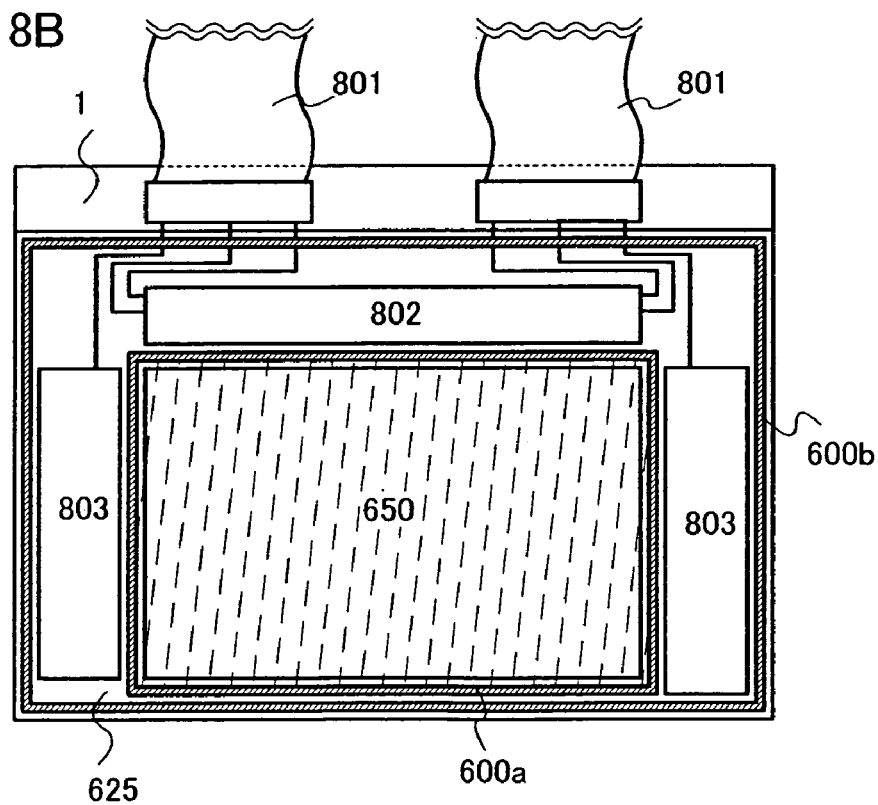

FIG. 18A shows a top view of a liquid crystal display device obtained through the aforementioned steps, and FIG. 18B shows an example of a top view of another liquid crystal display device.

In FIG. 18A, reference numeral 1 denotes a TFT substrate, 625 denotes a counter substrate, 650 denotes a pixel area, 600 denotes a sealant and 801 denotes an FPC. Here, a liquid crystal composition is discharged by a droplet discharge method, and the pair of the substrates 500 and 625 are attached to each other with the sealant 600 under the reduced pressure.

In FIG. 18B, reference numeral 1 denotes a TFT substrate, 625 denotes a counter substrate, 802 denotes a source signal line driver circuit, 803 denotes a gate signal line driver circuit, 650 denotes a pixel area, 600a denotes a first sealant, 600b denotes a second sealant, and 801 denotes an FPC. Here, a liquid crystal composition is discharged by a droplet discharge method, and the pair of the substrates 500 and 625 are attached to each other with the first sealant 600a and the second sealant 600b. Since liquid crystal is not required in the driver circuit areas 802 and 803, liquid crystal is held only in the pixel area 650, and the second sealant 600b is provided for reinforcement of the whole panel.

As described above, in this embodiment, a liquid crystal display device can be manufactured using a TFT using the invention. Accordingly, the manufacturing time and cost can be reduced. The liquid crystal display device manufactured in this embodiment can be used as display portions of various electronic devices.

Note that although a top-gate TFT is used as the TFT in this embodiment, the invention is not limited to this structure, and a bottom-gate (inverted staggered) TFT or a staggered TFT may be used as appropriate. Further, the invention is not limited to a multi-gate TFT, and a single-gate TFT may be used.

This embodiment can be freely combined with any of the aforementioned embodiment modes as required.

EMBODIMENT MODE 5

This embodiment mode will describe an example of manufacturing a light emitting device according to the present invention.

First, steps for forming a TFT shown in FIG. 19 are finished in accordance with the above embodiment mode. Note that parts that are the same as those in the above embodiment mode are denoted by the same reference numerals. Note that FIG. 19 shows only one of TFTs.

Figure 19A:
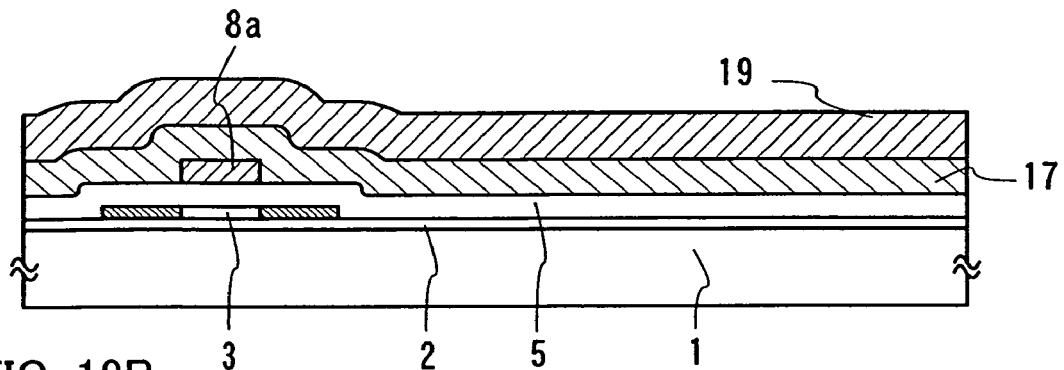
FIGS. 19A to 19D are figures illustrating manufacturing steps of an EL display device.

After forming an interlayer insulating film 17, a planarization film to be a second interlayer insulating film 19 is formed. As the planarization film, one described in the above embodiment mode can be use (FIG. 19A).

A contact hole is formed in the second interlayer insulating film 19 and the interlayer insulating film 17 using a resist mask.

Figure 19B:
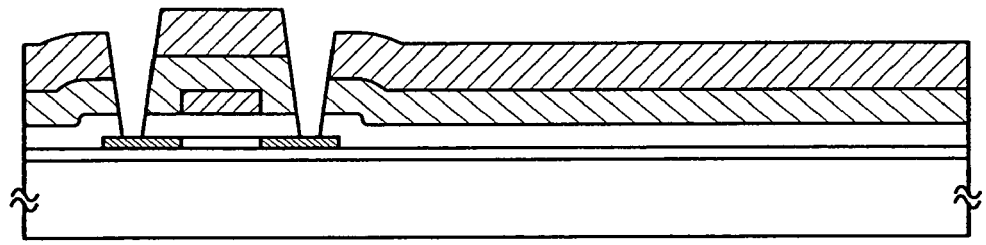
Figure 19C:
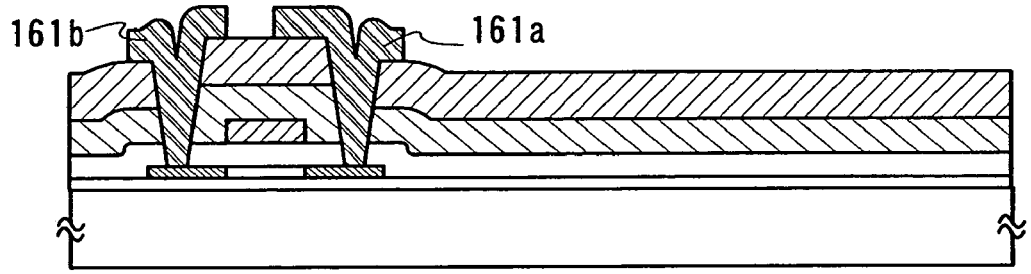

Next, the contact hole that reach a semiconductor layer are formed. The contact holes can be formed by etching using a resist mask until the semiconductor layer is exposed. Either wet etching or dry etching can be carried out. The etching may be conducted once or a plurality of times depending on the condition. When the etching is conducted a plurality of times, both wet etching and dry etching may be conducted (FIG. 19B).

Figure 19D:
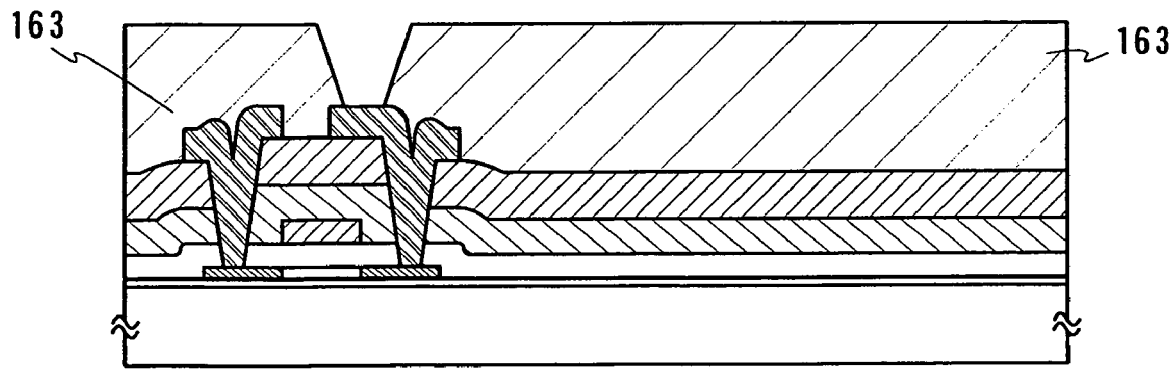

Then, a conductive layer is formed so as to cover the contact holes and the first interlayer insulating layer 17. A connection portion 61a, a wire 61b, and the like are formed by processing the conductive layer into a desired shape. This wire may be a single layer of aluminum; copper; an alloy of aluminum, carbon, and nickel; an alloy of aluminum, carbon, and molybdenum; or the like. Alternatively, the wire may be formed in a layered structure of molybdenum, aluminum, molybdenum in the order from the substrate. Alternatively, a structure of titanium, aluminum, titanium or titanium, titanium nitride, aluminum, titanium can also be used (FIG. 19D).

A third interlayer insulating layer 163 is formed to cover the connection portion 161a, the wire 161b, and the second interlayer insulating layer 19. As the material of the third interlayer insulating layer 163, a self-planarizing coating formed of acrylic, polyimide, siloxane, or the like is preferably used. In this embodiment mode, the third interlayer insulating layer 163 is formed of siloxane (FIG. 19D).

Next, an insulating layer may be formed of silicon nitride over the third interlayer insulating layer 163. This is formed to prevent the third interlayer insulating layer 163 from being etched more than necessary in a later step of etching a pixel electrode. Therefore, the insulating layer is not necessary when the difference is large between the etching rates of the pixel electrode and the second interlayer insulating layer.

Next, a contact hole penetrating the third interlayer insulating layer 163 to reach the connection portion 61a is formed.

After a light-transmitting conductive layer is formed so as to cover the contact hole and the third interlayer insulating layer 163 (or the insulating layer), the light-transmitting conductive layer is processed to form the first electrode 164 of the thin film light emitting element. Here, the first electrode 164 electrically contacts the connection portion 161a.

The first electrode 164 can be formed from a material of a conductive metal such as aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), lithium (Li), cesium (Cs), magnesium (Mg), calcium (Ca), strontium (Sr), or titanium (Ti); an alloy thereof such as aluminum-Si (Al—Si), aluminum-titanium (Al—Ti), or aluminum-silicon-copper (Al—Si—Cu); a nitride of a metal material such as titanium nitride (TiN), a metal compound such as indium tin oxide (indium tin oxide), ITO containing silicon, IZO (indium zinc oxide) in which 2% to 20% of zinc oxide (ZnO) is mixed in indium oxide, or the like.

Figure 20A:
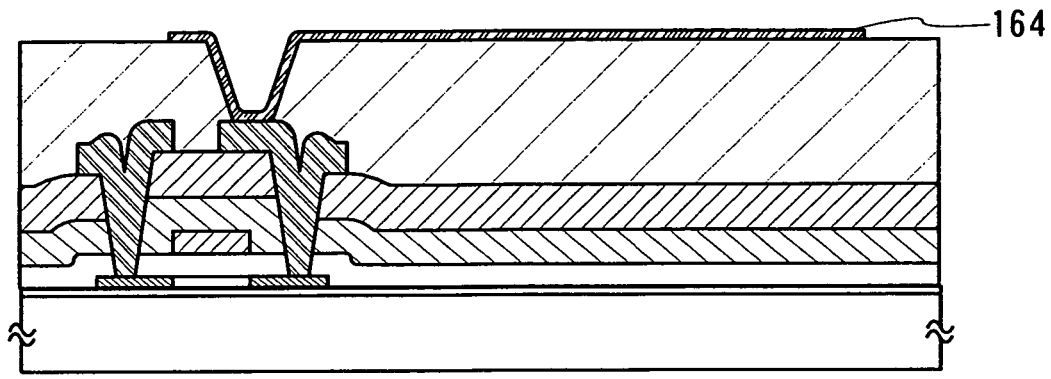
FIGS. 20A to 20C are figures illustrating manufacturing steps of an EL display device.

An electrode through which light is emitted may preferably be formed using a light-transmitting conductive film. For example, a metal compound such as ITO (indium tin oxide), ITO containing silicon (ITSO), or IZO (indium zinc oxide) in which zinc oxide (ZnO) is mixed in indium oxide can be used. Alternatively, an extremely thin film of metal such as Al or Ag is used. When light is emitted through a second electrode, a highly-reflective material (e.g., Al, Ag or the like) can be used for the first electrode 164. In this embodiment mode, ITSO is used for the first electrode 164 (FIG. 20A).

Figure 20B:
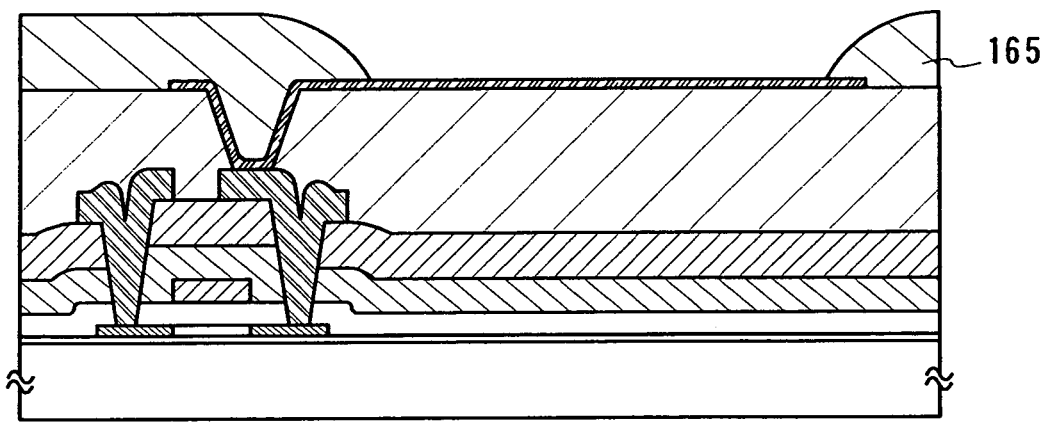

Next, an insulating layer formed of an organic material or an inorganic material is formed so as to cover the third interlayer insulating layer 163 (or the insulating layer) and the first electrode 164. Subsequently, the insulating layer is processed so as to partially expose the first electrode 164, thereby forming a partition wall 165. As the material of the partition wall 165, a photosensitive organic material (such as acrylic or polyimide) is preferable. Alternatively, a non-photosensitive organic or inorganic material may also be used. Further, the partition wall 165 may be used as a black matrix by making the partition wall 165 black in such a way that a black pigment or dye such as titanium black or carbon nitride is diffused into the material of the partition wall 165 using a dispersant or the like. It is desirable that the partition wall 165 has a tapered shape where its end surface toward the first electrode has curvature changing continuously (FIG. 20B).

Figure 20C:
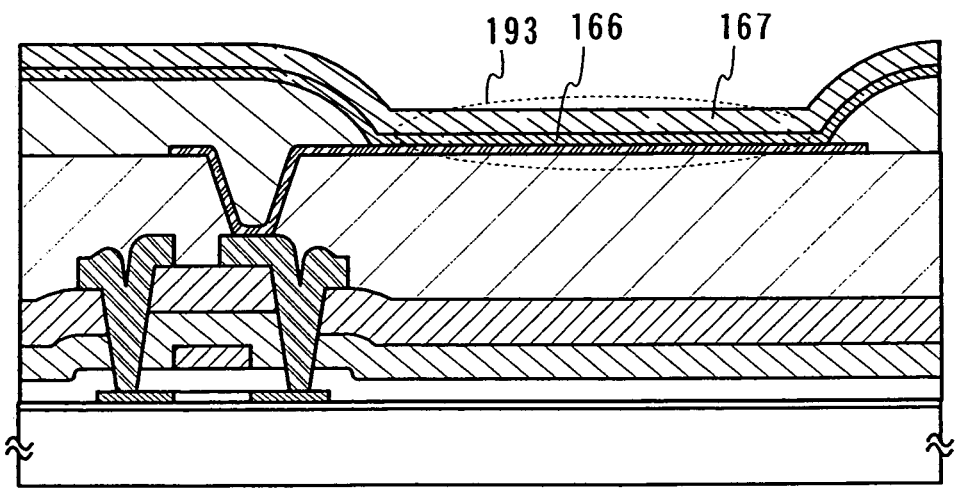

Next, a layer containing a light emitting material 166 is formed, and a second electrode 167 covering the layer containing a light emitting substance 166 is formed subsequently. Thus, a light emitting element 193 in which the layer 166 containing a light emitting substance is sandwiched between the first electrode 164 and the second electrode 167, and light emission can be obtained by applying a higher voltage to the first electrode than the second electrode (FIG. 20C). For an electrode material used for forming the second electrode 167, the same material as the material of the first electrode can be used. Aluminum is used for the second electrode in this embodiment mode.

Further, the layer containing a light emitting substance 166 is formed by vapor deposition, an ink-jet method, spin coating, dip coating, or the like. The layer 66 containing a light emitting material may be a laminate of layers having various functions such as a hole transport, hole injection, electron transport, electron injection, light emission, or may be a single layer of a light emitting layer.

In the case of an inorganic electroluminescent display device, fluorescent material particles dispersed in a dispersant can be used for a layer containing a light-emitting material 166.

The fluorescent material in which a donor impurity such as Cl (chlorine), I (iodine), or Al together with is Cu (copper) are added to ZnS can be used.

As the dispersant, a polymer having a relatively high dielectric constant such as a cyanoethyl cellulose-based resin, or a resin such as a resin based on polyethylene, polypropylene, or polystyrene; a silicone resin; an epoxy resin; or a vinylidene fluoride resin can be used. Fine particles of $BaTiO_3$ (barium titanate) or $SrTiO_3$ (titanate strontium) which has high dielectric constant are mixed appropriately in the resin to control the dielectric constant. As a dispersing means, an ultrasonic disperser or the like can be used.

A dielectric layer may be provided between the layer containing a light-emitting material 166 and one of the electrodes. For the dielectric layer, any material can be used as long as it is a highly dielectric and highly insulating material which also has high dielectric breakdown voltage. For example, one selected from metal oxides or nitrides, for example, $TiO_2$, $BaTiO_3$, $SrTiO_3$, $PbTiO_3$, $KNbO_3$, $PbNbO_3$, $Ta_2O_3$, $BaTa_2O_6$, $LiTaO_3$, $Y_2O_3$, $Al_2O_3$, $ZrO_2$, AlON, or ZnS is used.

In the case of an inorganic electroluminescent display device, the light-emitting layer may be sandwiched between insulating layers to have a double insulation structure. The light-emitting layer can use a II-VI compound such as ZnS (zinc sulfide) which contains Mn (manganese) or a rare earth element, and the insulating layer can use oxides or nitrides such as $Si_3N_4$, $SiO_2$, $Al_2O_3$, or $TiO_2$.

Further, a single layer or a stack of an organic compound may be used for a layer containing a light-emitting material. In addition, an inorganic compound may be added to a part of a layer containing an organic compound to form a layer which is in contact with the first or second electrode.

After that, a silicon oxide film containing nitrogen is formed as a passivation film by plasma CVD. In the case of using the silicon oxide film containing nitrogen, a silicon oxynitride film manufactured using $SiH_4$, $N_2O$, and $NH_3$ by plasma CVD, a silicon oxynitride film manufactured using $SiH_4$ and $N_2O$ by plasma CVD, or a silicon oxynitride film manufactured by plasma CVD using a gas in which $SiH_4$ and $N_2O$ are diluted with Ar may be preferably formed.

As the passivation film, a silicon oxynitride hydride film manufactured using $SiH_4$, $N_2O$, and $H_2$ is also applicable. Naturally, the structure of a first passivation film is not limited to a single-layer structure, and the passivation film may be formed in a single-layer structure or a layered structure including another insulating layer containing silicon. A multilayer film of a carbon nitride film and a silicon nitride film, a multilayer film including a styrene polymer, a silicon nitride film, or a diamond-like carbon film may be formed instead of a silicon oxide film containing nitrogen.

Subsequently, in order to protect the light emitting element from a deterioration-promoting material such as water, the display area is sealed. In the case of using a counter substrate for the sealing, the counter substrate and an element substrate are attached together with an insulating sealing material so as to expose an external connection portion. The space between the counter substrate and the element substrate may be filled with an inert gas such as dry nitrogen, or the whole surface of the pixel area may be coated with the sealing material for attaching the counter substrate. It is preferable to use an ultraviolet curable resin or the like for the sealing material. A drying agent or particles for keeping the gap between the substrates uniform may be mixed into the sealing material. Subsequently, a flexible wire substrate is pasted on the external connection portion, thereby completing a light emitting device.

An example of the structure of the thus manufactured light emitting device will be described with reference to FIGS. 21A and 21B. Although the shapes are different, parts having the same functions are denoted by the same reference numerals and the description thereof may be omitted. In this embodiment mode, the thin film transistor 170 connects to the light emitting element 193 via the connection portion 161*a*.

Figure 21A:
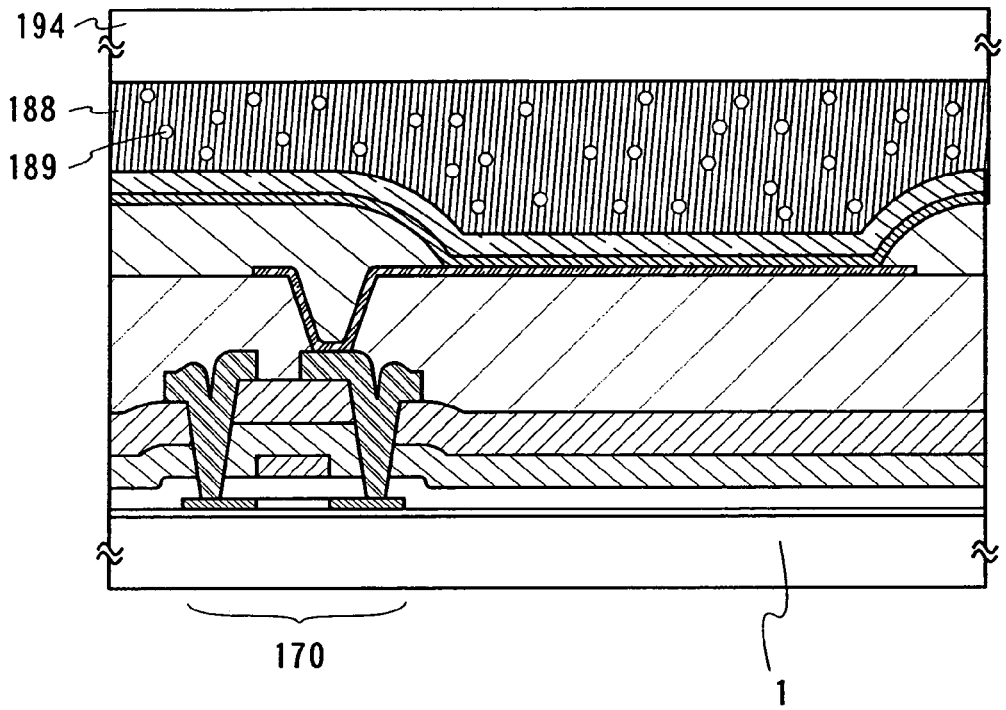
FIGS. 21A and 21B are figures illustrating manufacturing steps of an EL display device.

In FIG. 21A, the first electrode 164 is formed of a light-transmitting conductive film and has a structure in which light emitted from a light emitting layer containing the light emitting substance 166 is extracted from the substrate 1 side. Reference numeral 194 denotes a counter substrate, which is to be fixed to the substrate 1 with a sealing material or the like after forming the light emitting element 193. By filling the space between the counter substrate 194 and the element with a light-transmitting resin 188 or the like and sealing the space, it is possible to prevent the light emitting element 193 from deteriorating due to moisture. Further, the resin 188 desirably has hygroscopicity. In addition, it is more desirable that a desiccant 189 having high light-transmitting properties is diffused in the resin 188, so that the effect of moisture can be further suppressed.

Figure 21B:
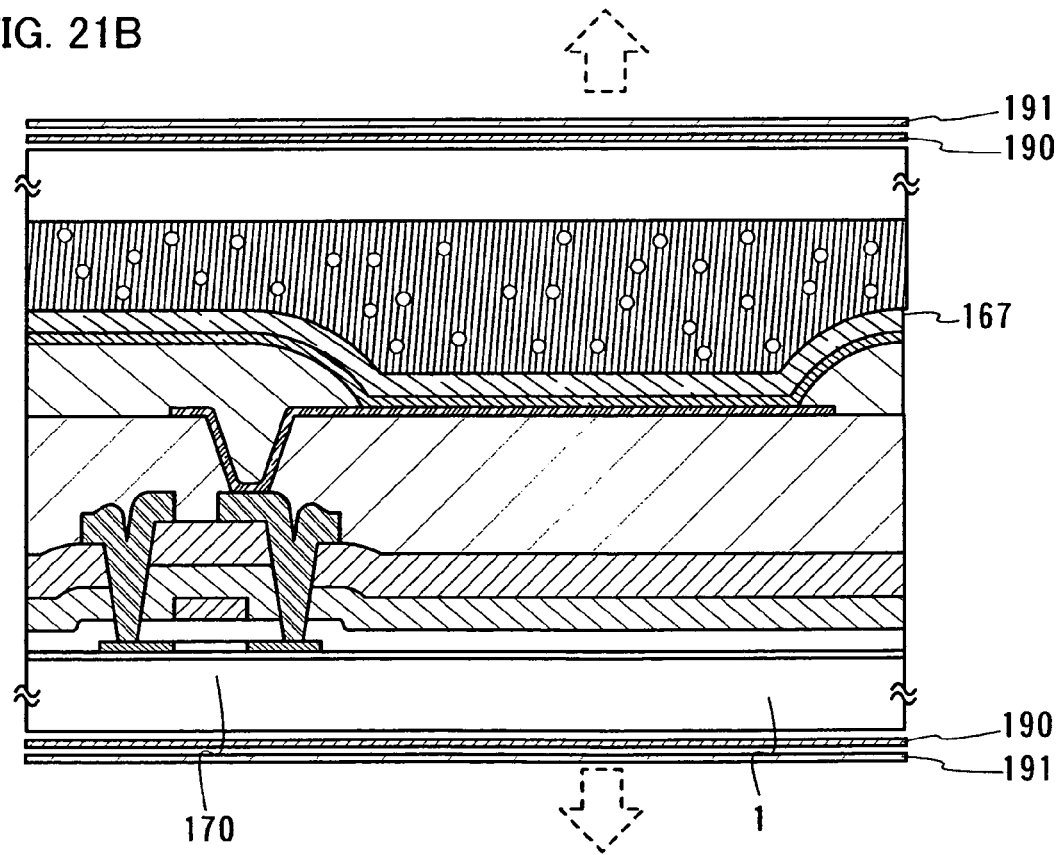

In FIG. 21B, each of the first electrode 164 and the second electrode 167 is formed with a light-transmitting conductive film, and light can be extracted from both the substrate 1 and the counter substrate 194. With this structure, it is possible to prevent the screen from being translucent by separately providing polarizing plates 190 outside the substrate 1 and the counter substrate 194, whereby increasing the visibility. A protective film 191 is preferably provided outside the polarizing plate 190.

Either an analog video signal or a digital video signal may be used in the light emitting device using the present invention. The digital video signal includes a video signal using voltage and a video signal using current. When the light emitting element emits light, the video signal inputted into a pixel uses a constant voltage or a constant current. When the video signal uses a constant voltage, the voltage applied to the light emitting element or the current flowing in the light emitting element is constant. Meanwhile, when the video signal uses a constant current, the voltage applied to the light emitting element or the current flowing in the light emitting element is constant. The light emitting element to which a constant voltage is applied is driven by constant voltage driving, and the light emitting element in which the constant current flows is driven by the constant current driving. Constant current flows in the light emitting element driven by the constant current driving without being affected by the change in the resistance of the light emitting element. Whichever of the driving methods described above can be used for a light emitting device or a driving method according to the present invention.

A light emitting device according to the present invention having such a structure is a highly reliable light emitting device since hydrogen ions that are generated in addition to impurity ions are prevented from penetrating into the channel region.

This embodiment can be combined with an appropriate structure of any of the above embodiment modes.

EMBODIMENT MODE 6

Figure 22A:
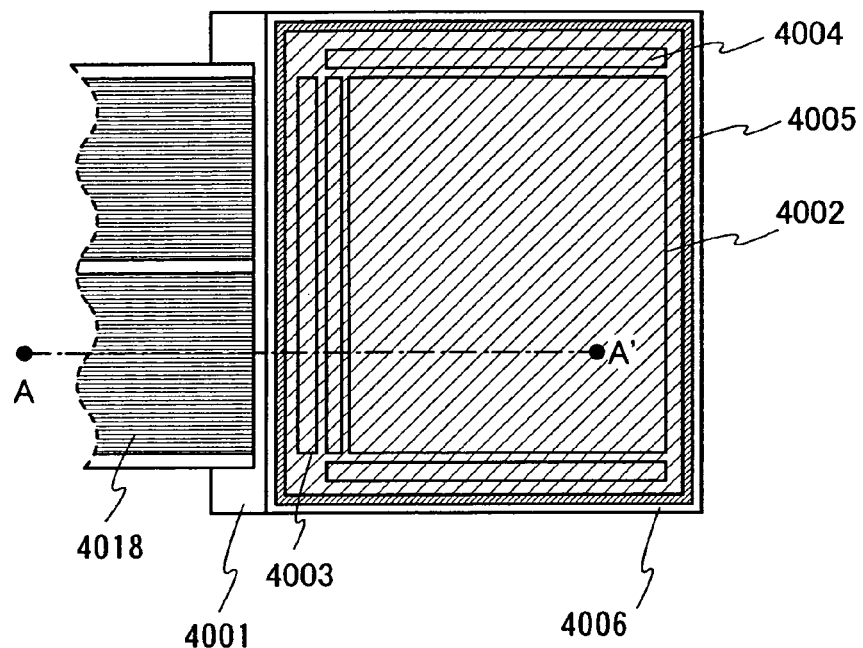
FIGS. 22A and 22B are cross-sectional views of an EL display device.
Figure 22B:
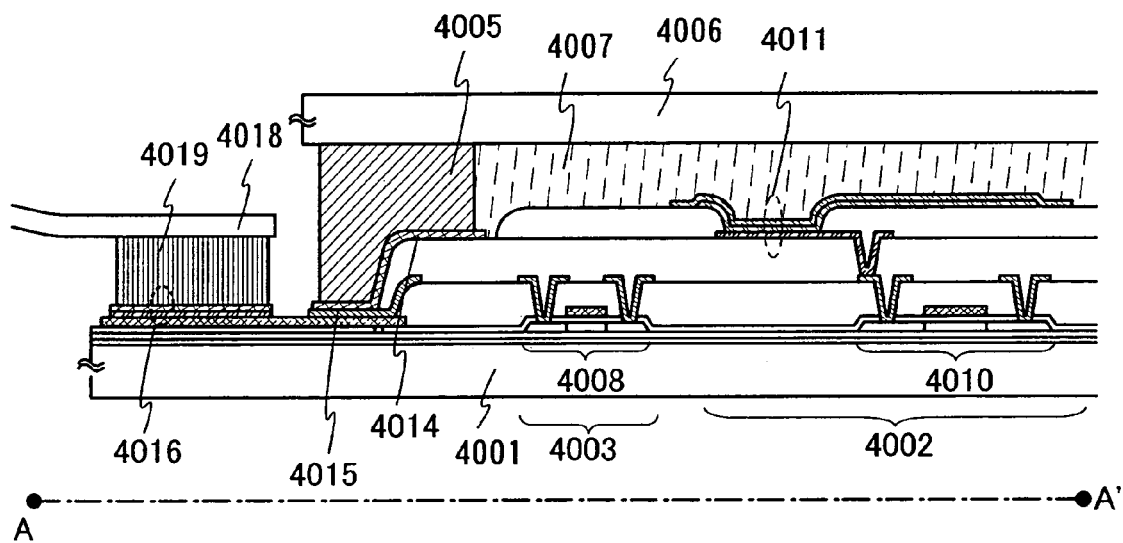

This embodiment will describe an appearance of a panel which is a light emitting device of the present invention with reference to FIGS. 22A and 22B. FIG. 22A is a top view of a panel in which transistors and light emitting elements are formed over a substrate 4001 is sealed with a sealing material formed between the substrate 4001 and a counter substrate 4006. FIG. 22B is a cross-sectional view corresponding to FIG. 22A. The light emitting element mounted on this panel has a structure as described in the above embodiment mode.

A sealing material 4005 is provided so as to surround a pixel area 4002, a signal line driver circuit 4003, and a scan line driver circuit 4004 which are provided over a substrate 4001. In addition, the counter substrate 4006 is provided over the pixel area 4002, the signal line driver circuit 4003, and the scan line driver circuit 4004. Thus, the pixel area 4002, the signal line driver circuit 4003, and the scan line driver circuit 4004 together with a filler 4007 are sealed with the substrate 4001, the sealing material 4005, and the counter substrate 4006.

The pixel area 4002, the signal line driver circuit 4003, and the scan line driver circuit 4004 provided over the substrate 4001 have a plurality of thin film transistors. FIG. 22B shows a thin film transistor 4008 included in the signal line driver circuit 4003 and a thin film transistor 4010 included in the pixel area 4002.

The light emitting element 4011 is electrically connected to the thin film transistor 4010.

Further, a lead wire 4014 corresponds to a wire for supplying a signal or power source voltage to the pixel area 4002, the signal line driver circuit 4003, and the scan line driver circuit 4004. The lead wire 4014 is connected to a connection terminal 4016 through a lead wire 4015. The connection terminal 4016 is electrically connected to a terminal of a flexible printed circuit (FPC) 4018 through an anisotropic conductive film 4019.

As the filler 4007, other than inert gas such as nitrogen or argon, an ultraviolet curable resin or a thermosetting resin can be used. For example, polyvinyl chloride, acrylic, polyimide, an epoxy resin, a silicone resin, polyvinyl butyral, or ethylene vinylene acetate can be used.

It is to be noted that the light emitting device according to the present invention includes in its category the panel in which the pixel area having the light emitting elements is formed and a module in which an IC is mounted on the panel.

This embodiment can be used in appropriate combination with a structure of any one of the above embodiment modes as appropriate.

EMBODIMENT MODE 7

This embodiment will describe a pixel circuit and a protective circuit in the panel and the module shown in Embodiment Mode 6, and their operations. FIGS. 19A to 22B are cross sectional views of a driving TFT 1403 or a switching TFT 1401 and a light emitting element 1405 shown in FIGS. 23A to 23F.

Figure 23A:
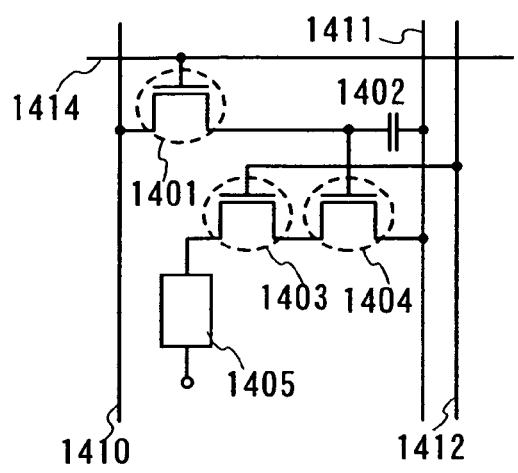
FIGS. 23A to 23F are equivalent circuit diagrams of an EL display device.

A pixel shown in FIG. 23A includes a signal line 1410 and power source lines 1411 and 1412 in columns and a scan line 1414 in a row. The pixel further includes a switching TFT 1401, the driving TFT 1403, a current control TFT 1404, a capacitor 1402, and the light emitting element 1405.

Figure 23B:
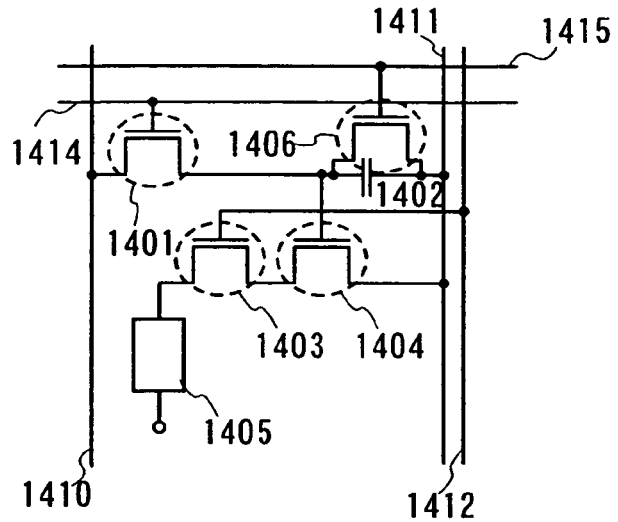
Figure 23C:
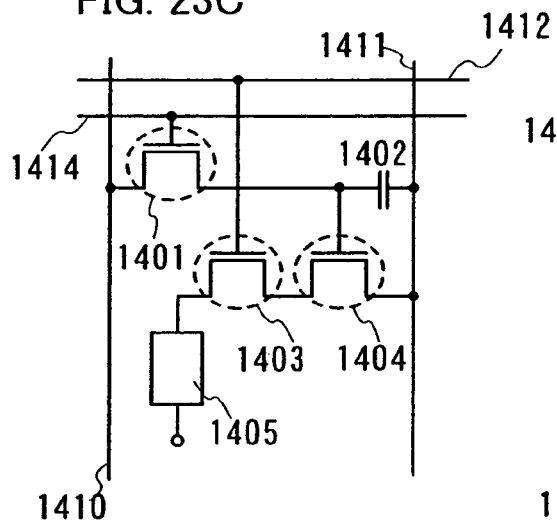
Figure 23D:
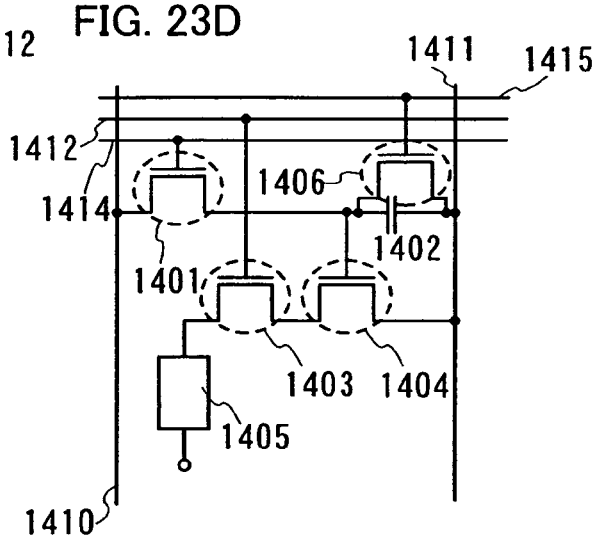

A pixel shown in FIG. 23C has the same structure as one in FIG. 23A except for that a gate electrode of the driving TFT 1403 is connected to the power source line 1412 provided in a row. In other words, the pixels shown in FIGS. 23A and 23C have the same equivalent circuit diagram. However, in the case of arranging the power source line 1412 in the column direction (FIG. 23A) and in the case of arranging the power source line 1412 in the row direction (FIG. 23C), each power source line is formed using a conductive film in different layers. Here, attention is paid to a wire connected to the gate electrode of the driving TFT 1403, and the structure is shown separately in FIGS. 23A and 23C in order to show that these wires are manufactured in different layers.

As a feature of the pixels shown in FIGS. 23A and 23C, the driving TFT 1403 and the current control TFT 1404 are connected serially within the pixel, and it is preferable to set the channel length L (1403) and the channel width W (1403) of the driving TFT 1403, and the channel length L(1404) and the channel width W (1404) of the current control TFT so as to satisfy L (1403)/W (1403):L (1404)/W (1404)=5 to 6000:1.

The driving TFT 1403 operates in a saturation region and serves to control the current value of the current flowing into the light emitting element 1405. The current control TFT 1404 operates in a linear region and serves to control the current supplied to the light emitting element 1405. Both the driving TFT 1403 and the current control TFT 1404 preferably have the same conductivity type considering the manufacturing process, and the driving TFT 1403 and the current control TFT 1404 are n-channel type TFTs in this embodiment mode. The driving TFT 1403 may be either an enhancement mode TFT or a depletion mode TFT. Since the current control TFT 1404 operates in the linear region in a light emitting device having the above structure according to the present invention, slight fluctuation in Vgs of the current control TFT 1404 does not affect the current value of the light emitting element 1405. In other words, the current value of the light emitting element 1405 can be determined by the driving TFT 1403 operating in the saturation region. With the above structure, variation in the luminance of the light emitting element due to the variation in the characteristics of the TFT can be reduced, thereby providing a light emitting device in which the image quality is improved.

In the pixels shown in FIGS. 23A to 23D, the switching TFT 1401 is to control input of the video signal to the pixel, and the video signal is inputted into the pixel when the switching TFT 1401 is turned ON. Then, the voltage of the video signal is held in the capacitor 1402. Although FIGS. 23A and 23C show the structure in which the capacitor 1402 is provided, the present invention is not limited thereto. When the gate capacitance or the like can serve as a capacitor holding the video signal, the capacitor 1402 is not necessarily provided.

A pixel shown in FIG. 23B has the same pixel structure as that in FIG. 23A except for that a TFT 1406 and a scan line 1414 are added. Similarly, a pixel shown in FIG. 23D has the same pixel structure as that in FIG. 23C expect that the TFT 1406 and the scan line 1414 are added.

ON and OFF of the TFT 1406 is controlled by the additionally provided scan line 1414. When the TFT 1406 is turned ON, the charge held in the capacitor 1402 is discharged; thus, the current control TFT 1404 is turned OFF. In other words, by the provision of the TFT 1406, a state can be produced forcedly in which the current does not flow into the light emitting element 1405. For this reason, the TFT 1406 can be referred to as an eraser TFT. Consequently, in the structures shown in FIGS. 23B and 23D, a lighting period can be started at the same time as or just after the start of a writing period before the writing of the signal into all the pixels; therefore the duty ratio can be improved.

Figure 23E:
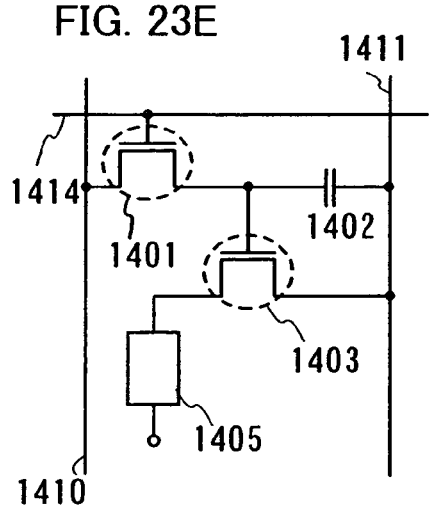
Figure 23F:
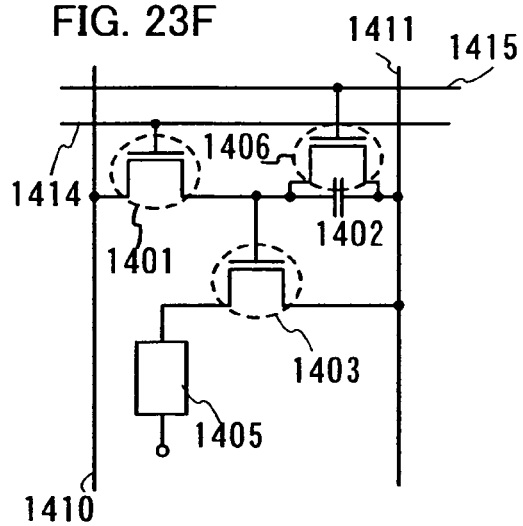

In a pixel shown in FIG. 23E, the signal line 1410 and the power source line 1411 are arranged in the column direction, and the scan line 1414 is arranged in the row direction. Further, the pixel includes the switching TFT 1401, the driving TFT 1403, the capacitor 1402, and the light emitting element 1405. A pixel shown in FIG. 23F has the same pixel structure as one shown in FIG. 23E except for that the TFT 1406 and a scan line 1415 are added. In the structure shown in FIG. 23F, the duty ratio can also be increased by the provision of the TFT 1406.

As thus described, various kinds of pixel circuits can be used. In particular, in the case of forming a thin film transistor from an amorphous semiconductor film, the semiconductor film of the driving TFT 1403 is preferably large. In the case where the semiconductor is large, in the above pixel circuit, a top emission type is preferable in which light from the light emitting element is extracted from the counter substrate.

Such an active matrix light emitting device can be driven at a low voltage when the pixel density increases, since the TFT is provided in each pixel, which is considered advantageous.

Although this embodiment describes the active matrix light emitting device in which a TFT is provided in each pixel, a passive matrix light emitting device can also be formed in which TFTs are provided in each column. Since TFTs are not provided in each pixel in a passive matrix light emitting device, high aperture ratio can be obtained. In the case of a light emitting device in which light is emitted from both sides of the light emitting stack, the transmittance of the passive matrix light emitting device is increased.

Subsequently, a case where a diode is provided as a protective circuit on the scan line and the signal line with the use of an equivalent circuit shown in FIG. 23E will be described.

Figure 24:
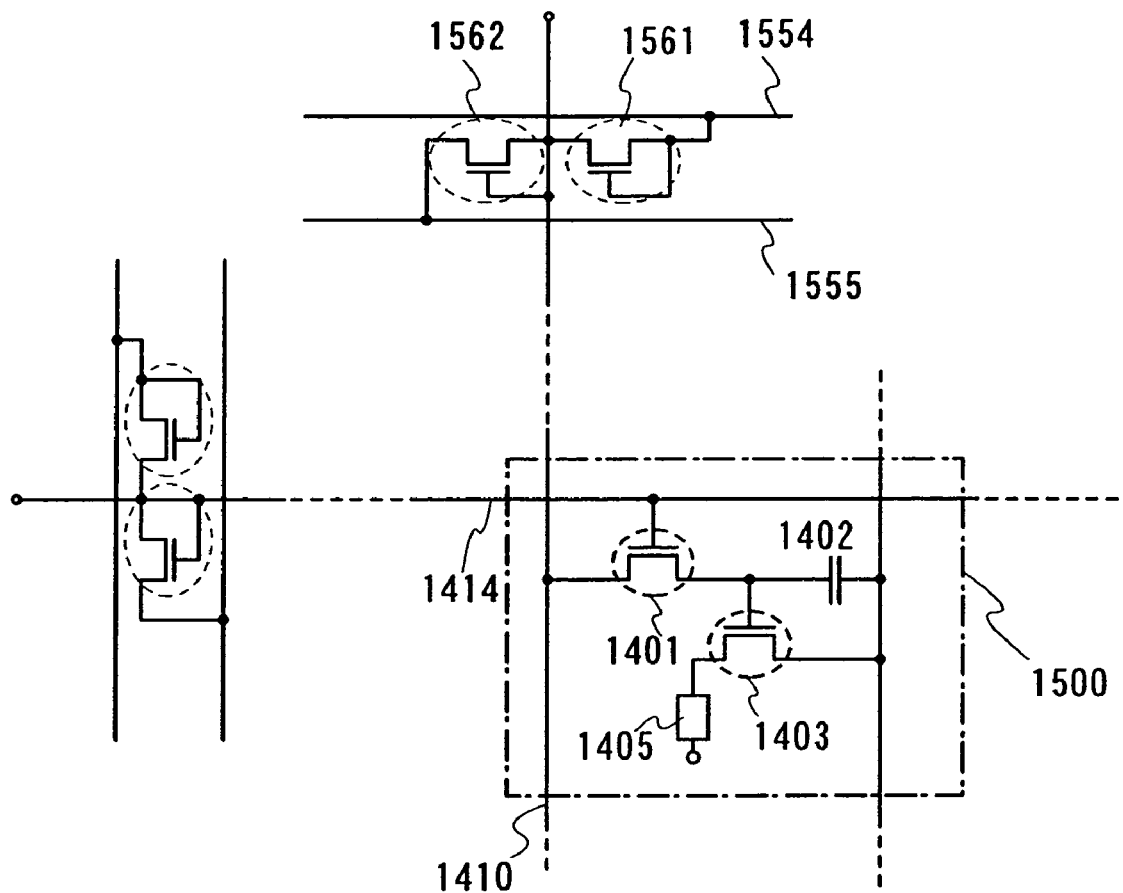
FIG. 24 is an equivalent circuit diagram of an EL display device.

In FIG. 24, the switching TFT 1401, the driving TFT 1403, the capacitor 1402, and the light emitting element 1405 are provided in a pixel area 1500. Diodes 1561 and 1562 are provided on the signal line 1410. In the similar way to the switching TFT 1401 or the driving TFT 1403, the diodes 1561 and 1562 are manufactured based on the above embodiments, and have a gate electrode, a semiconductor layer, a source electrode, a drain electrode, and the like. The diodes 1561 and 1562 are operated as diodes by connecting the gate electrode with the drain electrode or the source electrode.

Wires 1554 and 1555 connecting to the diodes are formed using the same layer as the gate electrode. Therefore, in order to connect the wires 1554 and 1555 with the source electrode or the drain electrode of the diode, it is necessary to form a contact hole in the gate insulating layer.

A diode provided on the scan line 1414 has the similar structure.

As thus described, according to the present invention, protective diodes provided in an input stage can be manufactured simultaneously. The position where the protective diode is formed is not limited to this, and the diode may also be provided between the driver circuit and the pixel.

This embodiment can be combined with a suitable structure of the above embodiment modes as appropriate.

EMBODIMENT MODE 8

As electronic device having light emitting devices according to the present invention mounted with modules shown as examples in the above embodiment modes, a camera such as a video camera and a digital camera; a goggle type display (a head mounted display); a navigation system; an audio reproducing device (e.g., a car audio component); a computer; a game machine; a portable information terminal (e.g., a mobile computer, a cellular phone, a portable game machine, an electronic book, or the like); an image reproducing device equipped with a recording medium (specifically, a device which can reproduce the content of a recording medium such as a digital versatile disc (DVD) and which has a display for displaying an image stored therein); and the like can be given. Specific examples of these electronic appliances are shown in FIGS. 25A to 25E, and FIG. 26.

Figure 25A:
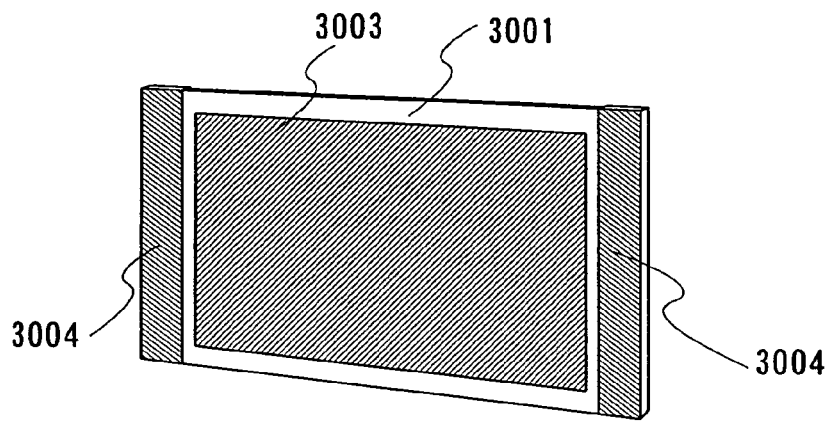
FIGS. 25A to 25E are figures showing examples of electronic device to which the present invention is applied.

FIG. 25A shows a monitor for a television receiver or a personal computer, or the like, including a housing 3001, a display area 3003, speakers 3004, and the like. An active matrix display device is provided in the display area 3003. Each pixel of the display area 3003 includes a TFT manufactured in accordance with the present invention. By using the TFT of the present invention, a television with less characteristic deterioration can be obtained.

Figure 25B:
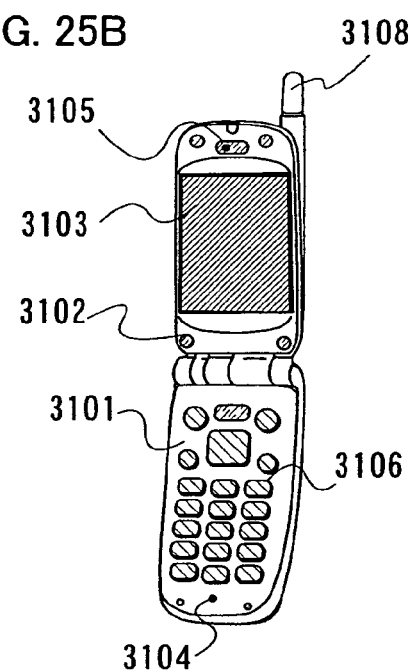

FIG. 25B shows a cellular phone, including a main body 3101, a housing 3102, a display area 3103, an audio input portion 3104, an audio output portion 3105, operation keys 3106, an antenna 3108, and the like. An active matrix display device is provided in the display area 3103. Each pixel of the display area 3103 includes a TFT manufactured in accordance with the present invention. By using the TFT of the present invention, a cellular phone with less characteristic deterioration can be obtained.

Figure 25C:
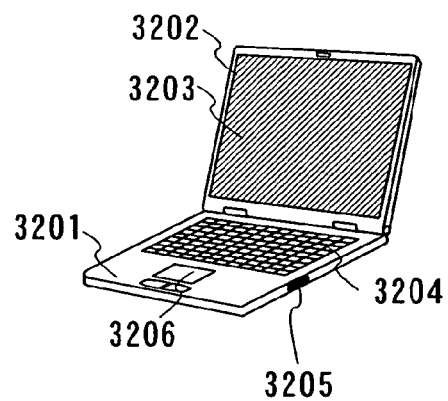

FIG. 25C shows a computer, including a main body 3201, a housing 3202, a display area 3203, a keyboard 3204, an external connection port 3205, a pointing mouse 3206, and the like. An active matrix display device is provided in the display area 3203. Each pixel of the display area 3203 includes a TFT manufactured in accordance with the present invention. By using the TFT of the present invention, a computer with less characteristic deterioration can be obtained.

Figure 25D:
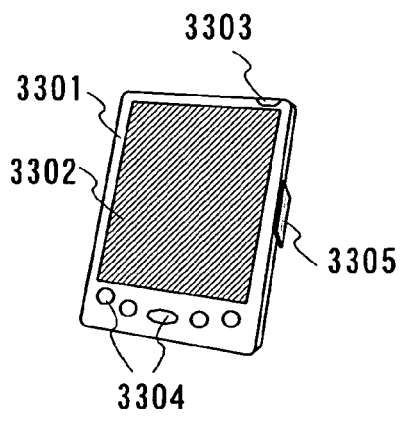

FIG. 25D shows a mobile computer, including a main body 3301, a display area 3302, a switch 3303, operation keys 3304, an infrared port 3305, and the like. An active matrix display device is provided in the display area 3302. Each pixel of the display area 3302 includes a TFT manufactured in accordance with the present invention. By using the TFT of the present invention, a mobile computer with less characteristic deterioration can be obtained.

Figure 25E:
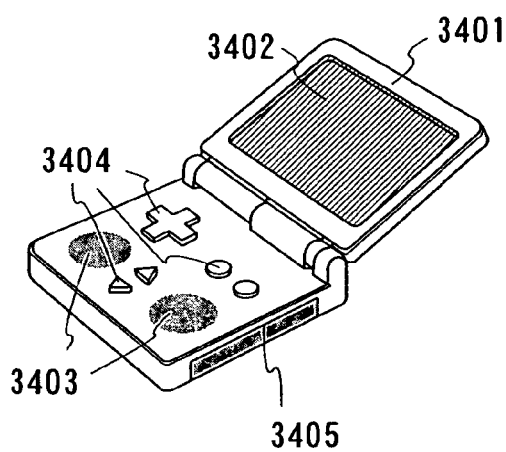

FIG. 25E shows a portable game machine, including a housing 3401, a display area 3402, speaker portions 3403, operation keys 3404, a recording medium insert portion 3405, and the like. An active matrix display device is provided in the display area 3402. Each pixel of the display area 3402 includes a TFT manufactured in accordance with the present invention. By using the TFT of the present invention, a portable game machine with less characteristic deterioration can be obtained.

Figure 26:
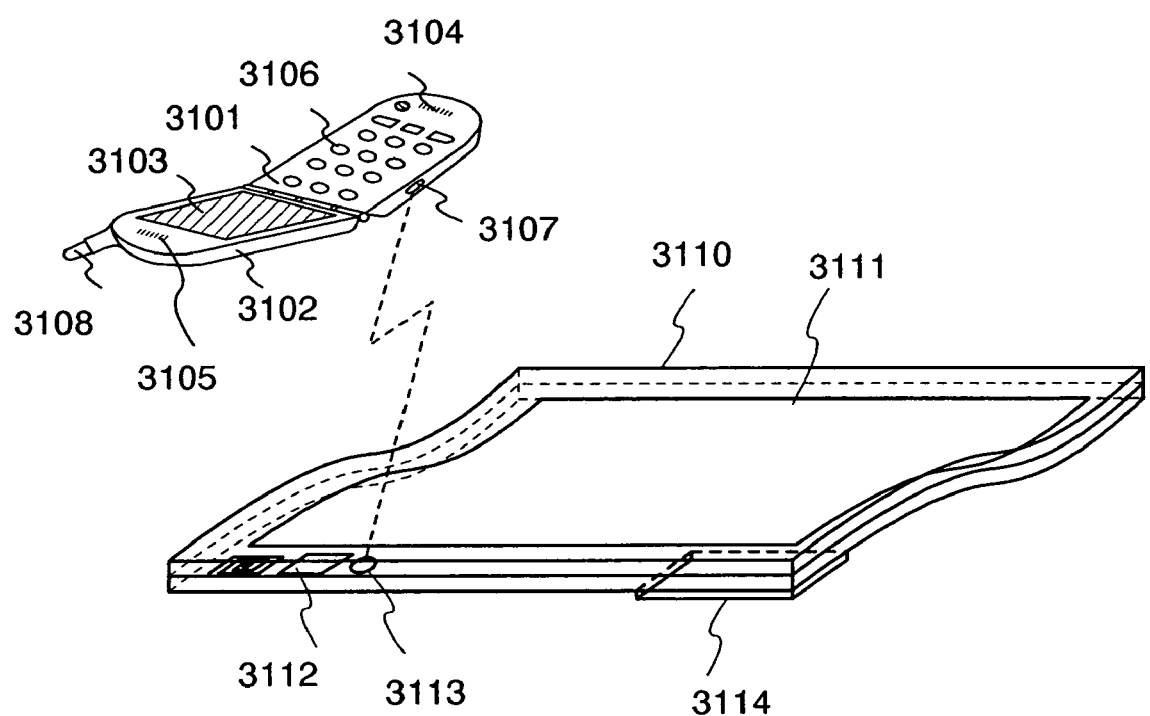
FIG. 26 is a figure showing an example of an electronic device to which the present invention is applied.
Figure 27A:
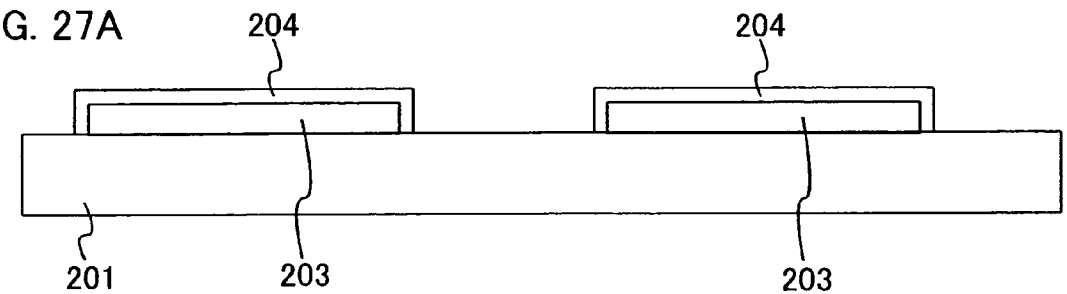
FIGS. 27A to 27D are figures illustrating a related art.
Figure 27B:
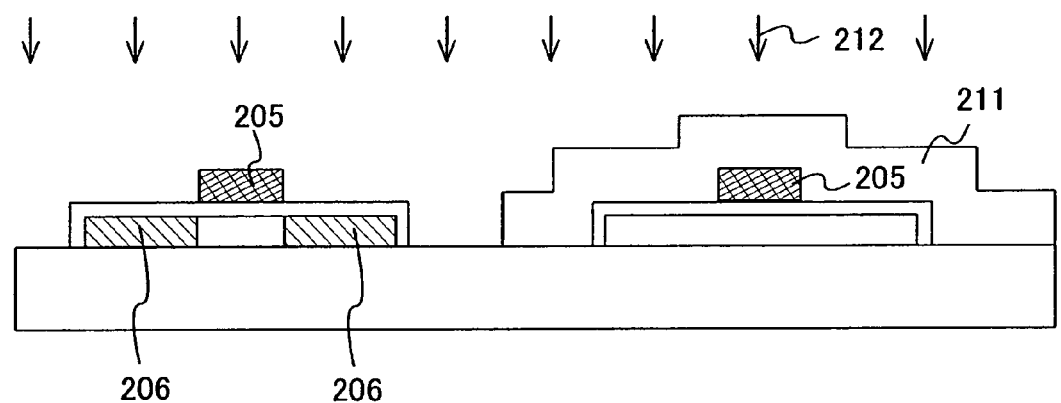
Figure 27C:
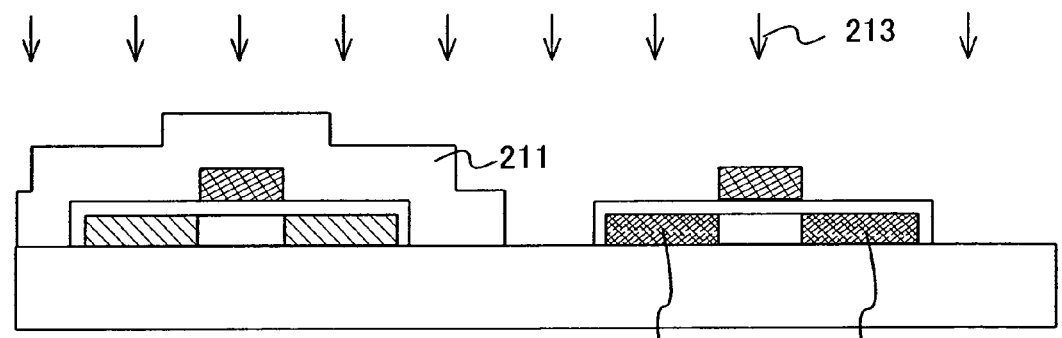
Figure 27D:
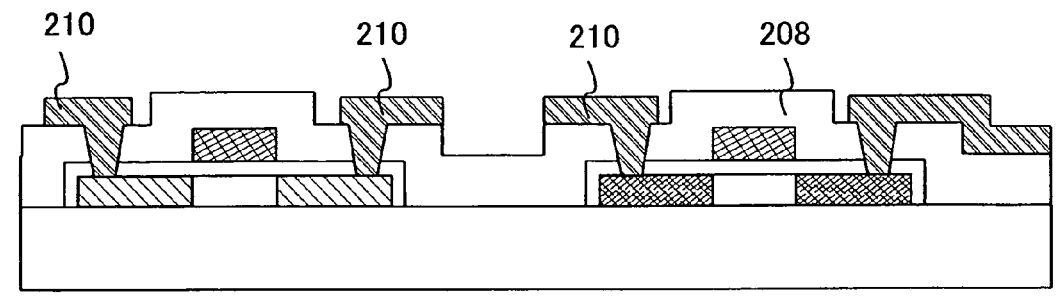

FIG. 26 shows a flexible display, including a main body 3110, a pixel area 3111, a driver IC 3112, a receiving device 3113, a film buttery 3114, and the like. The receiving device 3113 can receive a signal from an infrared communication port 3107 of the above described cellular phone. An active matrix display device is provided in the pixel area 3111. Each pixel of the pixel area 3111 includes a TFT manufactured in accordance with the present invention. By using the TFT of the present invention, a flexible display with less characteristic deterioration can be obtained.

As set forth above, the application range of the present invention is extremely wide, and the present invention can be applied to electronic devices in all fields.

EMBODIMENT

This embodiment will describe a TFT which was manufactured in a manner described in Embodiment Mode 1 and the characteristics measured.

Figure 5A:
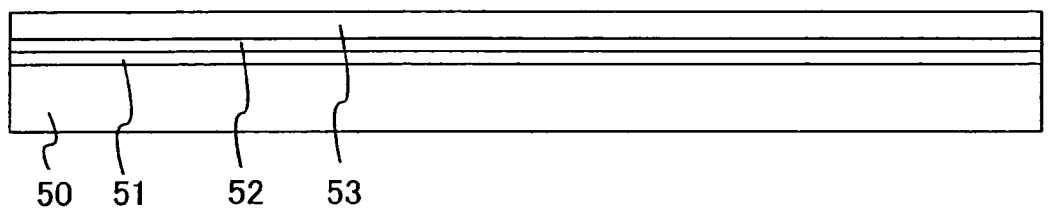
FIGS. 5A to 5E are figures illustrating manufacturing steps of a semiconductor device according to the present invention.

As shown in FIG. 5A, a silicon nitride oxide film 51 was formed as a base insulating film over an alkali-free glass substrate (AN100 produced by Asahi Glass Co., Ltd.) 50 to a thickness of 50 nm by plasma CVD, and after that, a silicon oxynitride film 52 was formed to a thickness of 100 nm by plasma CVD.

Next, an amorphous silicon film 53 was formed to a thickness of 50 nm by plasma CVD.

Figure 5B:
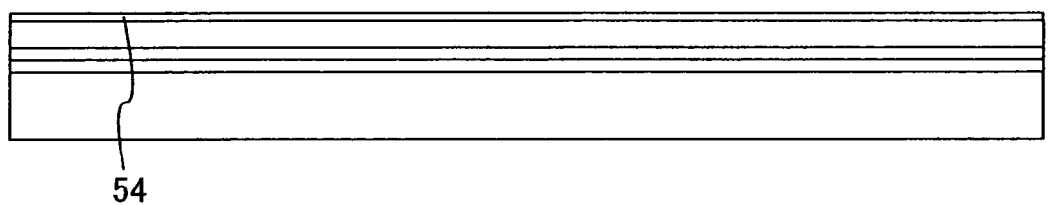

Next, an amorphous silicon film 53 was crystallized. First, as shown in FIG. 5B, a metal containing layer 54 was formed on the surface of the amorphous silicon film 53. The metal containing layer 54 was formed by coating with an acetic acid nickel solution containing 10 ppm of nickel by weight using a spinner.

Next, the substrate 50, the amorphous silicon film 53, and the metal containing layer 54 were heat treated. Here, a crystalline silicon film 49 was formed through heat treatment by rapid thermal annealing (RTA).

Figure 5C:
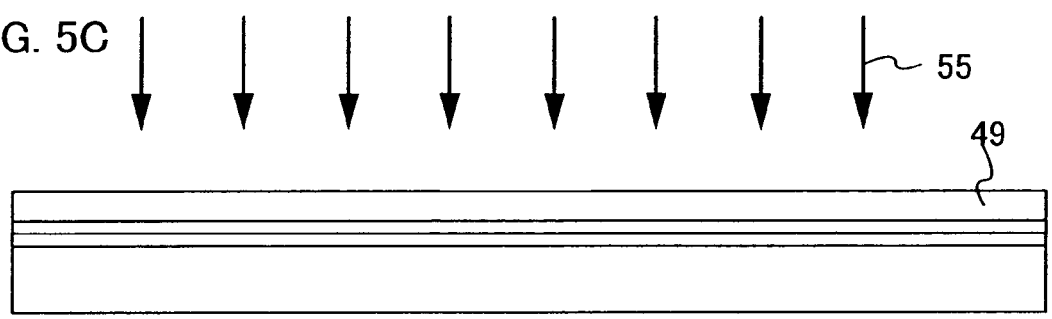

Then, as shown in FIG. 5C, the crystalline silicon film 49 was irradiated with laser light 55 under atmospheric pressure, thereby increasing the crystallinity of the crystalline silicon film 49 (ratio of crystal components against the whole volume of the film), and repairing defects remaining in the crystal grains.

For the laser light, a XeCl excimer laser which is a pulsed laser was used. The repetition rate was 30 Hz, and the energy density was approximately 300 mJ/cm$^2$ to 500 mJ/cm$^2$. The silicon film was moved relatively to the laser beam at a speed of 0.5 cm/s to 10 cm/s so as to be irradiated. The overlap ratio was set at 95% or more.

Next, the surface of the crystalline silicon film 49 was treated with an ozone containing solution (typically, ozone water), thereby forming an oxide film (referred to as chemical oxide) on the surface of the crystalline silicon film 49. Thus, a barrier layer 56 formed from an oxide film having a thickness of 1 nm to 10 nm in total was formed. The barrier layer 56 functioned as an etching stopper when only a gettering layer was selectively removed in a later step.

Next, a gettering layer 57 containing an argon element was formed as a gettering site on the barrier layer 56. Here, an amorphous silicon film containing argon gas was formed as the gettering layer 57 by sputtering.

Figure 5D:
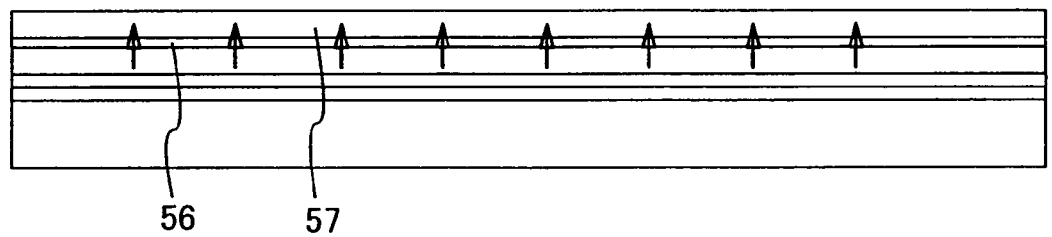

Next, the crystalline silicon film 49, the barrier layer 56, and the gettering layer 57 were heat treated by RTA. Thus, as shown by the arrow in FIG. 5D, the metal element (for example, nickel) was gettered, thereby reducing the concentration of the metal element in the crystalline silicon film 49.

Figure 5E:
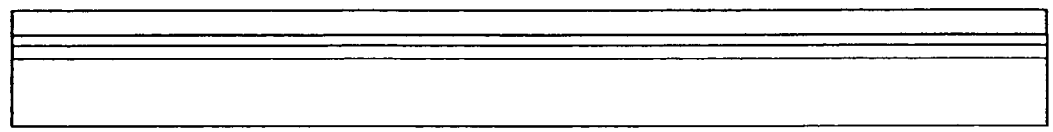

Only the gettering layer 57 was selectively removed by a known etching method using the barrier layer 56 as an etching stopper. After that, the barrier layer 56 formed from an oxide film was removed using, for example, an etchant containing hydrofluoric acid (FIG. 5E). Through the above steps, the crystalline silicon film 49 was obtained.

Next, channel doping was performed using p-type impurity ions considering the threshold characteristics of a TFT to be formed. The accelerating voltage was 15 kV, and the dose was $1.5 \times 10^{13}$ atoms/cm$^2$.

Figure 6A:
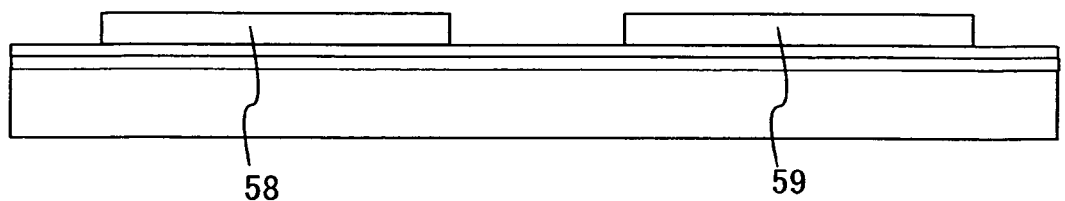
FIGS. 6A to 6D are figures illustrating manufacturing steps of a semiconductor device according to the present invention.

Next, the crystalline silicon film was formed into island-shaped crystalline silicon films 58 and 59 by a known photolithography process (FIG. 6A). Here, a p-channel TFT was formed using the crystalline silicon film 58, and an n-channel TFT was formed using the crystalline silicon film 59.

Figure 6B:
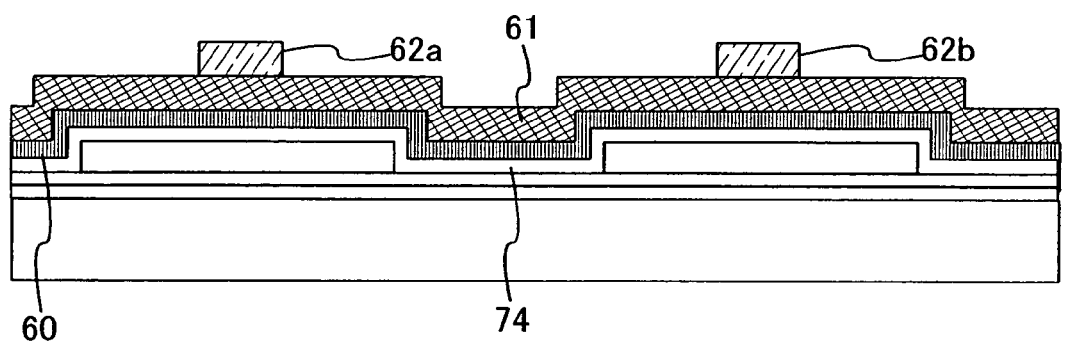
Figure 6C:
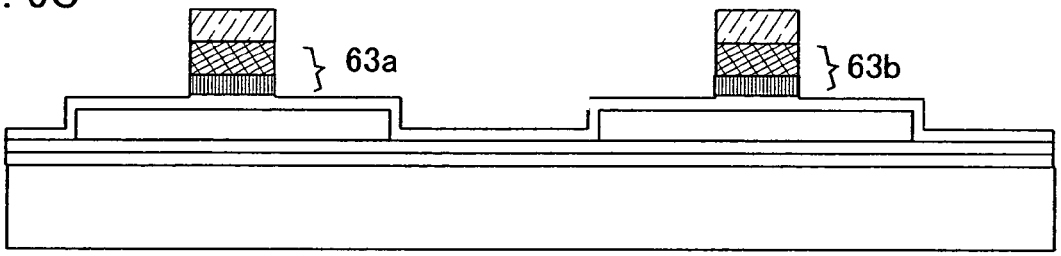

Next, after the surface of the crystalline silicon film was cleaned with an containing etchant hydrofluoric acid, a silicon oxide film was formed as a gate insulating film 74 over the crystalline silicon film to a thickness of 100 nm by plasma CVD (FIG. 6B).

Next, after cleaning the surface of the gate insulating film 74, a tantalum nitride (TaN) film 60 was formed to a thickness of 30 nm by sputtering and a W film 61 was formed by sputtering as conductive films for forming a gate electrode, over the whole surface including the surface of the gate insulating film 74 (FIG. 6B). The W film 61 was formed to a thickness of 170 nm or 220 nm.

A photoresist film was formed on the W film 61 by coating, and the photoresist film was exposed and developed, thereby forming a first resist mask 62a and a second resist mask 62b respectively above the crystalline silicon films 58 and 59 to thicknesses of 1.0 μm to 1.5 μm (FIG. 6B). Here, a novolac-naphthoquinone diazide based resist was used. The W film and the TaN film were etched by dry etching using the resist masks 62a and 62b, thereby manufacturing gate electrodes 63a and 63b. A mixture of $CF_4$ and $Cl_2$ was used as the etching gas, and $O_2$ gas may be further mixed therein as necessary.

Next, a part of the gate insulating film was dry etched using the resist masks 62a and 62b, and the gate electrodes 63a and 63b as masks so that the gate insulating film was made thin. $CHF_3$ gas was used as the etching gas. Thus, the thicknesses of the gate insulating films over the regions which were not masked with the gate electrodes 63a and 63b, namely, areas to be a source region and a drain region were 80 nm.

Figure 6D:
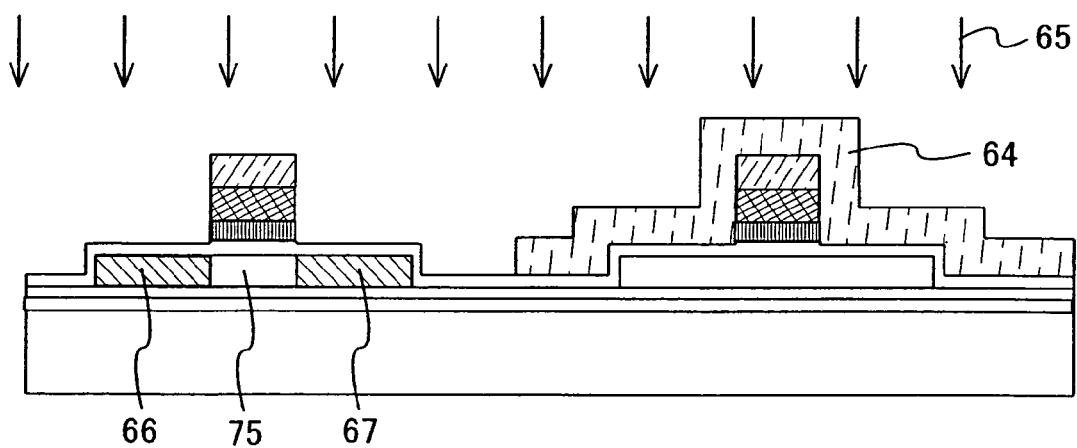

Next, a photoresist film of a novolac-naphthoquinone diazide based resin was formed by coating, and the photoresist film was exposed and developed, thereby forming a third resist mask 64 to a thickness of 1.0 μm to 1.5 μm so as to cover the crystalline silicon film 59, the gate electrode 63b, and the second resist mask 62b (FIG. 6D).

P-type impurity ion (ions containing B) 65 were added to the crystalline silicon film 58 by an ion shower doping method using the first resist mask 62a, the second resist mask 62b, the third resist mask 64, and the gate electrodes 63a and 63b as masks, at a dose of $2.5 \times 10^{16}$ atoms/cm$^2$, thereby forming a source region 66 and a drain region 67 (FIG. 6D). Further, the concentration of the p-type impurity near the surfaces of the source region 66 and the drain region 67 was approximately $3.0 \times 10^{20}$ cm$^{-3}$. The accelerating voltage of the p-type impurity ions was set at 80 kV. Diborane ($B_2H_6$) gas diluted with hydrogen gas was used.

Next, the third resist mask 64, the first resist mask 62a, and the second resist mask 62b were removed by ashing using $O_2$.

Figure 7A:
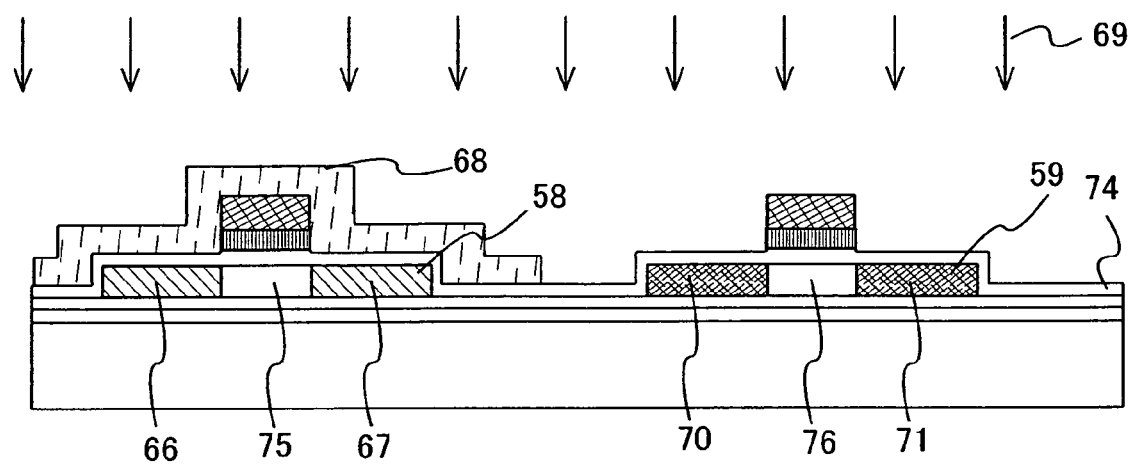
FIGS. 7A and 7B are figures illustrating manufacturing steps of a semiconductor device according to the present invention.

Next, a photoresist film of a novolac-naphthoquinone diazide based resin was formed by coating, and the photoresist film was exposed and developed, thereby forming a fourth resist mask 68 to a thickness of 1.0 μm to 1.5 μm so as to cover the crystalline silicon film 59 and the gate electrode 63b (FIG. 7A).

Figure 7B:
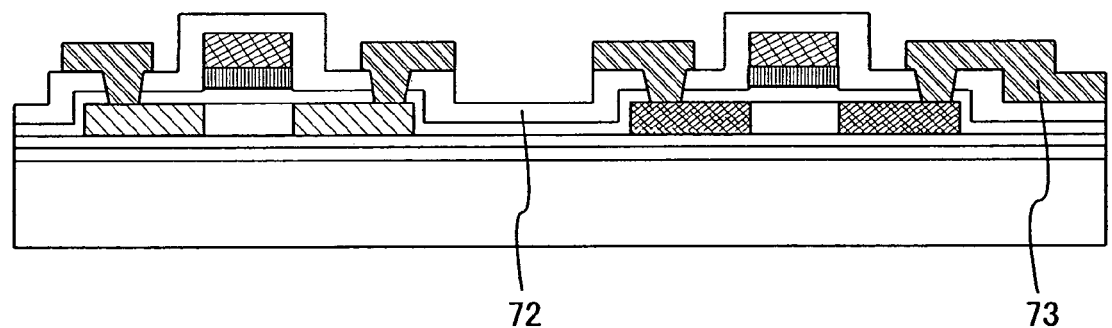

N-type impurity ions (ions containing phosphorus) 69 were added to the crystalline silicon film 59 by a plasma doping method using the fourth resist mask 68 and the gate electrodes 63a and 63b as masks at a less dose of $3.0 \times 10^{15}$ atoms/cm$^2$ than the p-type impurity ions, thereby forming a source region 70 and a drain region 71 (FIG. 7B). Further, the concentration of the n-type impurity near the surfaces of the source region 70 and the drain region 71 was approximately $1.3 \times 10^{20}$ cm$^{-3}$. The accelerating voltage of the n-type impurity ions was set at 65 kV which was lower than the accelerating voltage of the p-type impurity ions. Phosphine ($PH_3$) gas diluted with hydrogen gas was used. Thus, a p-channel TFT was formed using the crystalline silicon film 58, and an n-channel TFT was formed using the crystalline silicon film 59. Note that the channel length (L) of the TFT was 10 m, and the channel width (W) thereof was 8 μm.

Next, the fourth resist mask 68 was removed by ashing using $O_2$.

Next, a silicon nitride film 72 was formed to a thickness of 100 nm by plasma CVD so as to cover the whole surface including the gate insulating film 74 and the gate electrodes 63a and 63b, and hydrogenation was performed in a nitrogen atmosphere at 410° C. for one hour.

Next, a resist mask was formed over the silicon nitride film 72, and the silicon nitride film 72 was etched by wet etching using the resist mask, thereby forming contact holes separately disposed on each of the source regions 66 and 67 and the drain regions 70 and 71.

After removing the resist mask, a Ti film, an Al film, and another Ti film were formed by sputtering. After that, another resist mask was formed, and the Ti film, the Al film, the other Ti film were patterned by dry etching. A mixed gas of $BCl_3$ and $Cl_2$ was used as the etching gas. Thus, a wire 73 (a source wire or drain wire of the TFT) was formed (FIG. 7B).

Measurement results of the TFT characteristics will be shown below.

Figure 28A:
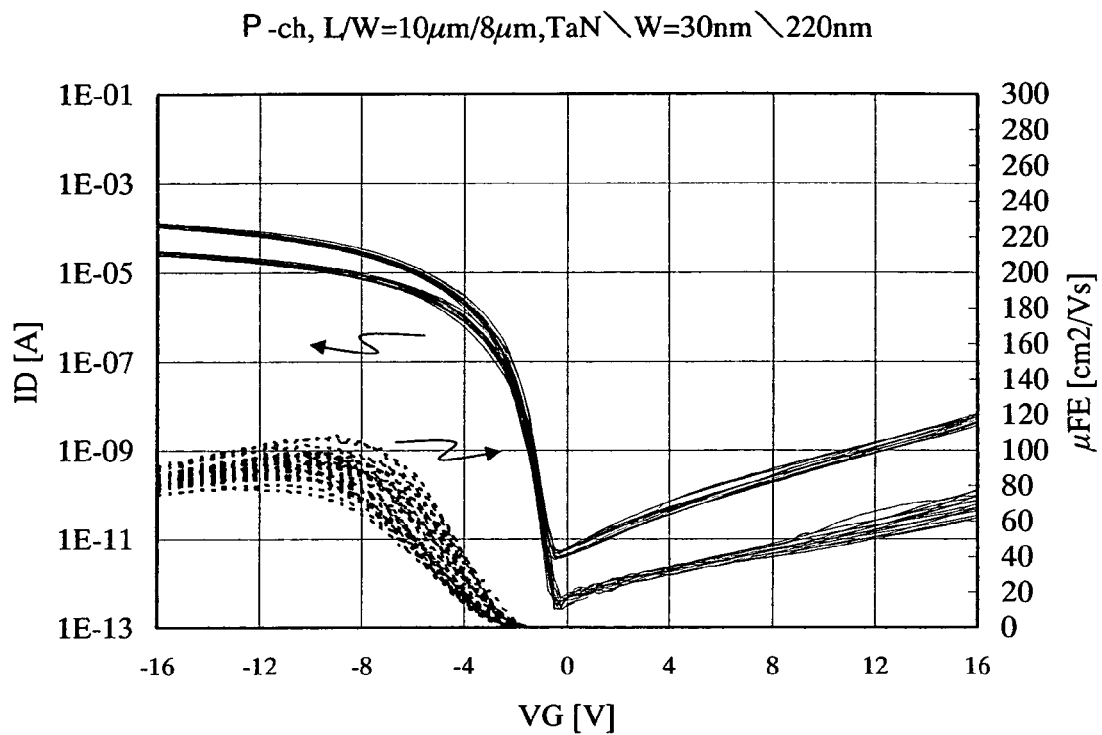
FIGS. 28A and 28B are graphs showing drain current—gate voltage characteristics and mobility—gate voltage characteristics of a p-channel TFT of an embodiment.
Figure 28B:
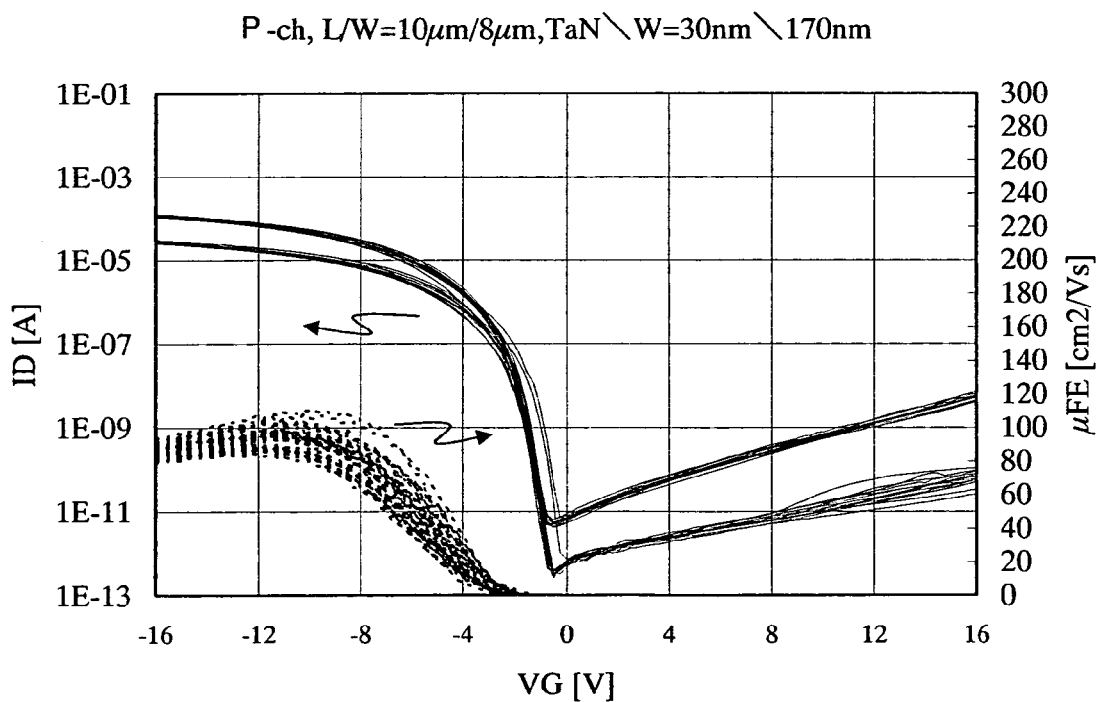

A p-channel TFT will be described first. FIGS. 28A and 28B show drain current (ID)-gate voltage (VG) characteristics and mobility (μFE)-gate voltage (VG) characteristics of the cases where the thickness of the W film was 220 nm (FIG. 28A) and 170 nm (FIG. 28B). 1E–01 on the vertical axis corresponds to $1 \times 10^{-1}$, 1E–03: $1 \times 10^{-3}$, 1E–05: $1 \times 10^{-5}$, 1E–07: $1 \times 10^{-1}$, 1E–09: $1 \times 10^{-9}$, 1E–11: $1 \times 10^{-11}$, and 1E–13: $1 \times 10^{-13}$. This also applies to FIGS. 32A and 32B. Note that since the thickness of the TaN film was 30 nm, the thickness of the whole gate electrode was 250 nm or 200 nm.

Figure 29:
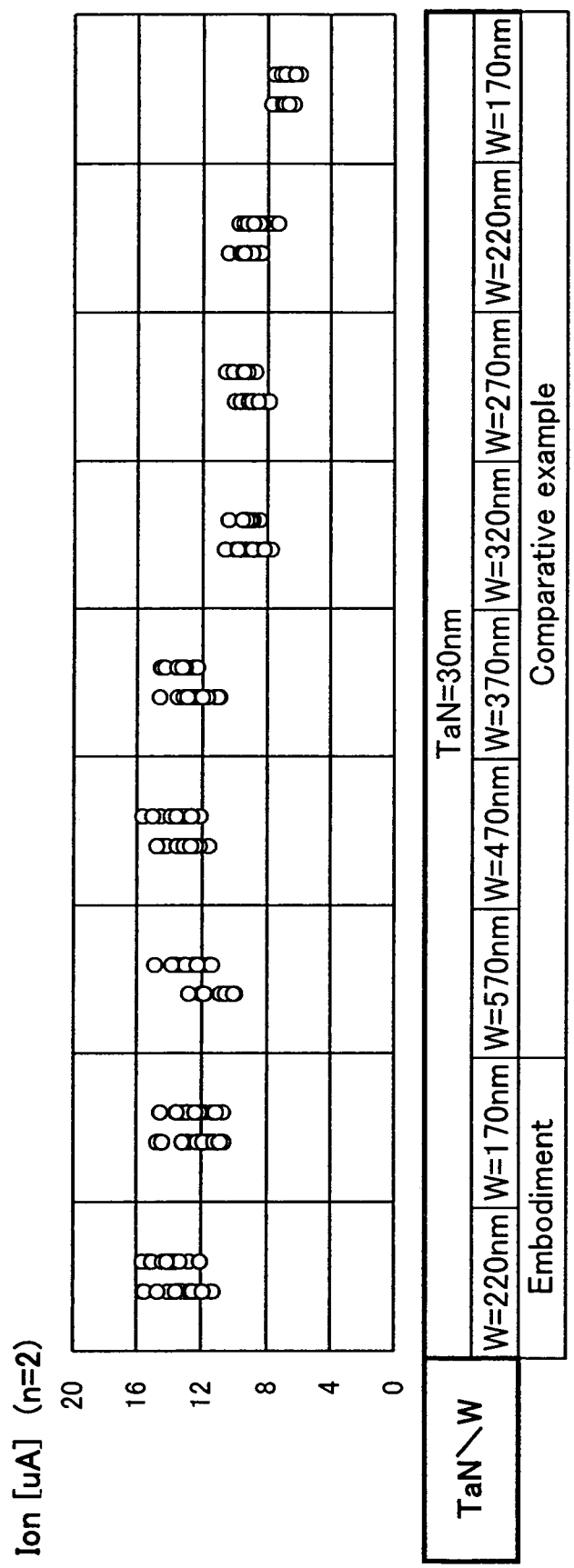
FIG. 29 is a chart showing ON-state current characteristics of a p-channel TFT of an embodiment and a comparative example.
Figure 30:
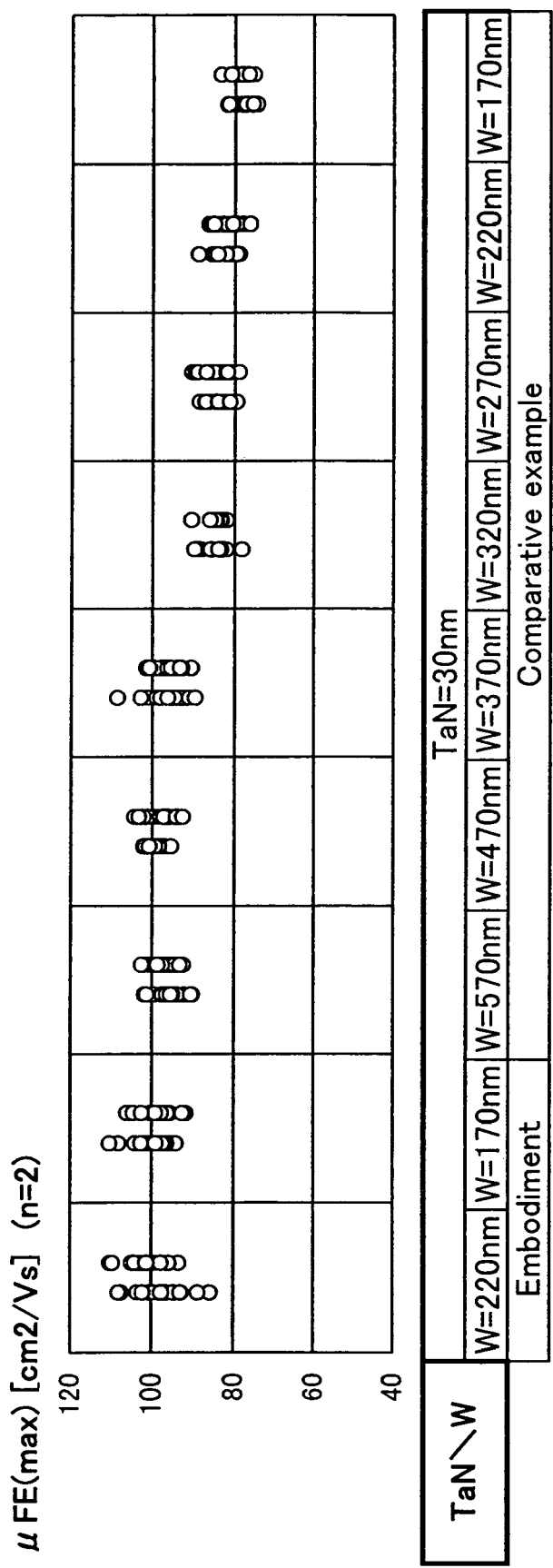
FIG. 30 is a chart showing mobility characteristics of a p-channel TFT of an embodiment and a comparative example.
Figure 31:
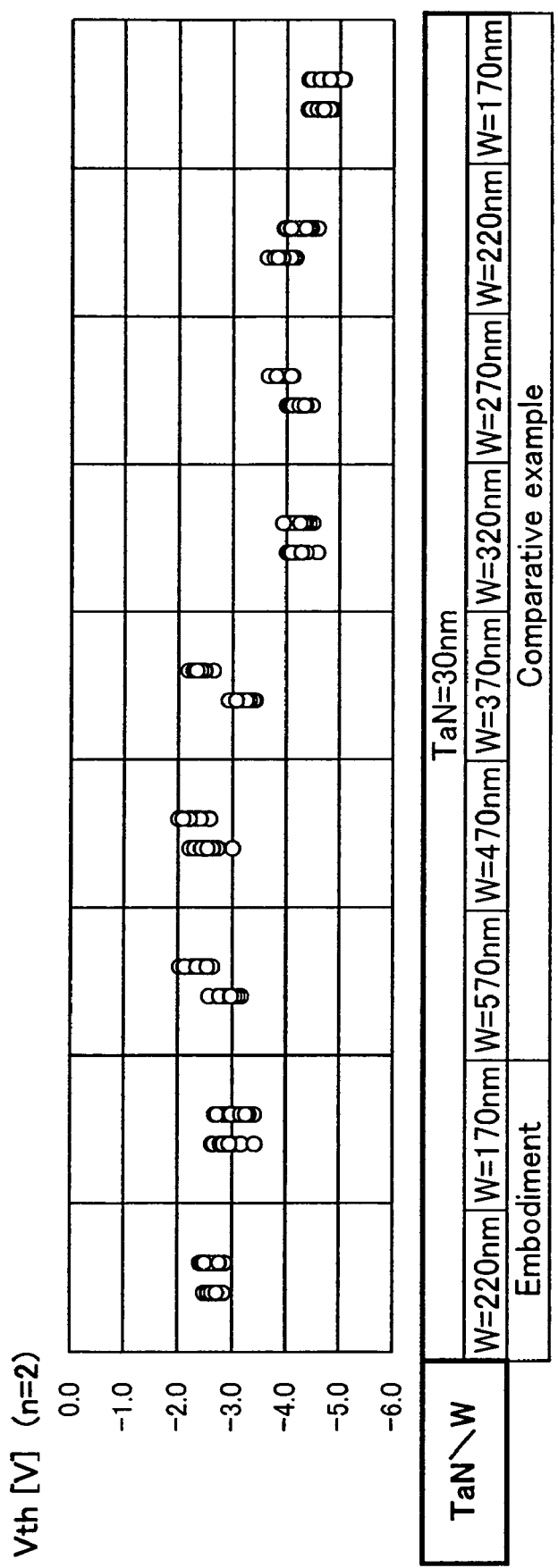
FIG. 31 is a chart showing threshold characteristics of an embodiment and a comparative example.

FIG. 29 shows ON-state current characteristics (Ion, gate voltage +10V, drain voltage +1V), FIG. 30 shows mobility characteristics (μFE (max), drain voltage +1V), and FIG. 31 shows threshold characteristics (Vth, drain voltage +1V); each of the measurement results is shown by circles. Further, number of a manufactured substrate (n) was set at 2.

Since the p-type impurity ions 65 were added over the gate electrode 63a while the first resist mask 62a was left over the gate electrode 63a, the ON-state current characteristics, mobility characteristics, and threshold characteristics did not change significantly even though the thickness of the W film forming the gate electrode was reduced to 220 nm or 170 nm. Accordingly, it is considered that when impurity ions were added, hydrogen ions did not penetrate a channel region 75 or that the amount of hydrogen ions penetrated the channel region 75 was not large enough to affect the characteristics.

Figure 32A:
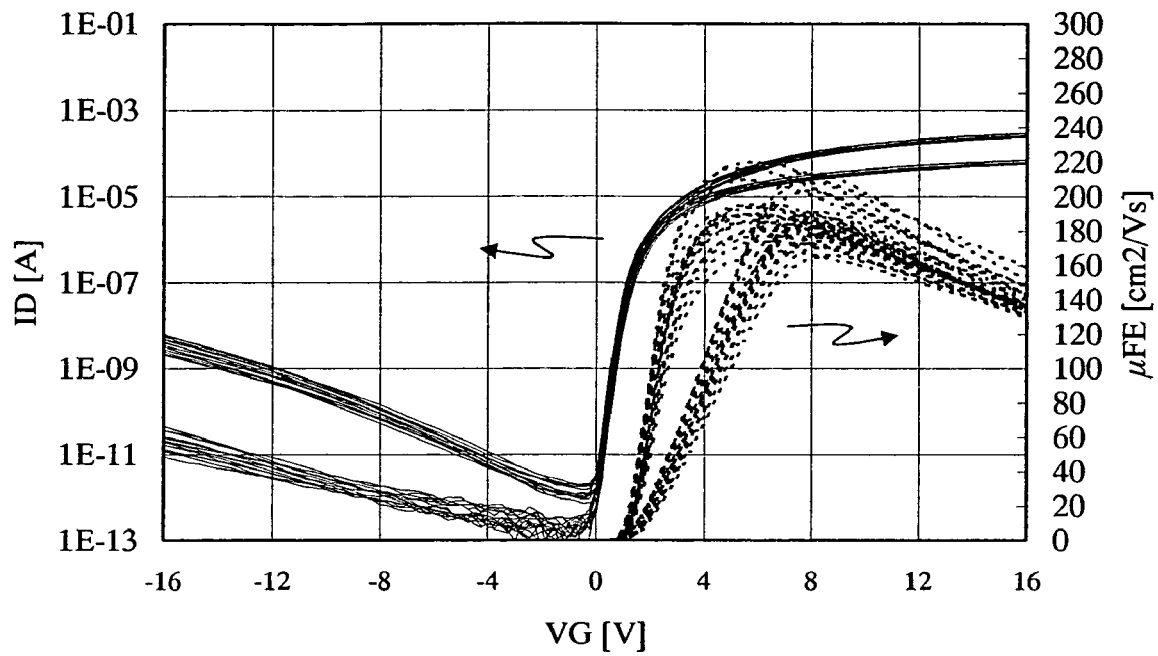
FIGS. 32A and 32B are graphs showing drain current—gate voltage characteristics and mobility—gate voltage characteristics of an n-channel TFT of an embodiment.
Figure 32B:
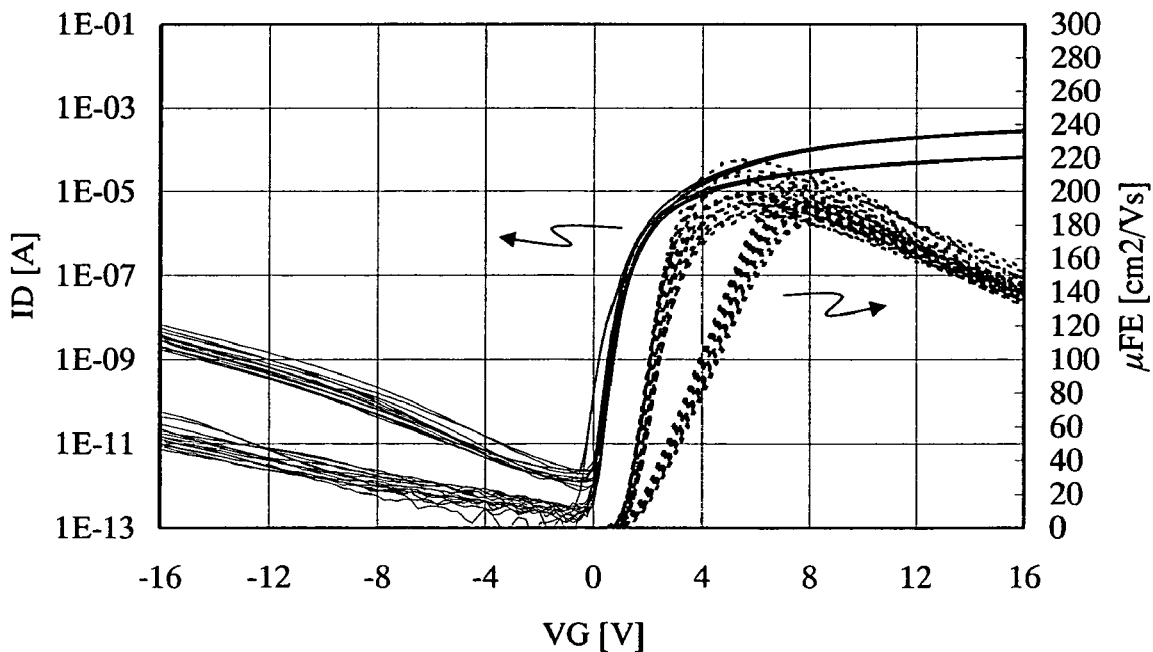

Next, an n-channel TFT will be described. FIG. 32 shows drain current (ID)-gate voltage (VG) characteristics and mobility (μFE)-gate voltage (VG) characteristics of the cases where the thickness of the W film was 220 nm (FIG. 32A) and 170 nm (FIG. 32B).

Figure 33:
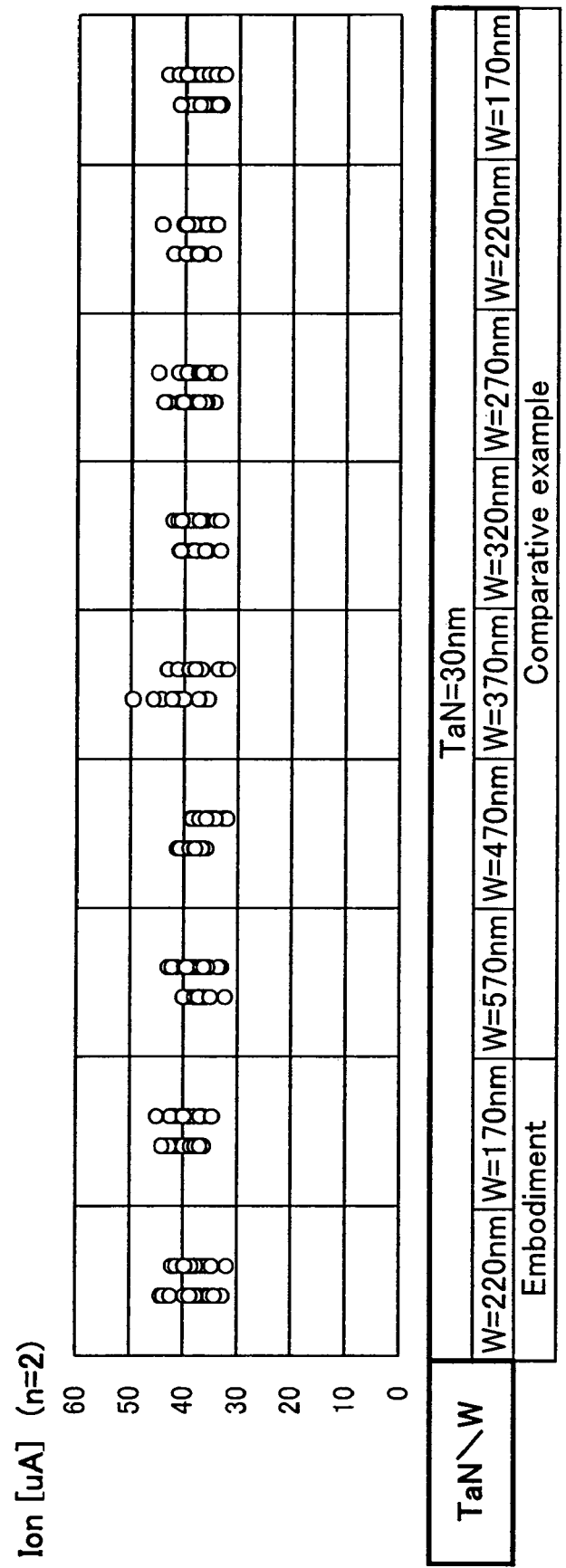
FIG. 33 is a chart showing ON-state current characteristics of an n-channel TFT of an embodiment and a comparative example.
Figure 34:
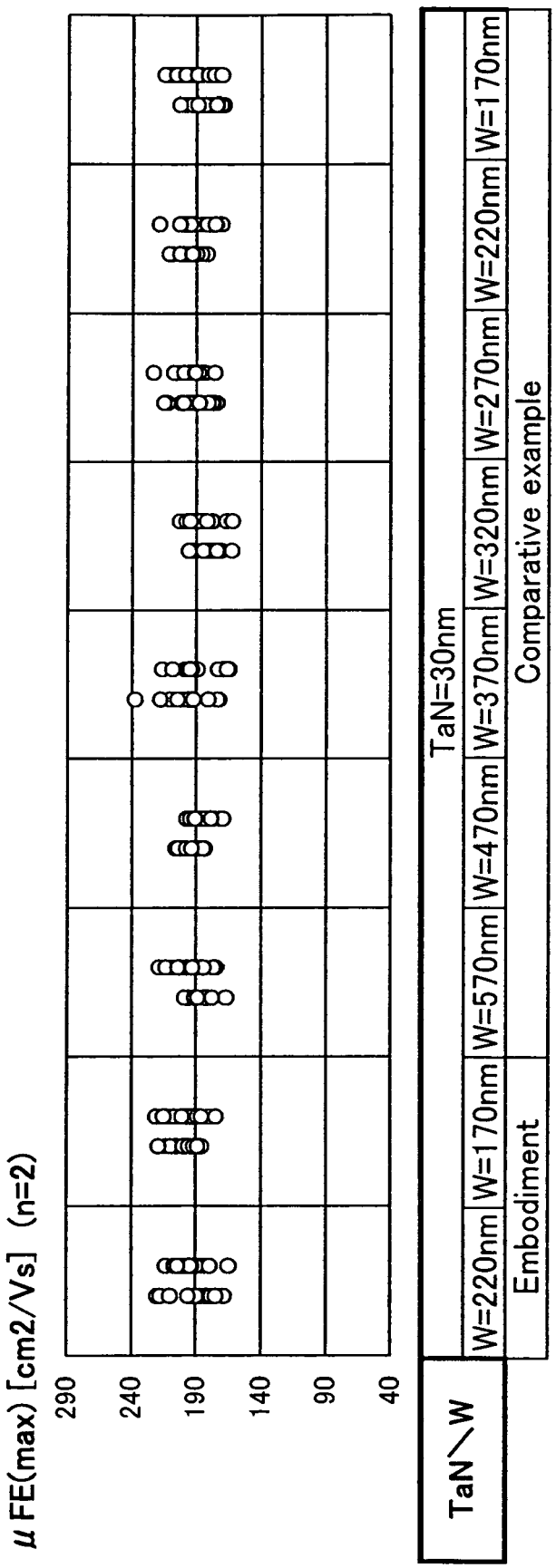
FIG. 34 is a chart showing mobility characteristics of a n-channel TFT of an embodiment and a comparative example.
Figure 35:
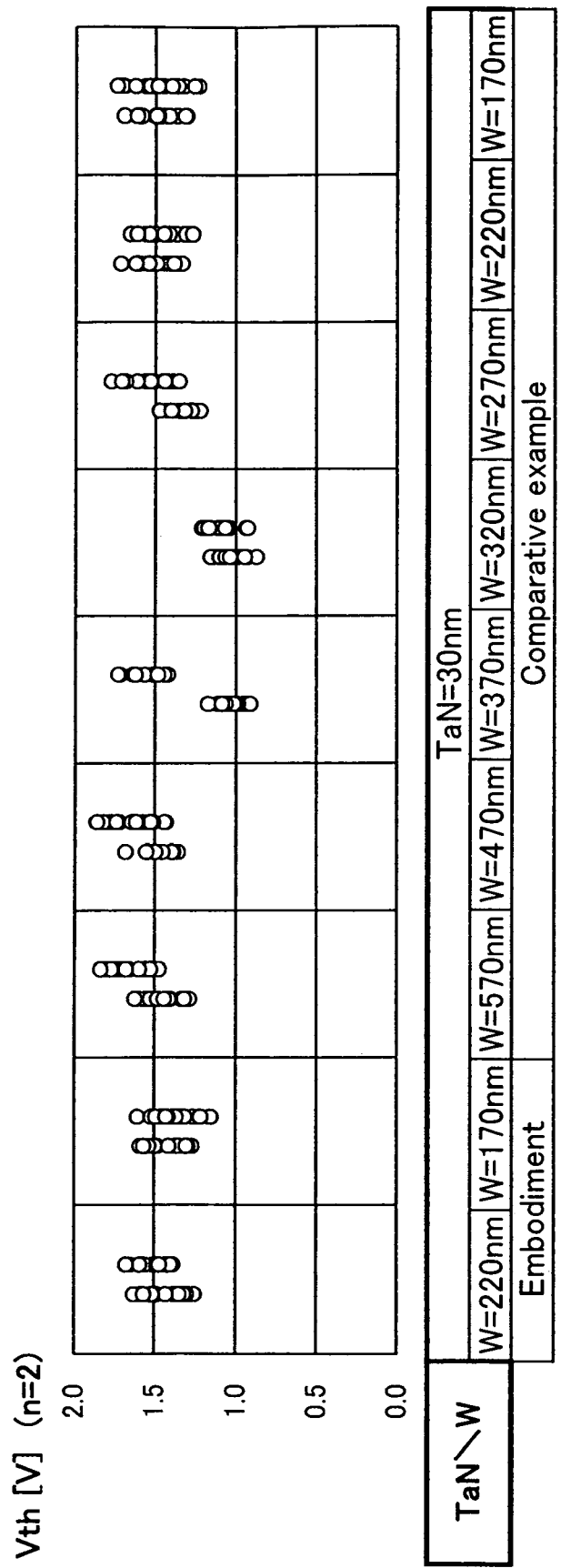
FIG. 35 is a chart showing threshold characteristics of an n-channel TFT of an embodiment and a comparative example.

FIG. 33 shows the ON-state current characteristics (Ion), FIG. 34 shows the mobility characteristics (μFE_1 (max)), and FIG. 35 shows the threshold characteristics (Vth); each of the measurement results is shown by circles.

The ON-state current characteristics, mobility characteristics, and threshold characteristics did not change significantly even though the thickness of the W film forming the gate electrode was reduced to 220 nm or 170 nm.

P-type impurity ions (ions containing B) 65 were added over the n-channel TFT while the second resist mask 62b and the third resist mask 64 were left over the gate electrode 63b. Meanwhile, n-type impurity ions 69 were added as n-type impurity ions (ions containing phosphorus) using the gate electrode 63b as a mask. Accordingly, when the n-type impurity ions were added, penetration of hydrogen ions into a channel region 76 was a concern. However, the TFT characteristics did not change significantly even when the thickness of the W film was reduced as above. It is considered that the reason is because the n-type impurity ions were added at a lower acceleration than the p-type impurity ions or the n-type impurity ions were added at a less dose than the p-type impurity ions.

A comparative example will be explained below.

Similarly to the above embodiment, a p-channel TFT and an n-channel TFT were manufactured. However, the gate electrodes 63a and 63b were formed by using the first resist mask 62a and the second resist mask 62b, and after making the gate insulating film thinner, the first resist masks 62a and the second resist mask 62b were removed by ashing using $O_2$. The W film 61 was 170 nm, 220 nm, 270 nm, 320 nm, 370 nm, 470 nm, or 570 nm. Note that since the thickness of the TaN film was 30 nm, the thickness of the whole gate electrode was 200 nm, 250 nm, 300 nm, 350 nm, 400 nm, 500 nm, or 600 nm.

Next, after forming the third resist mask 64 so as to cover the crystalline silicon film 59 and the gate electrode 63b, the p-type impurity ions 65 (ions containing B) were introduced into the crystalline silicon film 58, thereby forming the source region 66 and the drain region 67. Other than the steps described here, a p-channel TFT and an n-channel TFT were manufactured under the same conditions as the above embodiment.

Measurement results of the TFT characteristics will be shown below.

A p-channel TFT will be described. FIG. 30 shows ON-state current characteristics (Ion), FIG. 31 shows mobility characteristics (μFE (max)), and FIG. 32 shows threshold characteristics (Vth); each of the measurement results is shown by circles. Further, number of a manufactured substrate (n) was set at 2.

Here, after the first resist mask 62a over the gate electrode 63a was removed, the p-type impurity ions 65 were added. Accordingly, when the thickness of the W film forming the gate electrode was less than 370 nm (when the thickness of the gate electrode is less than 400 nm in total), the ON-state current, and the mobility were found to decrease. Further, the threshold was found to shift on negative voltage side. This is considered to result from penetration of hydrogen ions into the channel region.

As compared to the case where the p-type impurity ions 65 were added while the first resist mask 62 was left over the gate electrode 63a as described above, TFT characters were found to deteriorate when the gate electrode is made thin in the case where the first resist mask 62a is not formed over the gate electrode 63a. That is, even if the thickness of the gate electrode is 200 nm to 350 nm, penetration of hydrogen ion into the channel region can be suppressed when the p-type impurity ions is added while the first resist mask is left over the gate electrode.

An n-channel TFT will be described. FIG. 33 shows ON-state current characteristics (Ion), FIG. 34 shows mobility characteristics (μFE (max)), and FIG. 35 shows threshold characteristics (Vth); each of the measurement results is shown by circles.

Even when the thickness of the W film forming the gate electrode was reduced to 220 nm or 170 nm, the ON-state current characteristics, the mobility characteristics, and the threshold characteristics did not change significantly.

This application is based on Japanese Patent Application serial No. 2005-182156 field in Japan Patent Office on Jun. 22, 2005, the entire contents of which are hereby incorporated by reference.

What is claimed is:

1. A method for manufacturing a semiconductor device, comprising the steps of:
   forming a semiconductor film over a substrate;
   forming a first semiconductor film and a second semiconductor film by processing the semiconductor film;
   forming a gate insulating film over the first semiconductor film and the second semiconductor film;
   forming a conductive film over the gate insulating film;
   forming a first resist mask and a second resist mask over the conductive film;
   forming a first gate electrode over the first semiconductor film with the gate insulating film interposed therebetween by processing the conductive film using the first resist mask, while forming a second gate electrode over the second semiconductor film with the gate insulating film interposed therebetween by processing the conductive film using the second resist mask;
   forming a third resist mask so as to cover the first semiconductor film, the first gate electrode, and the first resist mask;
   forming a first source region and a first drain region of the second semiconductor film by an ion shower method with p-type impurity ions using the second resist mask and the third resist mask;
   removing the first resist mask, the second resist mask, and the third resist mask after forming the first source region and the first drain region of the second semiconductor film;
   forming a fourth resist mask over the first gate electrode while forming a fifth resist mask over the second gate electrode after removing the first resist mask, the second resist mask, and the third resist mask;
   forming a sixth resist mask so as to cover the second semiconductor film, the second gate electrode, and the fifth resist mask; and
   forming a second source region and a second drain region of the first semiconductor film by an ion shower method with n-type impurity ions using the fifth resist mask and the sixth resist mask,
   wherein the p-type impurity ions are generated from diborane gas diluted with hydrogen gas, and
   wherein the n-type impurity ions are generated from phosphine gas diluted with hydrogen gas or arsine gas diluted with hydrogen gas.

2. A method for manufacturing a semiconductor device, comprising the steps of:
   forming a semiconductor film over a substrate;
   forming a first semiconductor film and a second semiconductor film by processing the semiconductor film;
   forming a gate insulating film over the first semiconductor film and the second semiconductor film;
   forming a conductive film over the gate insulating film;
   forming a first resist mask and a second resist mask over the conductive film;
   forming a first gate electrode over the first semiconductor film with the gate insulating film interposed therebetween by processing the conductive film using the first resist mask, while forming a second gate electrode over the second semiconductor film with the gate insulating film interposed therebetween by processing the conductive film using the second resist mask;
   forming a third resist mask so as to cover the first semiconductor film, the first gate electrode, and the first resist mask;
   forming a first source region and a first drain region of the second semiconductor film by an ion shower method with n-type impurity ions using the second resist mask and the third resist mask;
   removing the first resist mask, the second resist mask, and the third resist mask after forming the first source region and the first drain region of the second semiconductor film;

forming a fourth resist mask over the first gate electrode while forming a fifth resist mask over the second gate electrode after removing the first resist mask, the second resist mask, and the third resist mask;

forming a sixth resist mask so as to cover the second semiconductor film, the second gate electrode, and the fifth resist mask; and forming a second source region and a second drain region of the first semiconductor film by an ion shower method with p-type impurity ions using the fifth resist mask and the sixth resist mask, wherein the p-type impurity ions are generated from diborane gas diluted with hydrogen gas, and wherein the n-type impurity ions are generated from phosphine gas diluted with hydrogen gas or arsine gas diluted with hydrogen gas.

3. A method for manufacturing a semiconductor device according to claim 1, wherein thickness of the gate insulating film is 10 nm to 200 nm, wherein thickness of the first and second gate electrodes is 100 nm to 500 nm, and wherein thickness of the first resist mask, the second resist mask, the third resist mask, the fourth resist mask, and the fifth resist mask is 1.0 μm to 1.5 μm.

4. A method for manufacturing a semiconductor device according to claim 2, wherein thickness of the gate insulating film is 10 nm to 200 nm, wherein thickness of the first and second gate electrodes is 100 nm to 500 nm, and wherein thickness of the first resist mask, the second resist mask, the third resist mask, the fourth resist mask, and the fifth resist mask is 1.0 μm to 1.5 μm.

5. A method for manufacturing a semiconductor device according to claim 1, wherein the gate insulating film is a silicon oxide film, and wherein the first and second gate electrodes are formed from a TaN film and a W film over the TaN film.

6. A method for manufacturing a semiconductor device according to claim 2, wherein the gate insulating film is a silicon oxide film, and wherein the first and second gate electrodes are formed from a TaN film and a W film over the TaN film.

7. A method for manufacturing a semiconductor device according to claim 1, wherein thickness of first and second gate electrodes is thinner than 400 nm.

8. A method for manufacturing a semiconductor device according to claim 2, wherein thickness of the first and second gate electrodes is thinner than 400 nm.

9. A method for manufacturing a semiconductor device according to claim 1, wherein accelerating voltage of the p-type impurity ions is higher than accelerating voltage of the n-type impurity ions.

10. A method for manufacturing a semiconductor device according to claim 1, wherein accelerating voltage of the p-type impurity ions is 50 kV to 100 kV, and accelerating voltage of the n-type impurity ions is 30 kV to 80 kV.

11. A method for manufacturing a semiconductor device according to claim 1, wherein dose of the n-type impurity ions is less than dose of the p-type impurity ions.

12. A method for manufacturing a semiconductor device according to claim 1, wherein concentration of p-type impurities in the second semiconductor film is $1.0 \times 10^{19}$ cm$^{-3}$ to $1.0 \times 10^{21}$ cm$^{-3}$, and concentration of the n-type impurities of the first semiconductor film is $1.0 \times 10^{19}$ cm$^{-3}$ to $1.0 \times 10^{21}$ cm$^{-3}$.

13. A method for manufacturing a semiconductor device according to claim 2, wherein accelerating voltage of the n-type impurity ions is higher than accelerating voltage of the p-type impurity ions.

14. A method for manufacturing a semiconductor device according to claim 2, wherein accelerating voltage of the n-type impurity ions is 50 kV to 100 kV, and accelerating voltage of the p-type impurity ions is 30 kV to 80 kV.

15. A method for manufacturing a semiconductor device according to claim 2, wherein dose of the p-type impurity ions is less than dose of the n-type impurity ions.

16. A method for manufacturing a semiconductor device according to claim 2, wherein concentration of n-type impurities in the first semiconductor film is $1.0 \times 10^{19}$ cm$^{-3}$ to $1.0 \times 10^{21}$ cm$^{-3}$ or less, and concentration of the p-type impurities of the second semiconductor film is $1.0 \times 10^{19}$ cm$^{-3}$ to $1.0 \times 10^{21}$ cm$^{-3}$.

* * * * *